United States Patent
Seol et al.

(10) Patent No.: US 9,287,167 B2
(45) Date of Patent: Mar. 15, 2016

(54) VERTICAL TYPE MEMORY DEVICE

(71) Applicants: Kwang Soo Seol, Yongin-si (KR); Seong Soon Cho, Suwon-si (KR); Byungjoo Go, Hwaseong-si (KR); Hongsoo Kim, Seongnam-si (KR)

(72) Inventors: Kwang Soo Seol, Yongin-si (KR); Seong Soon Cho, Suwon-si (KR); Byungjoo Go, Hwaseong-si (KR); Hongsoo Kim, Seongnam-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 14/200,002

(22) Filed: Mar. 6, 2014

(65) Prior Publication Data

US 2014/0187029 A1    Jul. 3, 2014

Related U.S. Application Data

(63) Continuation-in-part of application No. 13/844,337, filed on Mar. 15, 2013.

(30) Foreign Application Priority Data

Oct. 5, 2012 (KR) .................. 10-2012-0110751
Mar. 7, 2013 (KR) .................. 10-2013-0024624

(51) Int. Cl.
| G11C 11/34 | (2006.01) |
| G11C 16/04 | (2006.01) |
| H01L 21/768 | (2006.01) |
| H01L 29/423 | (2006.01) |
| H01L 29/66 | (2006.01) |
| H01L 29/788 | (2006.01) |

(Continued)

(52) U.S. Cl.
CPC .... *H01L 21/76877* (2013.01); *H01L 27/11556* (2013.01); *H01L 27/11582* (2013.01); *H01L 29/42332* (2013.01); *H01L 29/66825* (2013.01); *H01L 29/7889* (2013.01); *H01L 29/7926* (2013.01); *H01L 27/11519* (2013.01); *H01L 27/11565* (2013.01)

(58) Field of Classification Search
CPC ......... H01L 27/00; H01L 21/00; H01L 23/00; H01L 45/06
USPC ...................... 257/E21.257, E21.258; 365/63
See application file for complete search history.

(56) References Cited

U.S. PATENT DOCUMENTS

| 7,902,023 B2 | 3/2011 | Izumi et al. |
| 7,910,973 B2 | 3/2011 | Sakaguchi et al. |

(Continued)

FOREIGN PATENT DOCUMENTS

| KR | 100528070 B1 | 11/2005 |
| KR | 20100091900 A | 8/2010 |
| KR | 101055587 B1 | 8/2011 |

OTHER PUBLICATIONS

Office Action for U.S. Appl. No. 13/844,337, mailed Aug. 18, 2014.

(Continued)

*Primary Examiner* — Telly Green
(74) *Attorney, Agent, or Firm* — Renaissance IP Law Group LLP

(57) ABSTRACT

A method of fabricating a semiconductor device, comprising: forming a plurality of memory cell strings; coupling an interconnection to at least two of the memory cell strings; and coupling a bitline to the interconnection. The interconnection includes a body extending along a first direction and a protrusion protruding from the body along a second direction.

20 Claims, 58 Drawing Sheets

(51) Int. Cl.
*H01L 29/792* (2006.01)
*H01L 27/115* (2006.01)

(56) References Cited

U.S. PATENT DOCUMENTS

| | | | |
|---|---|---|---|
| 7,928,580 B2 | 4/2011 | Saito | |
| 8,008,710 B2 | 8/2011 | Fukuzumi et al. | |
| 8,068,364 B2 | 11/2011 | Maejima | |
| 8,072,025 B2 | 12/2011 | Nishihara et al. | |
| 8,084,805 B2 * | 12/2011 | Shim et al. | 257/314 |
| 8,084,809 B2 | 12/2011 | Maeda et al. | |
| 8,193,571 B2 | 6/2012 | Katsumata et al. | |
| 8,278,699 B2 | 10/2012 | Tanaka et al. | |
| 8,450,788 B2 * | 5/2013 | Shim et al. | 257/314 |
| 8,541,832 B2 * | 9/2013 | Kim et al. | 257/324 |
| 8,644,046 B2 | 2/2014 | Seol et al. | |
| 8,792,282 B2 * | 7/2014 | Lee et al. | 365/185.29 |
| 2005/0006710 A1 * | 1/2005 | Riedel | G11C 16/0491 257/390 |
| 2007/0181933 A1 * | 8/2007 | Servalli et al. | 257/314 |
| 2007/0278559 A1 | 12/2007 | Saito | |
| 2008/0074927 A1 * | 3/2008 | Hofmann et al. | 365/185.17 |
| 2009/0090959 A1 | 4/2009 | Nishihara et al. | |
| 2009/0121271 A1 | 5/2009 | Son et al. | |
| 2009/0230449 A1 | 9/2009 | Sakaguchi et al. | |
| 2009/0242968 A1 | 10/2009 | Maeda et al. | |
| 2009/0296446 A1 * | 12/2009 | Asao | 365/63 |
| 2010/0038699 A1 | 2/2010 | Katsumata et al. | |
| 2010/0038703 A1 | 2/2010 | Fukuzumi et al. | |
| 2010/0078701 A1 * | 4/2010 | Shim et al. | 257/314 |
| 2010/0090286 A1 | 4/2010 | Lee et al. | |
| 2010/0202206 A1 | 8/2010 | Seol et al. | |
| 2010/0207194 A1 | 8/2010 | Tanaka et al. | |
| 2010/0224929 A1 | 9/2010 | Jeong et al. | |
| 2010/0309351 A1 * | 12/2010 | Smith | H04N 5/335 348/280 |
| 2010/0311210 A1 | 12/2010 | Izumi et al. | |
| 2011/0018051 A1 * | 1/2011 | Kim et al. | 257/324 |
| 2011/0044093 A1 | 2/2011 | Koh et al. | |
| 2011/0063910 A1 | 3/2011 | Maejima | |
| 2011/0156132 A1 | 6/2011 | Kiyotoshi | |
| 2011/0199804 A1 | 8/2011 | Son et al. | |
| 2011/0316069 A1 | 12/2011 | Tanaka et al. | |
| 2012/0057405 A1 | 3/2012 | Ogiwara et al. | |
| 2012/0061741 A1 * | 3/2012 | Shim et al. | 257/314 |
| 2012/0112264 A1 | 5/2012 | Lee et al. | |
| 2012/0153291 A1 | 6/2012 | Kim et al. | |
| 2012/0275234 A1 * | 11/2012 | Lee et al. | 365/185.23 |
| 2013/0003433 A1 | 1/2013 | Hishida et al. | |
| 2013/0009274 A1 | 1/2013 | Lee et al. | |
| 2013/0092994 A1 | 4/2013 | Shim et al. | |
| 2013/0234338 A1 * | 9/2013 | Uenaka et al. | 257/774 |
| 2013/0256775 A1 * | 10/2013 | Shim et al. | 257/314 |

OTHER PUBLICATIONS

Office Action for U.S. Appl. No. 13/844,337, mailed May 13, 2014.
Final Office Action for U.S. Appl. No. 13/844,337, mailed Jan. 27, 2015.
Notice of Allowance for U.S. Appl. No. 14/530,638, mailed May 27, 2015.
Office Action for U.S. Appl. No. 13/844,337, mailed Jun. 11, 2015.
Notice of Allowance for U.S. Appl. No. 13/844,337, mailed Sep. 21, 2015.
Notice of Allowance for U.S. Appl. No. 14/807,879, mailed Sep. 23, 2015.

* cited by examiner

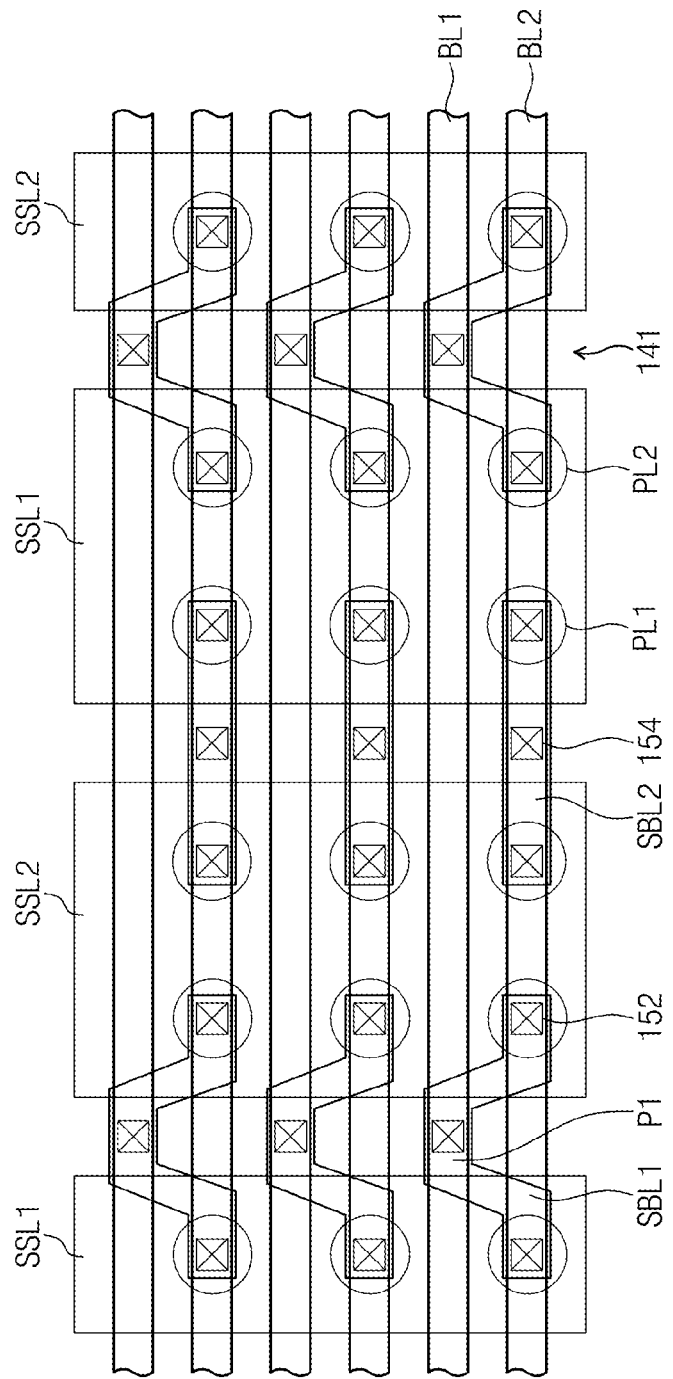

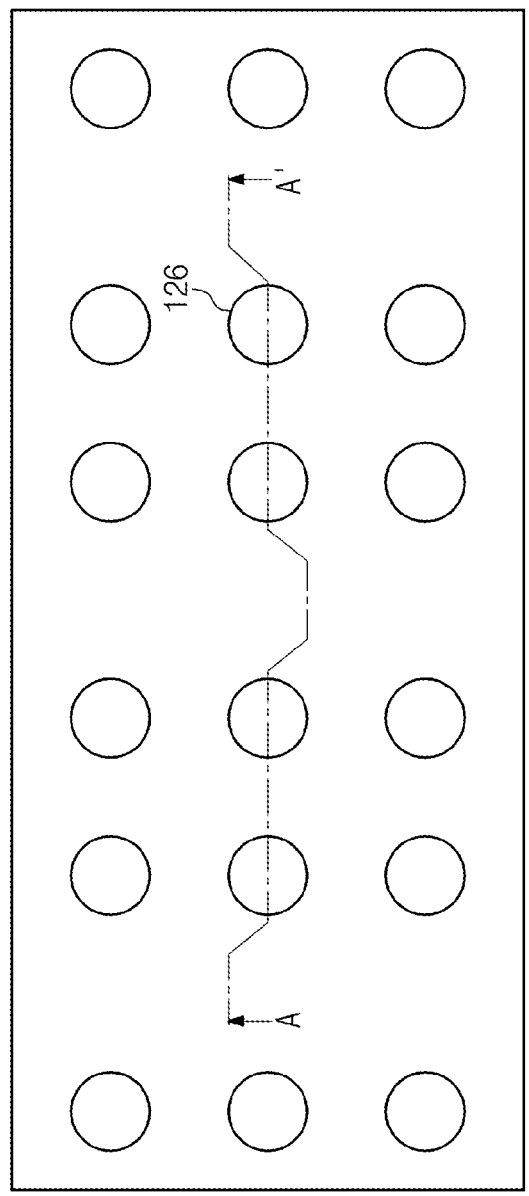

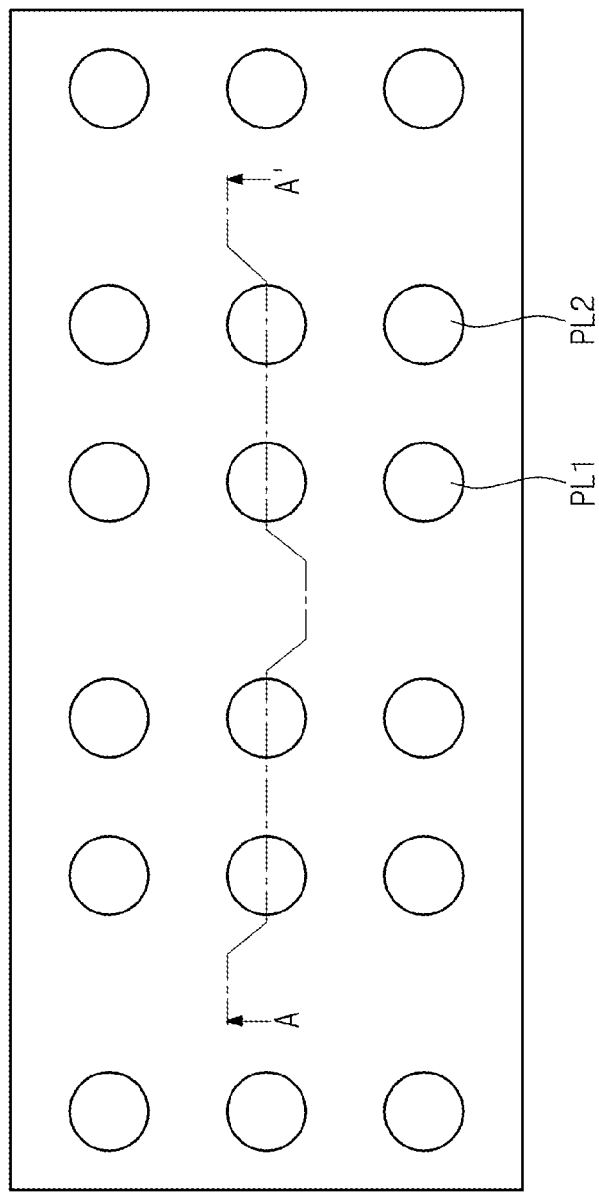

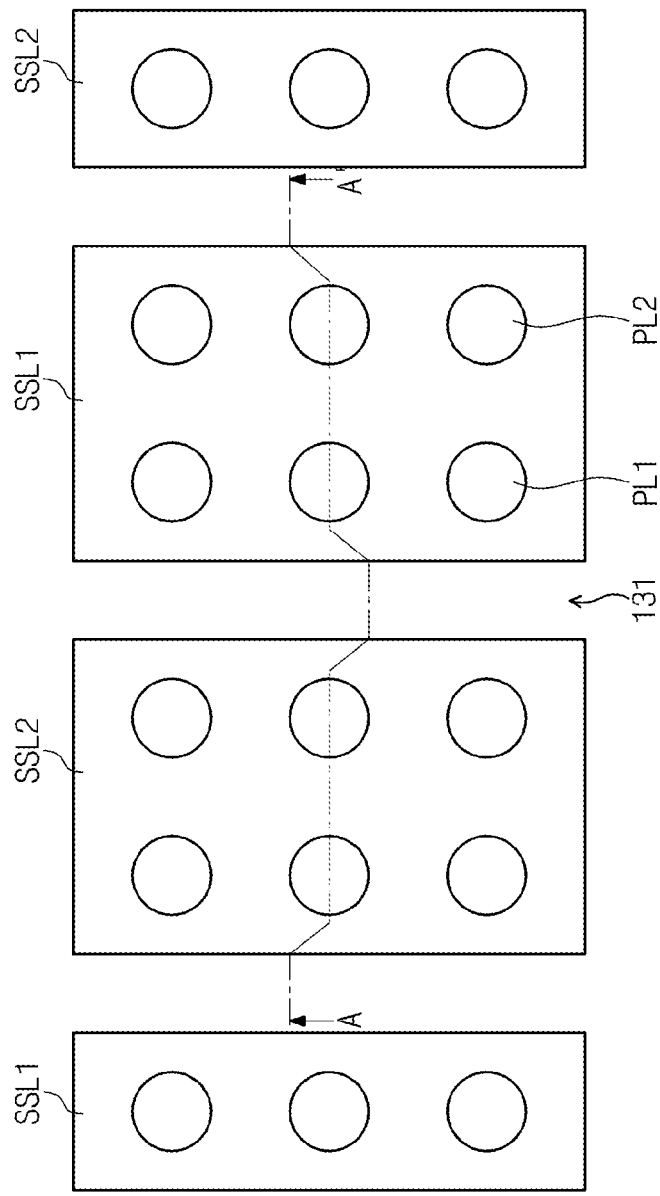

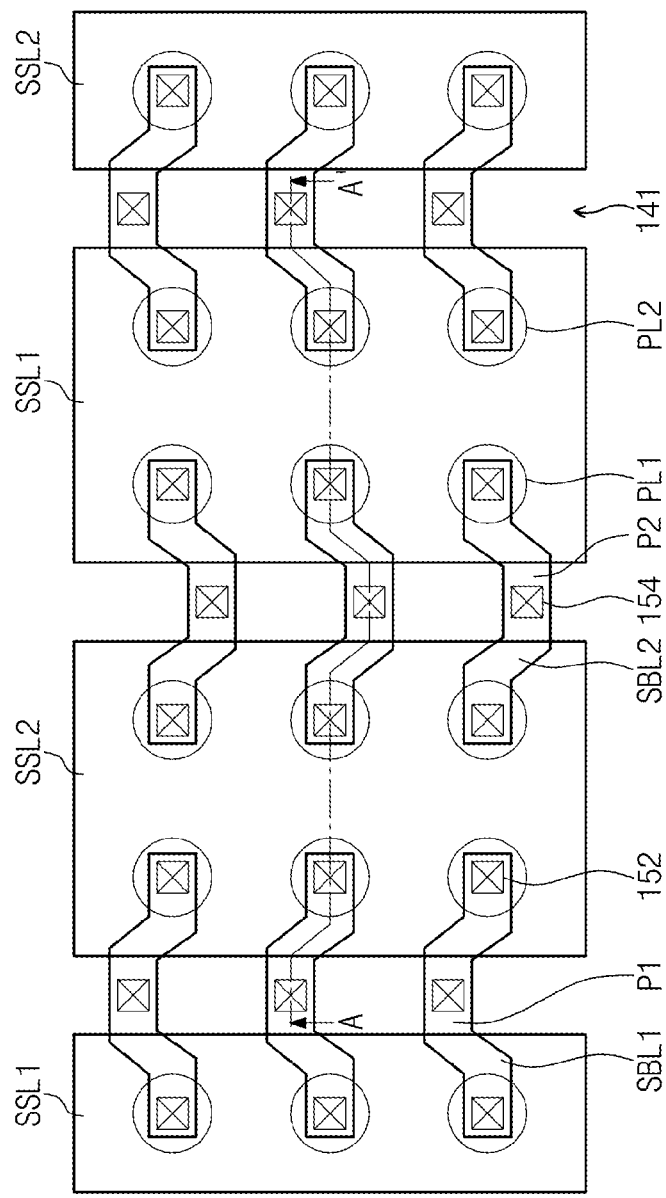

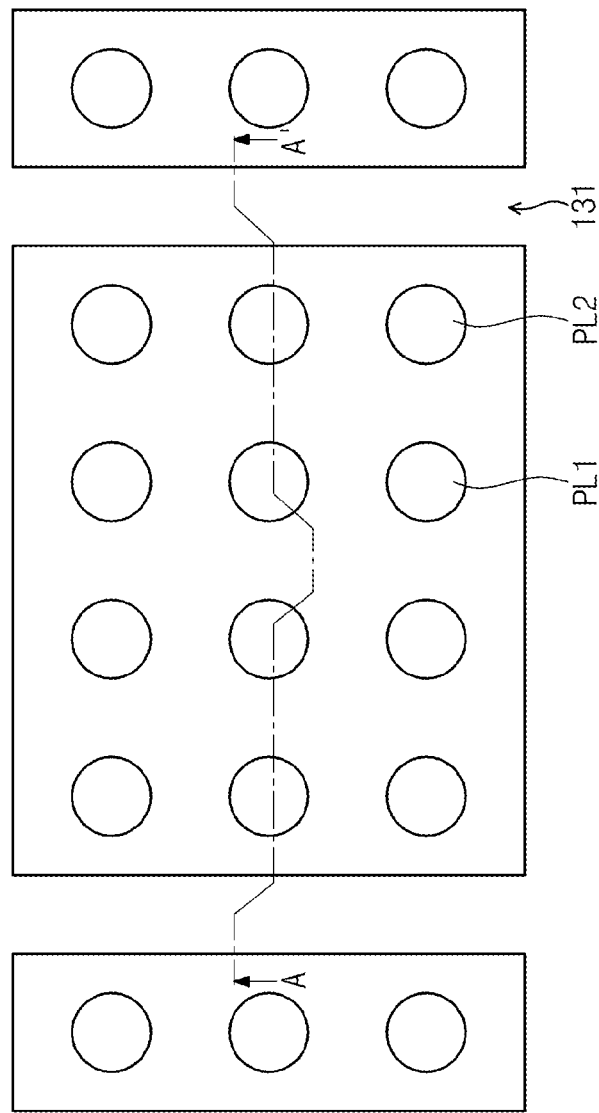

VERTICAL TYPE MEMORY DEVICE

CROSS-REFERENCE TO RELATED APPLICATIONS

This U.S. non-provisional patent application is a continuation-in-part of U.S. patent application Ser. No. 13/844,337, filed Mar. 15, 2013 which claims the benefit of Korean Patent Application No. 10-2012-0110751, filed Oct. 5, 2012, and claims priority under 35 USC §119 to Korean Patent Application No. 10-2013-0024624, filed on Mar. 7, 2013, the entirety of which is hereby incorporated by reference.

BACKGROUND

The present general inventive concept relates to semiconductor devices and, more particularly, to vertical type memory devices.

In order to achieve superior performance and lower cost, there is an ongoing need for increasing the density of a semiconductor device. Especially, the density of the semiconductor device is an important determinant for pricing products. Since the density of a conventional two-dimensional semiconductor memory device is mainly decided by an area occupied by a unit memory cell, the density is significantly affected by the level of a fine patterning technology. However, ultra-high cost equipment is required to achieve such fine patterns. Hence, there is still a limitation in increasing the density of the two-dimensional semiconductor memory device.

SUMMARY

In one embodiment, a semiconductor device includes a plurality of vertically stacked memory cell strings, a bitline, and an interconnection coupling at least two of the vertically stacked memory cell strings to the bitline.

In another embodiment, a portion of the interconnection extends in a first direction and the bit line extends in a second direction.

In some embodiments, the bit line extends substantially parallel with the interconnection.

In one embodiment, the at least two of the memory cell strings are disposed along the second direction and offset from the bitline in the first direction and the portion of the interconnection protrudes in the second direction.

In another embodiment, the bitline, the interconnection, and the at least two of the memory cell strings referred to as a first bitline, a first interconnection, and a first set of at least two of the memory cell strings, the semiconductor device further comprising: a second bitline; and a second interconnection coupling a second set of at least two of the memory cell strings to the second bitline.

In one embodiment, a portion of the first interconnection protrudes in a second direction and the second interconnection protrudes in a direction opposite the second direction.

According to one aspect of the inventive concepts, a method includes forming a plurality of memory cell strings; coupling an interconnection to at least two of the memory cell strings; and coupling a bitline to the interconnection.

According to another aspect of the inventive concepts, a method of fabricating a semiconductor device comprises forming a buffer dielectric layer over a semiconductor substrate; repeatedly forming a stack of a sacrificial layer and an insulating layer over the buffer dielectric layer; forming vertical pillars extending through the stack of sacrificial layer and the insulating layer to be connected to the semiconductor substrate; forming separation regions by patterning the buffer dielectric layer, the sacrificial layer, and the insulating layers to expose a portion of the substrate; removing the patterned sacrificial layers to form recessed regions that expose portions of sidewalls of the vertical pillars; forming information storage elements in the recessed regions; forming a conductive layer on the information storage elements in the recessed regions, thereby forming memory cell strings including first and second string selection lines that are spaced apart from each other; forming first contacts on the vertical pillars; forming sub-interconnections on the first contacts to interconnect the vertical pillars with the first and second string selection lines; forming second contacts on the first and second sub-interconnections; and forming bitlines on the second contacts, where the first sub-interconnections and the second sub-interconnections are connected to other adjacent bitlines through the second contacts.

BRIEF DESCRIPTION OF THE DRAWINGS

The inventive concept will become more apparent in view of the attached drawings and accompanying detailed description. The embodiments depicted therein are provided by way of example, not by way of limitation, wherein like reference numerals refer to the same or similar elements. The drawings are not necessarily to scale, emphasis instead being placed upon illustrating aspects of the inventive concept.

FIGS. 5A, 5C, and 5D are top plan views of the vertical type memory device in FIG. 3.

FIG. 14B is a cross-sectional view taken along the line A-A' in FIG. 15A.

DETAILED DESCRIPTION

Figure 1:
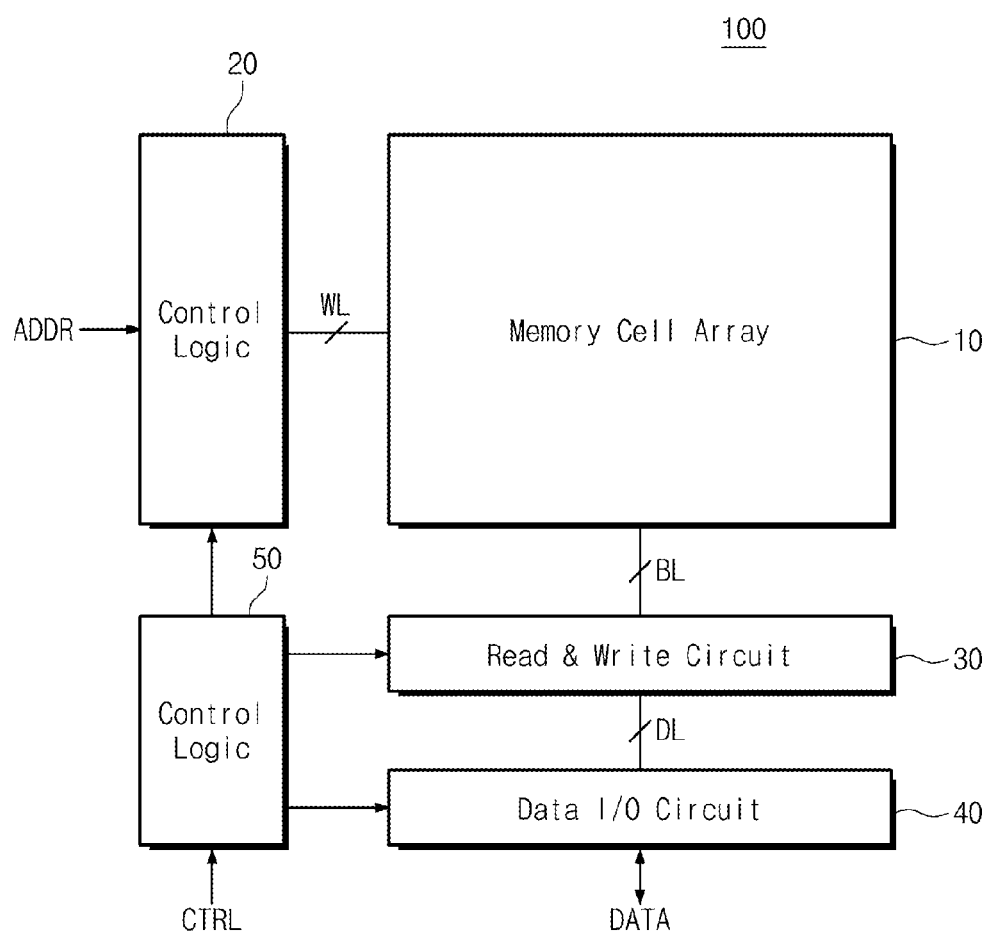
FIG. 1 is a block diagram of a memory device according to embodiments of the inventive concept.

The advantages and features of the inventive concept and methods of achieving them will be apparent from the following exemplary embodiments that will be described in more detail with reference to the accompanying drawings. It should be noted, however, that the inventive concept is not limited to the following exemplary embodiments, and may be implemented in various forms. Accordingly, the exemplary embodiments are provided only to disclose examples of the inventive concept and to let those skilled in the art understand the nature of the inventive concept.

It will be understood that when an element is referred to as being "on" another element, it can be directly on the other element or intervening elements may be present therebetween. In contrast, when an element is referred to as being "directly on" another element, there are no intervening elements present. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the inventive concept. The terms used in the specification are for the purpose of describing particular embodiments only and are not intended to be limiting of the invention. As used in the specification, the singular forms "a", "an" and "the" are intended to include the plural forms as well, unless the context clearly indicates otherwise. It will be further understood that the terms "comprises" and/or "comprising", when used in the specification, specify the presence of stated features, integers, steps, operations, elements, and/or components, but do not preclude the presence or addition of one or more other features, integers, steps, operations, elements, components, and/or groups thereof. Throughout the specification, the same reference numerals denote the same elements.

The inventive concept will now be described more fully hereinafter with reference to the accompanying drawings, in which preferred embodiments of the inventive concept are shown.

FIG. 1 is a block diagram of a memory device according to some embodiments of the inventive concept. Referring to FIG. 1, a memory device 100 according to some embodiments of the inventive concept may include a memory cell array 10, an address decoder 20, a read/write circuit 30, a data input/output (I/O) circuit 40, and a control logic 50.

The memory cell array 10 may be connected to an address decoder 20 through a plurality of wordlines WL and connected to the read/write circuit 30 through bitlines BL. The memory cell array 10 includes a plurality of memory cells. For example, the memory cell array 10 is configured to store one or more bits in a single cell.

The address decoder 20 may be configured to operate in response to the control of the control logic 50. The address decoder 20 may externally receive an address ADDR. The address decoder 20 decodes a row address among the received address ADDR to select a corresponding one of the wordlines WL. In addition, the address decoder 20 may include well-known components such as, for example, a row decoder, a column decoder, an address buffer, or the like.

The read/write circuit 30 may be connected to the memory cell array 10 through bitlines BL and connected to the data I/O circuit 40 through data lines D/L. The read/write circuit 30 may be configured to operate in response to the control of the control logic 50. The read/write circuit 30 may be configured to receive a decoded column address from the address decoder 20. The read/write circuit 30 may be configured to select a bitline BL using the decoded column address. For example, the read/write circuit 30 may be configured to receive data from the data I/O circuit 40 and write the received data into the memory cell array 10. The read/write circuit 30 may be configured to read data from the memory cell array 10 and transmit the read data to the data I/O circuit 40. The read/write circuit 30 may be configured to read data from a first storage area of the memory cell array 10 and write the read data into a second storage area of the memory cell array 10. For example, the read/write circuit 30 may be configured to perform a copyback operation.

The read/write circuit 30 may include components including a page buffer (or page register), a column selector, or the like. As another example, the read/write circuit 30 may include components including a sense amplifier, a write driver, a column selector, or the like.

The data I/O circuit 40 may be connected to the read/write circuit 30 through data lines DL. The data I/O circuit 40 may be configured to operate in response to the control of the control logic 50. The data I/O circuit 40 is configured to exchange data DATA with an external device. The data I/O circuit 40 is configured to transmit the externally received data DATA to the read/write circuit 30 through the data lines DL. The data I/O circuit 40 is configured to output the data DATA transmitted through the data lines DL to the external device. For example, the data I/O circuit 40 may include components such as a data buffer, etc.

The control logic 50 may be connected to the address decoder 20, the read/write circuit 30, and the data I/O circuit 40. The control logic 50 may be configured to control the operation of the memory device 100. The control logic 50 may operate in response to an externally transmitted control signal CTRL.

Figure 2:
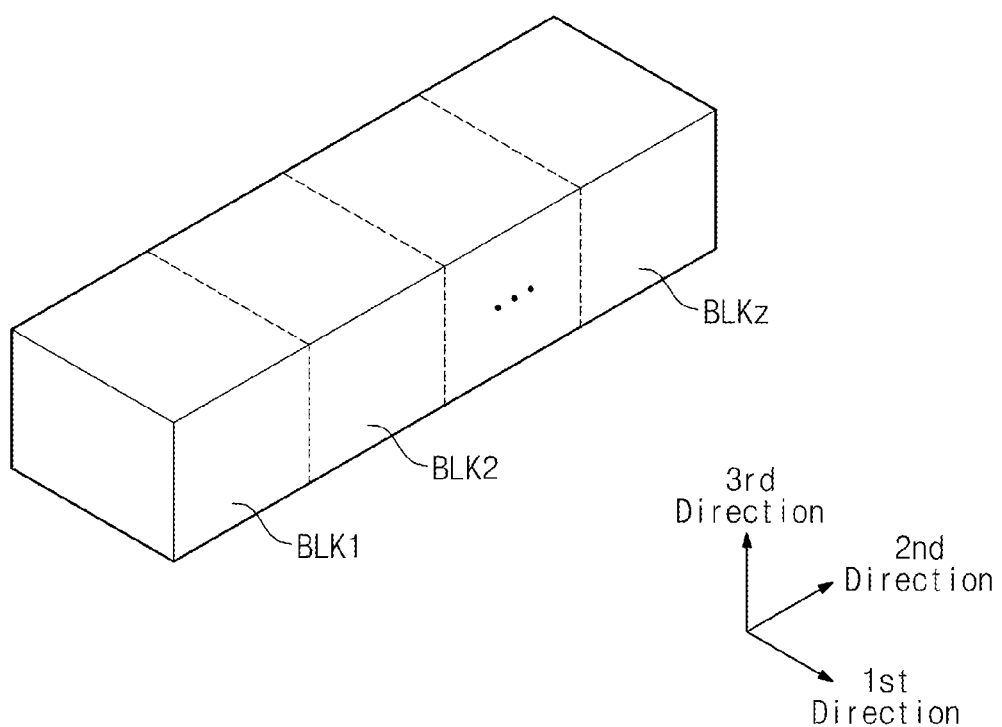
FIG. 2 is a block diagram illustrating an example of a memory cell array in FIG. 1.

FIG. 2 is a block diagram illustrating an example of the memory cell array 10 in FIG. 1. Referring to FIG. 2, the memory cell array 10 may include a plurality of memory blocks BLK1~BLKh. Each of the memory blocks BLK1~BLKh may have a three-dimensional structure (or vertical structure). For example, each of the memory blocks BLK1~BLKh may include structures extending in first, second, and third directions along corresponding orthogonal axes. For example, each of the memory blocks BLK1~BLKh includes a plurality of cell strings extending in the third direction and the memory blocks BLK1~BLKh extend in the second direction. Additional memory blocks may extend in the first direction. Thus, the memory blocks and associated structures can extend in three directions.

Figure 3:
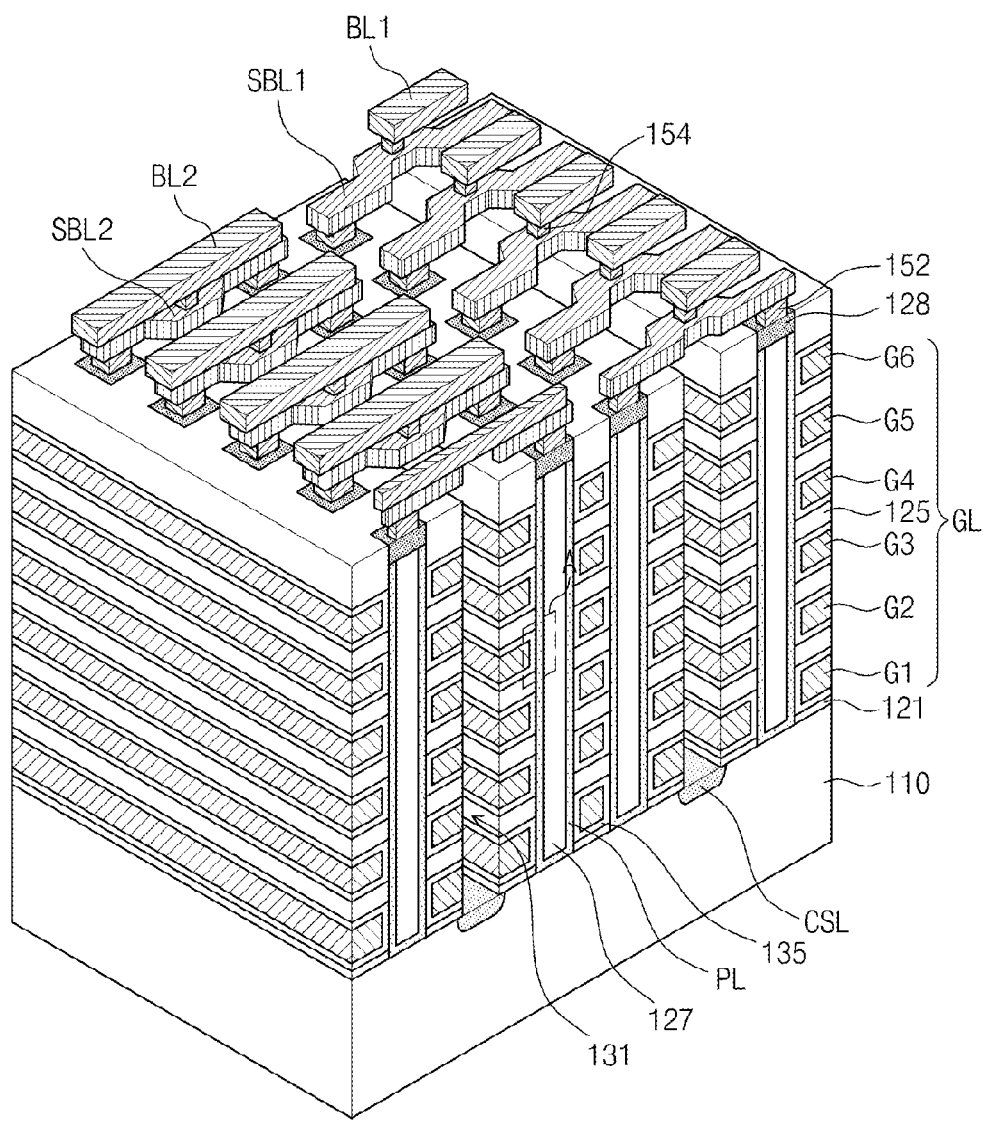
FIG. 3 is a perspective view of a memory block of a vertical type memory device according to first embodiments of the inventive concept.

FIG. 3 is a perspective view of a vertical type memory device according to first embodiments of the inventive concept, and FIGS. 4A to 4I are enlarged views of "A" in FIG. 3.

Referring to FIG. 3, a substrate 110 is provided. The substrate 110 may have a first conductivity type, e.g., P-type. Gate structures GL may be provided on the substrate 110. A buffer dielectric layer 121 may be provided between the substrate 110 and the gate structures GL. The buffer dielectric layer 121 may include silicon oxide or other suitable dielectric materials such as high-k dielectric materials.

The gate structures GL may extend in a first direction on the substrate 110. Sets of the gate structures GL may face each other and may extend in a second direction on the substrate 110 where the second direction is different from the first direction. For example, the second direction may be substantially orthogonal to the first direction. The gate structures GL may include insulating patterns 125 and gate electrodes G1~G6 spaced apart from each other with the insulating patterns 125 interposed therebetween. The gate electrodes G1~G6 may include first to sixth gate electrodes G1~G6 that are sequentially stacked on the substrate 110. The insulating patterns 125 may include silicon oxide. The buffer dielectric layer 121 may be thinner than the insulating patterns 125. The gate electrodes G1~G6 may include doped silicon, a metal (e.g., tungsten), metal nitride, metal silicide, combinations thereof, or the like. Although six gate electrodes are illustrated, any number of the gate electrodes that is greater than six may be present in a gate structure GL. In a particular example, the number of gate electrodes can be selected based on a number of memory cells and control transistors in a memory cell string.

A first separation region 131 extending in the first direction may be provided between the gate structures GL. The first separation region 131 may be filled with a first separation insulating layer (not shown, see 141 in FIG. 5B). Common source lines CSL are provided in the substrate 110 adjacent the first separation region 131. The common source lines CSL may be formed in the substrate 110. The common source lines CSL may be spaced apart from each other and extend in the first direction. The common source lines CSL may have a second conductivity type (e.g., N-type) different from the first conductivity type. Unlike the figure, the common source lines CSL may have a linear conductive pattern provided between the substrate 110 and the first gate electrode G1 and extends in the first direction.

Vertical pillars PL are arranged in a matrix extending in the first and second directions. A plurality of vertical pillars PL may be coupled with the gate structures GL. A plurality of vertical pillars PL are connected to the substrate 110, and extend through the gate electrodes G1~G6. The vertical pillars PL may have a major axis extending upwardly from the substrate 110 (i.e., in the third direction). One of the ends of the vertical pillars PL may be coupled to the substrate 110, and the opposite ends may be coupled to bitlines BL1 and BL2 extending in the second direction.

Sub-interconnections SBL1 and SBL2 are provided between the vertical pillars PL and the bitlines BL1 and BL2. The vertical pillars PL and the sub-interconnections SBL1 and SBL2 may be optionally connected through first contacts 152. The bitlines BL1 and BL2 and the sub-interconnections SBL1 and SBL2 may be optionally connected through second contacts 154. The sub-interconnections SBL1 and SBL2 may interconnect the adjacent vertical pillars PL, which may be coupled with immediately adjacent gate structures GL, through the first contacts 152.

A plurality of cell strings of a non-volatile memory devices such as flash memory device are provided between the bitlines BL1 and BL2 and the common source line CSL. One single cell string may include a string selection transistor connected to the bitlines BL1 and BL2, a ground selection transistor connected to the common source lines CSL, and a plurality of memory cells provided between the string selection transistor and the ground selection transistor. The selection transistors and the plurality of memory cells may be provided corresponding to a single semiconductor pillar PL. A first gate electrode G1 may be a ground selection gate line GSL of the ground selection transistor. Second to fifth gate electrodes G2~G6 may be cell gates WL of the plurality of memory cells. A sixth gate electrode G6 may be a string selection gate line SSL of the string selection transistor.

An information storage element 135 may be provided between the second to fifth gate electrodes G2~G5 and the vertical pillars PL. Although it is shown in FIG. 3 that the information storage element 135 extends between the gate electrodes G1~G6 and the insulating patterns 125 and between the gate electrodes G1~G6 and the vertical pillars PL, the location and the shape of the information storage element 135 is not limited thereto. In embodiments described later, the information storage element 135 may be modified in various ways (see FIGS. 4A to 4I).

In one aspect, the vertical pillars PL may include a semiconductor material. Accordingly, the vertical pillars PL may function as channels of transistors. The vertical pillars PL may be solid-cylindrical pillars or hollow-cylindrical (e.g., macaroni-type) pillars. A filling insulating layer 127 may fill in the hollow vertical pillars. The filling insulating layer 127 may include silicon oxide. The filling insulating layer 127 may be in direct contact with the inner wall of the vertical pillars PL. The vertical pillars PL and the substrate 110 may be a substantially continuous semiconductor structure. In this case, the vertical pillars PL may be a single-crystalline semiconductor. Therefore, the vertical pillars PL may be formed using growth techniques such as selective epitaxial growth (SEG). Alternatively, an interface of the vertical pillars PL and the substrate 110 may include a boundary surface and/or other discontinuity. In this case, the vertical pillars PL may be vertical pillars of polycrystalline or amorphous structure formed by, for example, chemical vapor deposition. Conductive patterns 128 may be provided on one end of the vertical pillars PL. Ends of the vertical pillars PL contacting the conductive patterns 128 may form a drain region of a transistor, such as a string selection transistor.

Figure 4A:
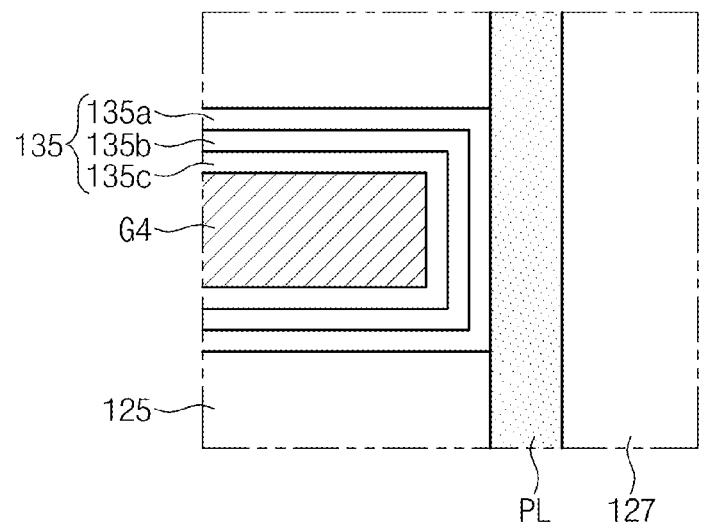
FIGS. 4A to 4I are enlarged views of "A" in FIG. 3.

As an example, referring to FIG. 4A, similar to FIG. 3, an information storage element 135 may include a blocking insulating layer 135c adjacent to gate electrodes G1~G6, a tunnel insulating layer 135a adjacent to the vertical pillars PL, and a charge storage layer 135b between the blocking insulating layer 135c and the tunnel insulating layer 135a. The information storage element 135 may extend between the gate electrodes G1~G6 and both the insulating patterns 125 and vertical pillars PL. The blocking insulating layer 135c may include a high-k dielectric (e.g., aluminum oxide or hafnium oxide). The blocking insulating layer 135*c* may be a multi-layered film comprising a plurality of thin films. For example, the blocking insulating layer 135*c* may include aluminum oxide and/or hafnium oxide and there may be various stacked orders of aluminum oxide and hafnium oxide. A charge storage layer 135*b* may be an insulating layer including a charge trapping layer, conductive nanoparticles, or the like. The charge trapping layer may include, for example, silicon nitride. The tunnel insulating layer 135*a* may include silicon oxide or other suitable dielectric materials.

Figure 4B:
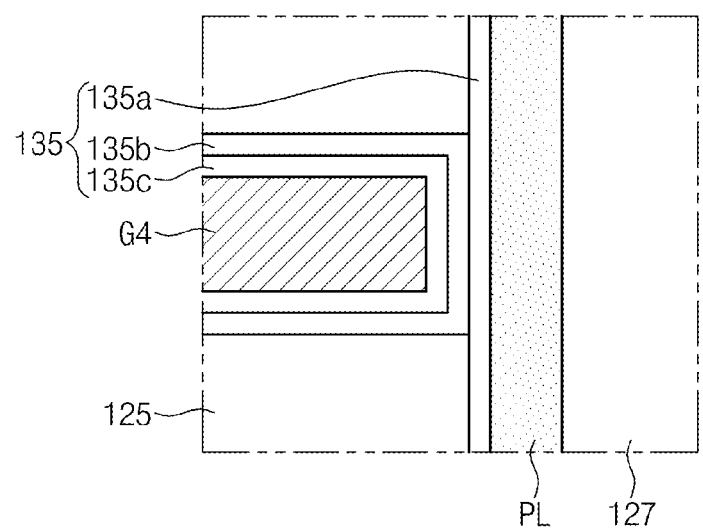
Figure 4C:
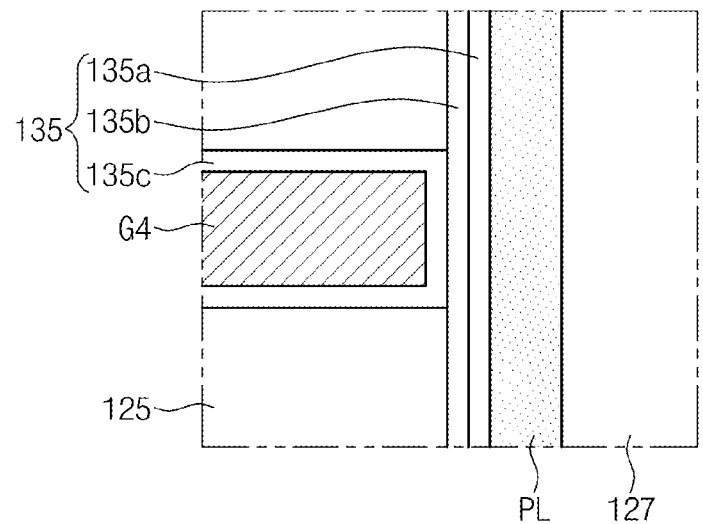
Figure 4D:
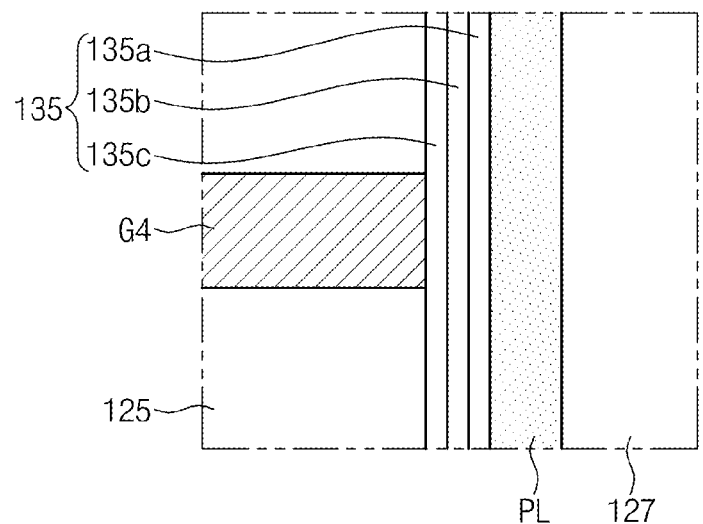

As another example, referring to FIGS. 4B to 4D, unlike as shown in FIG. 3, some portions of the information storage element 135 may not extend between the insulating patterns 125 and the gate electrodes G1~G6, but some other portions of the information storage element 135 may still extend between the gate electrodes G1~G6 and the vertical pillars PL. Referring to FIG. 4B, the tunnel insulating layer 135*a* may extend between the insulating patterns 125 and the vertical pillars PL, while the charge storage layer 135*b* and the blocking insulating layer 135*c* may extend between the insulating patterns 125 and the gate electrodes G1~G6.

Referring to FIG. 4C, some portions of the tunnel insulating layer 135*a* and the charge storage layer 135*b* may extend between the insulating patterns 125 and the vertical pillars PL, while some portions of the blocking insulating layer 135*c* may extend between the insulating patterns 125 and the gate electrodes G1~G6. Referring to FIG. 4D, the tunnel insulating layer 135*a*, the charge storage layer 135*b*, and the blocking insulating layer 135*c* may extend between the insulating patterns 125 and the vertical pillars PL, while the insulating patterns 125 directly contact the gate electrodes G1~G6.

Figure 4E:
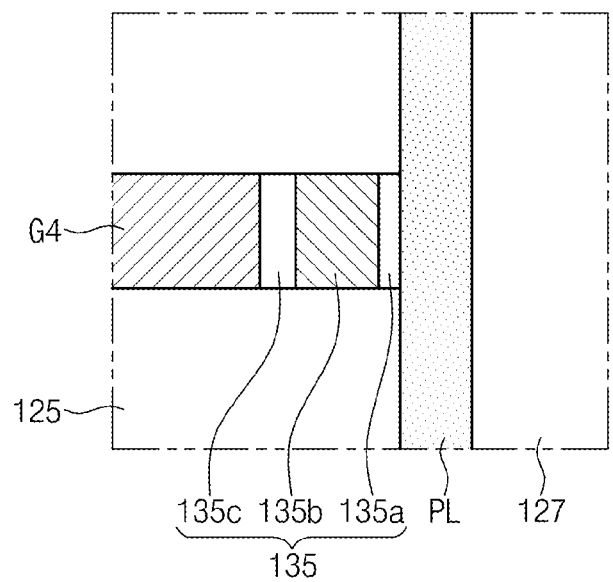

Unlike the above examples, referring to FIG. 4E, the charge storage layer 135*b* may include polysilicon. In this case, the tunnel insulating layer 135*a*, the charge storage layer 135*b*, and the blocking insulating layer 135*c* may be disposed between the gate electrodes G1~G6, the vertical pillars PL, and the insulating patterns 125.

In another aspect, the vertical pillars PL may be conductive pillars. The vertical pillars PL may include at least one of conductive materials, e.g., a doped semiconductor, a metal, conductive metal nitride, silicide or nanostructures (such as carbon nanotube or graphene).

Figure 4F:
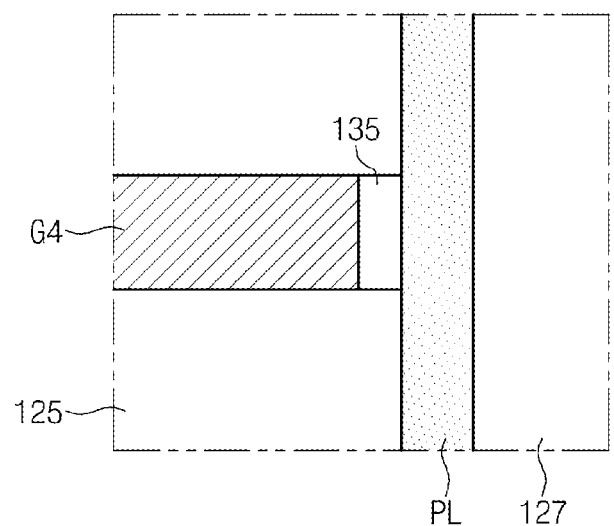

Referring to FIG. 4F, the information storage element 135 may be disposed only between the gate electrodes G1~G6, the vertical pillars PL, and the insulating patterns 125.

Figure 4G:
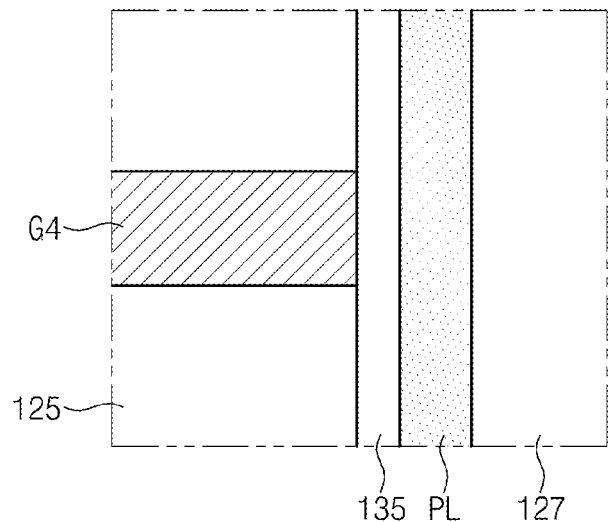
Figure 4H:
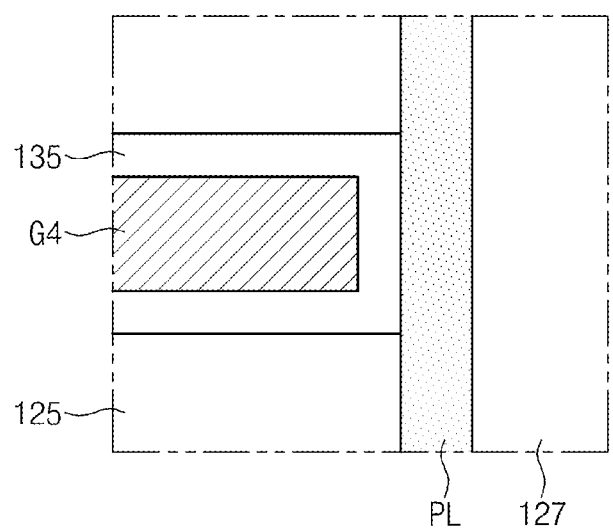

Referring to FIGS. 4G and 4H, the information storage element 135 may extend between the insulating patterns 125 and the vertical pillars PL or between the insulating patterns 125 and the gate electrodes G1~G6. In this case, the information storage element 135 may be a variable resistance pattern. The variable resistance pattern may include at least one of materials having variable resistance characteristics, i.e., its resistance is variable. Hereinafter, examples of a variable resistance pattern used as the information storage element 135 will be explained below.

As an example, the information storage element 135 may include a material whose electrical resistance may be varied depending on heat generated by current passing through its adjacent electrode. The material may be, e.g., a phase change material. The phase change material may include at least one of antimony (Sb), tellurium (Te), and selenium (Se). For example, the phase change material may include a chalcogenide compound in which tellurium (Te) has a concentration of about 20 to about 80 atomic percent, antimony (Sb) has a concentration of about 5 to about 50 atomic percent, and the rest is germanium (Ge). In addition, the phase change material may include at least one of N, O, C, Bi, In, B, Sn, Si, Ti, Al, Ni, Fe, Dy, and La, as an impurity. Alternatively, the variable resistance pattern may be made of only one of GeBiTe, InSb, GeSb, and GaSb.

As another example, the information storage element 135 may be formed to have a thin film structure having an electrical resistance that may be varied using a spin transfer procedure caused by current passing through the information storage element 135. The information storage element 135 may have a thin film structure to exhibit magnetoresistance characteristics and include at least one of ferromagnetic materials and/or at least one of antiferromagnetic materials. The information storage element 135 may thus include a free layer and a reference layer.

As further another example, the information storage element 135 may include at least one of perovskite compounds or at least one of transition metals. For example, the information storage element 135 may include at least one of niobium oxide, titanium oxide, nickel oxide, zirconium oxide, vanadium oxide, PCMO((Pr,Ca)MnO3), strontium-titanium oxide, barium-strontium-titanium oxide, strontium-zirconium oxide, barium-zirconium oxide, and barium-strontium-zirconium oxide.

Figure 4I:
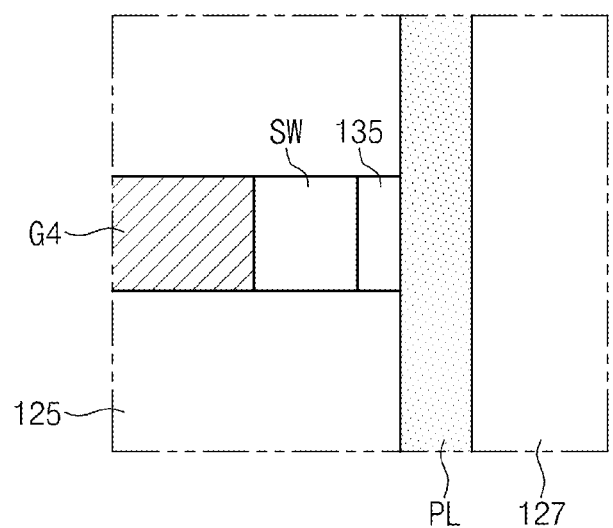

According to some examples of the inventive concept, referring to FIG. 4I, at least one of materials SW having a self-rectifying property (e.g., PN junction diode) may be provided between the information storage element 135 and the gate electrodes G1~G6.

Figure 5A:
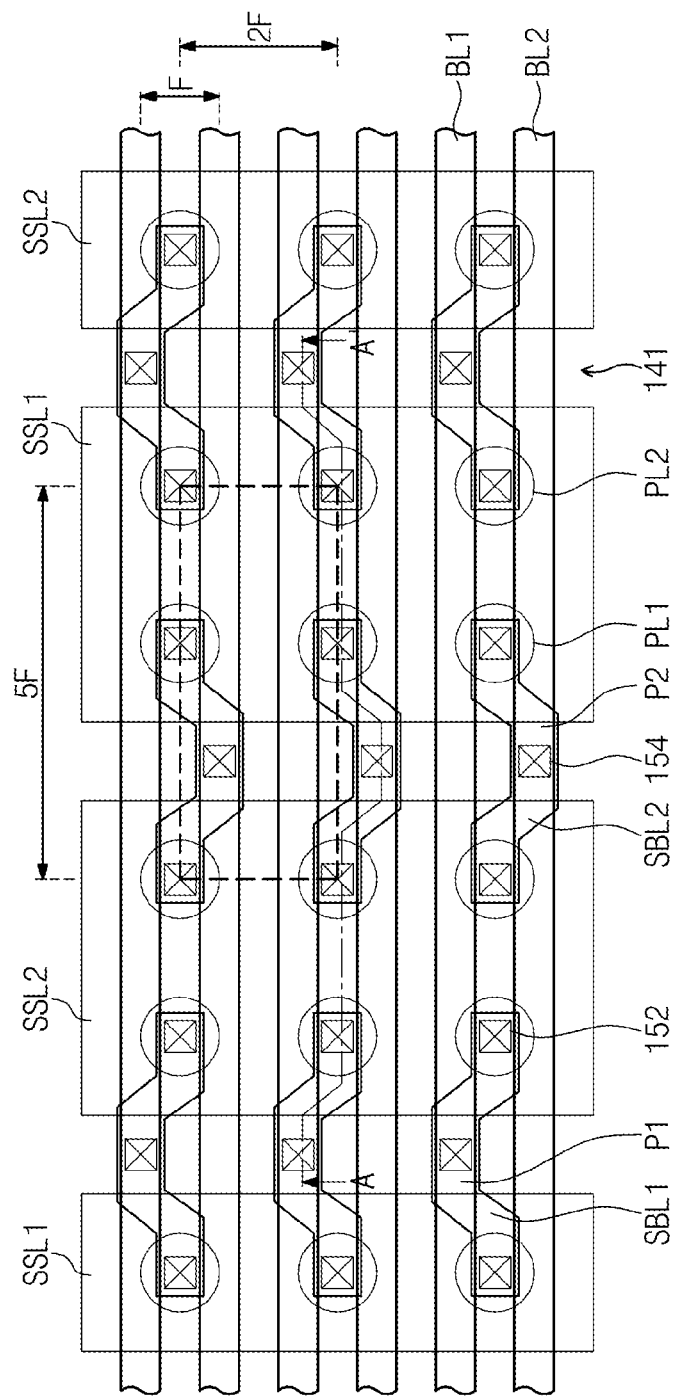
Figure 5B:
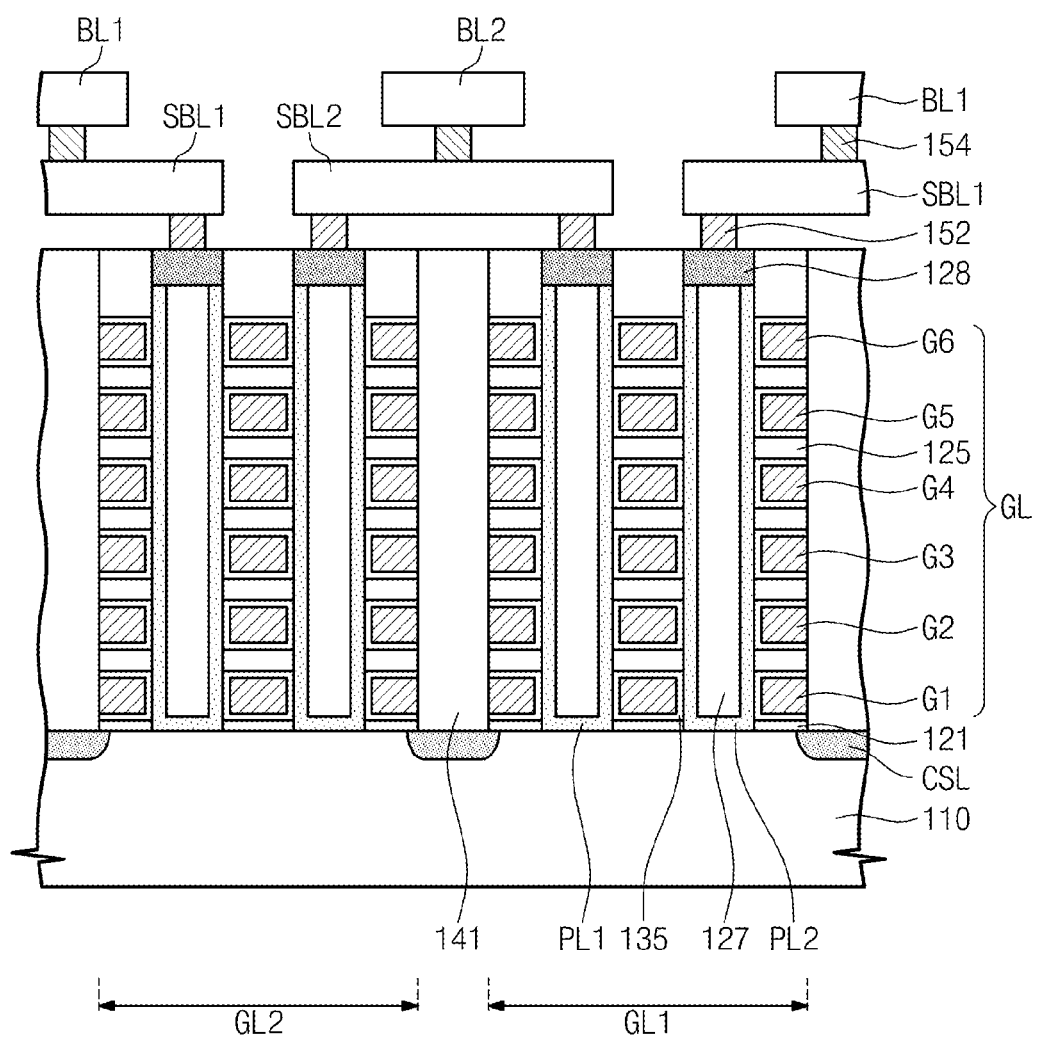
FIG. 5B is a cross-sectional view taken along the line A-A' in FIG. 5A.

FIG. 5A is a top plan view of the vertical type memory device in FIG. 3, and FIG. 5B is a cross-sectional view taken along line A-A' in FIG. 5A. With reference to FIGS. 5A and 5B, a vertical type memory device according to some embodiments of the inventive concept will now be described in detail.

Referring to FIGS. 5A and 5B, gate structures GL may include first and second gate structures GL1 and GL2. A sixth gate electrode G6 of the first gate structure GL1 may be named as a first string selection line SSL1, and a sixth gate electrode G6 of the second gate structure GL2 may be named as a second string selection line SSL2. The first and second selection lines SSL1 and SSL2 may be alternately arranged in a second direction.

Vertical pillars may include first and second vertical pillars PL1 and PL2 sequentially arranged in the second direction. The first and second vertical pillars PL1 and PL2 may be arranged in a matrix of first and second directions. The first vertical pillars PL1 are coupled at one side of string selection lines SSL1 or SSL2, and the second vertical pillars PL2 may be coupled at the other side thereof. Vertical pillars immediately adjacent in the first direction may be spaced apart from each other by, for example, two pitches of bitlines BL1 and BL2.

Sub-interconnections may interconnect vertical pillars PL1 and PL2 that are coupled to different string selection lines SSL. The sub-interconnections may include a first sub-interconnection SBL1 and a second sub-interconnection SBL2. For example, the first sub-interconnections SBL1 may connect second vertical pillars PL2 of one first string selection line SSL1 to first vertical pillars PL1 of the second string selection line SSL2, and the second sub-interconnections SBL2 may connect second vertical pillars PL2 of the second string selection line SSL2 to first vertical pillars PL1 of another first string selection line SSL1.

Each of the first sub-interconnections SBL1 and each of the second sub-interconnections SBL2 may be arranged in a first direction. The first and second sub-interconnections SBL1 and SBL2 may be alternately arranged in a second direction. The first sub-interconnections SBL1 and the second sub-interconnections SBL2 may be connected to other bitlines adjacent to each other. For example, the first sub-interconnections SBL1 may be connected to a first bitline BL1, and the second sub-interconnections SBL2 may be connected to a second bitline BL2.

The first sub-interconnections SBL1 may include first protrusions P1 protruding in the first direction, and the second sub-interconnections SBL2 may include second protrusions P2 protruding in a direction opposite to the first direction.

In some embodiments, the first protrusion P1 and the second protrusions P2 may be arranged to extend in the same direction depending on the application.

The protrusions P1 and P2 may extend over first separation insulating layers 141 between gate structures GL1 and GL2.

First contacts 152 may connect the vertical pillars PL1 and PL2 to the sub-interconnections SBL1 and SBL2. Second contacts 154 may connect the sub-interconnections SBL1 and SBL2 to the bitlines BL1 and BL2. The first contacts 152 may be disposed on the vertical pillars PL1 and PL2. The second contacts 154 may be disposed on the sub-interconnections SBL1 and SBL2 over the first separation insulating layers 141 between the gate structures GL1 and GL2. For example, the second contacts 154 may directly overlie the first separation insulating layers 141.

As illustrated in FIG. 5A, the second contacts 154 on the first sub-interconnections SBL1 are shifted from the first contacts 152 in the first direction, e.g., shifted by half the pitch of the bitlines BL1 and BL2, and the second contacts 154 on the second sub-interconnections SBL2 are shifted from the first contacts 152 in a direction opposite to the first direction, e.g., shifted by half the pitch of the bitlines BL1 and BL2. The second contacts 154 may be disposed on the protrusions P1 and P2.

Figure 5D:
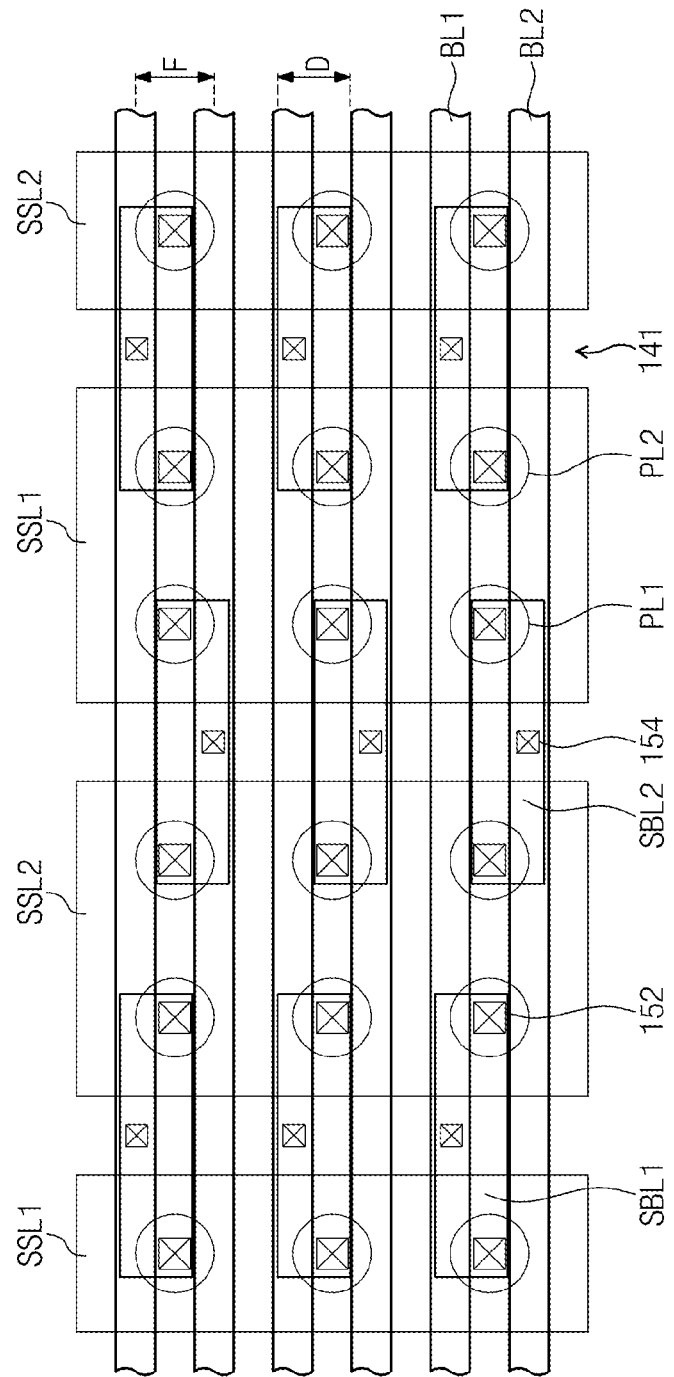

FIGS. 5C and 5D illustrate modified examples of FIG. 5A. With reference to FIGS. 5C and 5D, modified examples of a vertical type memory device according to some embodiments of the inventive concept will be explained below in detail. Technical features similar to those explained in FIGS. 5A and 5B will not be explained, but differences therebetween will be explained in detail.

Referring to FIG. 5C, first sub-interconnections SBL1 may extend in a second direction and include protrusions P1 protruding in a first direction. Second sub-interconnections SBL2 may have an oblong or substantially rectangular shape extending in the second direction without protrusions P1 or P2. The second contacts 154 on the first sub-interconnections SBL1 may be shifted from the first contacts 152, and the second contacts 154 on the second sub-interconnections SBL2 may be in line with the first contacts 152. The second contacts 154 on the first sub-interconnections SBL1 may be shifted from the first contacts 152 in the first direction by one pitch of the bitlines BL1 and BL2.

Referring to FIG. 5D, the first and second sub-interconnections SBL1 and SBL2 may have an oblong or rectangle shape extending in the second direction. For example, the sub-interconnections SBL and SBL2 may have greater width than the bitlines BL1 and BL2 and have smaller width than the diameter of the vertical pillars. The second contacts 154 on the first sub-interconnections may be shifted from the first contacts 152 in the first direction by, for example, half the pitch of the bitlines BL1 and BL2, and the second contacts 154 on the second sub-interconnections SBL2 may be shifted from the first contacts 152 in a direction opposite to the first direction by, for example, half the pitch of the bitlines BL1 and BL2. The sub-interconnections SBL1 and SBL2 have a width that extends from the first contacts 152 to the second contacts 154.

As shown in FIGS. 5C and 5D, the sub-interconnections SBL1 and SBL2 may be modified into various shapes. Although particular shapes and sizes have been used as examples, in other embodiments, the sub-interconnections SBL may take other shapes, sizes, or the like.

In the above described embodiments of the inventive concept, connecting vertical pillars to bitlines through sub-interconnections according to the technical configuration described herein allows adjacent bitlines, e.g., immediately adjacent bitlines, be disposed more closely, thus increasing the integration density. For example, if a diameter of vertical pillars is referred to as F when viewed from the top, an effective area may be defined as an average area occupied by a single channel on a top surface. An effective area to a single channel is $6F^2$ (2F×3F/1 channel) in the layout of a conventional VNAND arrangement, while an effective area to a single channel in first embodiment of the inventive concept is reduced to $5F^2$ (2F×5F/2 channel). Accordingly, a unit cell area can be reduced to increase integration density. Furthermore, the number of bitlines selected by one string selection gate, i.e., a page size may be doubled, as compared to the conventional VNAND. Thus, program and read speeds can be improved.

A method of forming the vertical type memory device in FIG. 3 will now be described. FIG. 6A to FIG. 12A are top plan views corresponding to FIG. 5A, and FIGS. 6B to 12B are cross-sectional views corresponding to FIG. 5B.

Figure 6A:
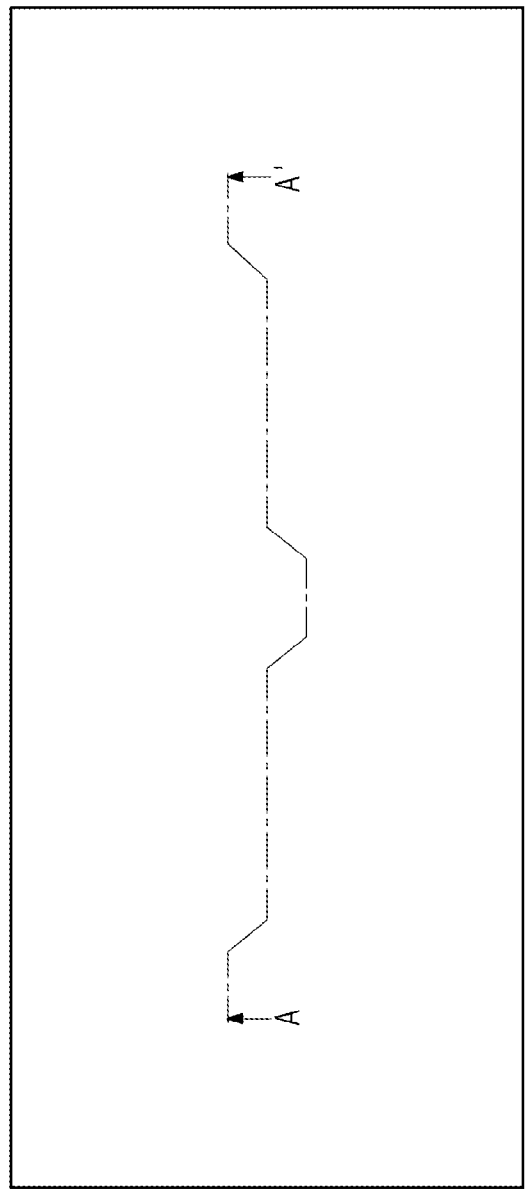
FIG. 6A to FIG. 12A are top plan views corresponding to FIG. 5A, and FIGS. 6B to 12B are cross-sectional views corresponding to FIG. 5B.
Figure 6B:
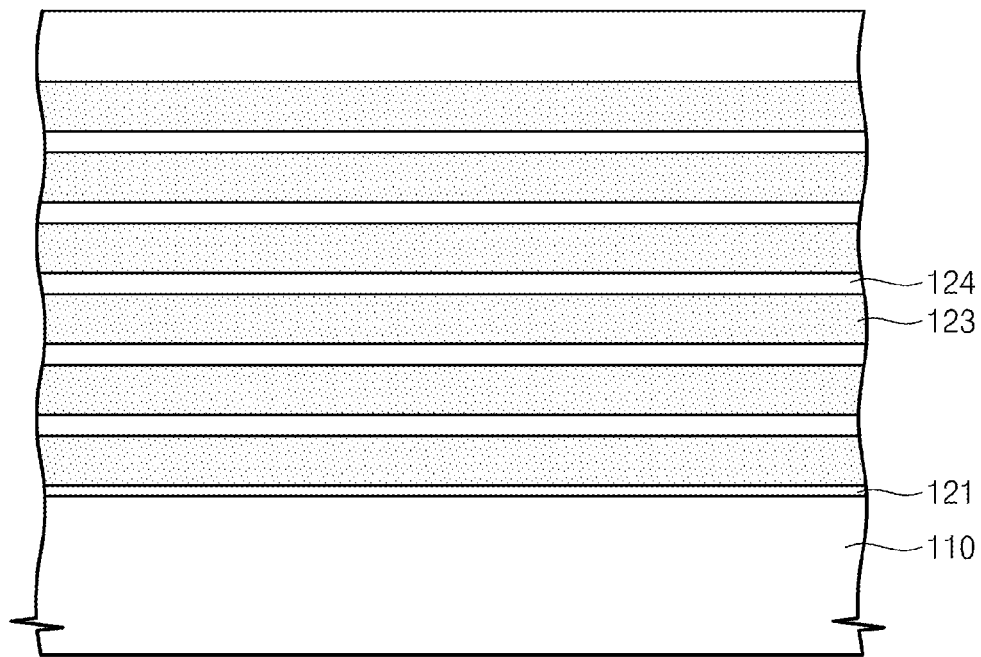

Referring to FIGS. 6A and 6B, a substrate 110 is provided. The substrate 110 may have a first conductivity type, e.g., P-type. A buffer dielectric layer 121 may be formed on the substrate 110. The buffer dielectric layer 121 may include, for example, silicon oxide. The buffer dielectric layer 121 may be formed by, for example, a thermal oxidation process. Sacrificial layers 123 and insulating layers 124 are alternately stacked on the buffer dielectric layer 121. The thickness of an uppermost insulating layer 124U may be greater than those of the other insulating layers 124. The insulating layers 124, 124U may include, for example, silicon oxide. The sacrificial layer 123 may include materials having different wet etch properties (etch selectivity) with respect to the buffer dielectric layer 121 and the insulating layers 124, 124U. The sacrificial layers 123 may include, for example, silicon nitride, silicon oxynitride, polysilicon or polysilicon germanium. The sacrificial layers 123 and the insulating layers 124 may be formed by, for example, chemical vapor deposition (CVD).

Figure 7B:
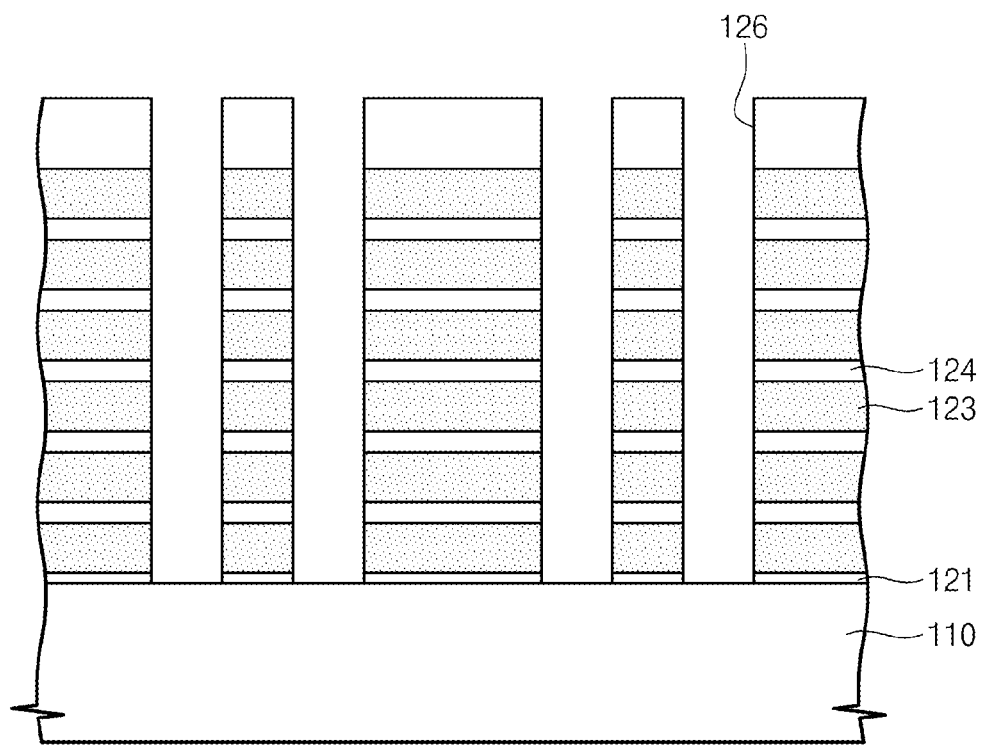

Referring to FIGS. 7A and 7B, vertical holes 126 are formed to expose the substrate 110, passing through the buffer dielectric layer 121, the sacrificial layers 123, and the insulating layers 124, 124U. The vertical holes 126 may be disposed in the same manner as the vertical pillars PL1 and PL2 explained with reference to FIG. 5A.

Figure 8B:
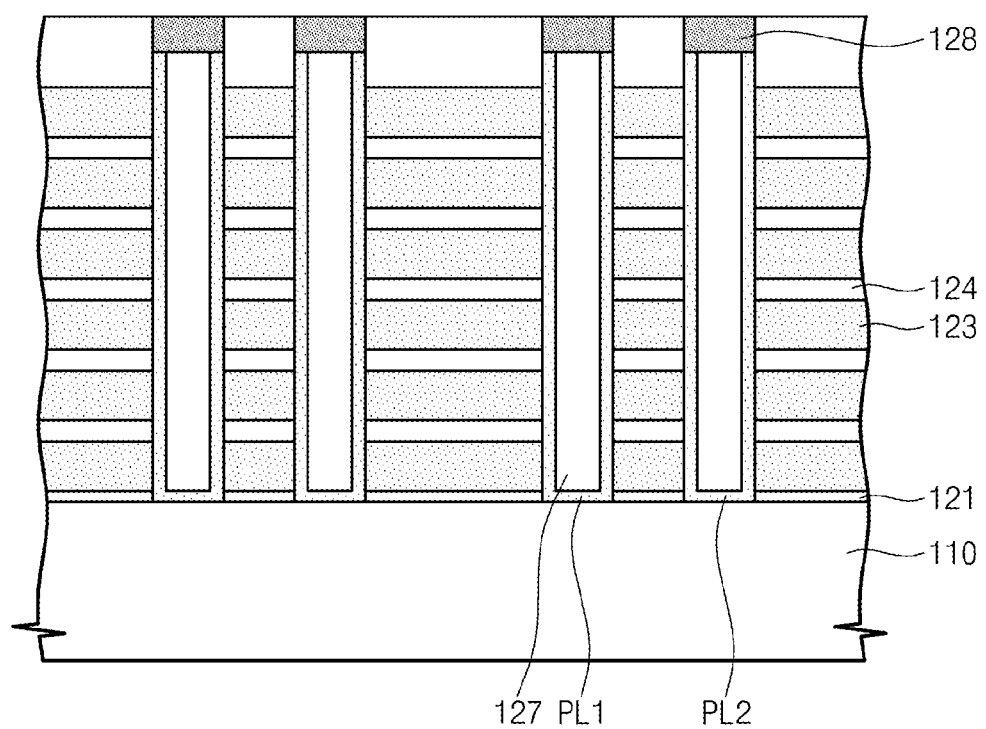

Referring to FIGS. 8A and 8B, vertical pillars PL1 and PL2 are formed in the vertical holes 126. In one aspect, the vertical pillars PL1 and PL2 may be semiconductor layers of a first conductivity type. The semiconductor layer may be formed not to fill up (i.e., partially fill) the vertical holes 126, and an insulating material may be formed on the semiconductor layer to fill up the vertical holes 126. The semiconductor layer and the insulating material may be planarized to expose the uppermost insulating layer 124U. Thus, cylindrical vertical pillars PL1 and PL2 may be formed having the inside filled with a filling insulating layer 127.

Alternatively, the semiconductor layer may be formed to fill the vertical holes 126. In this case, the filling insulating layer may not be required. Upper portions of the vertical pillars PL1 and PL2 may be recessed to be lower than the uppermost insulating layer. Conductive patterns 128 may be formed in the vertical holes 126 in which the vertical pillars PL1 and PL2 are recessed. The conductive patterns 128 may be formed of a conductive material such as doped polysilicon or a metal. Drain regions may be formed by introducing impurities of second conductivity type into the conductive patterns 128 and upper portions of the vertical pillars PL1 and PL2. The second conductivity type may be N-type.

In another aspect, the vertical pillars PL1 and PL2 may include at least one of conductive materials, e.g., a doped semiconductor, a metal, conductive metal nitride, silicide or nanostructures (such as carbon nanotube or graphene).

Figure 9A:
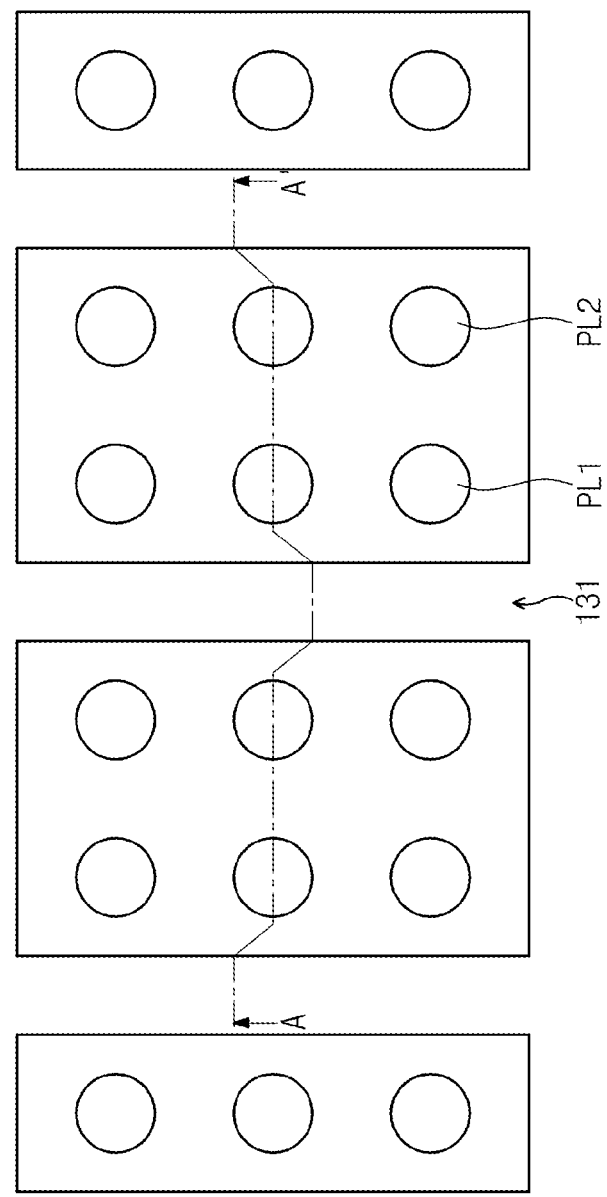
Figure 9B:
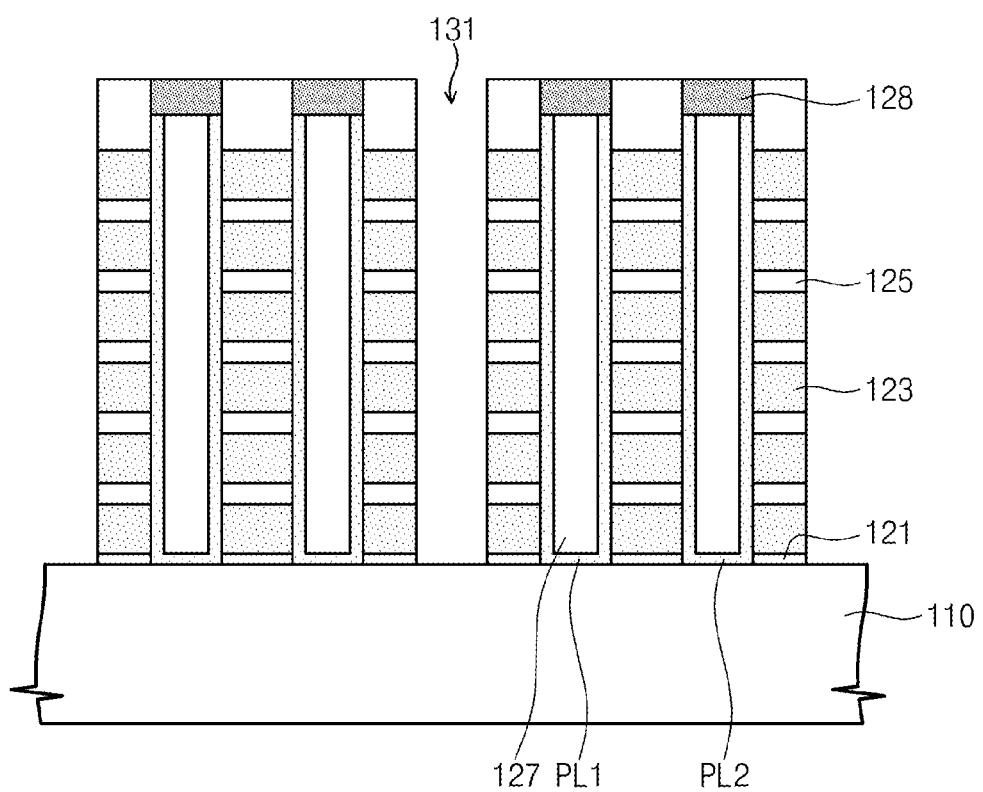

Referring to FIGS. 9A and 9B, the buffer dielectric layer 121, the sacrificial layers 123, and the insulating layers 124 are successively patented to form separation regions 131 that are spaced apart from each other, extend in a first direction, and expose a portion of the substrate 110. The patterned insulating layers 124, 124U may become insulating patterns 125.

Figure 10A:
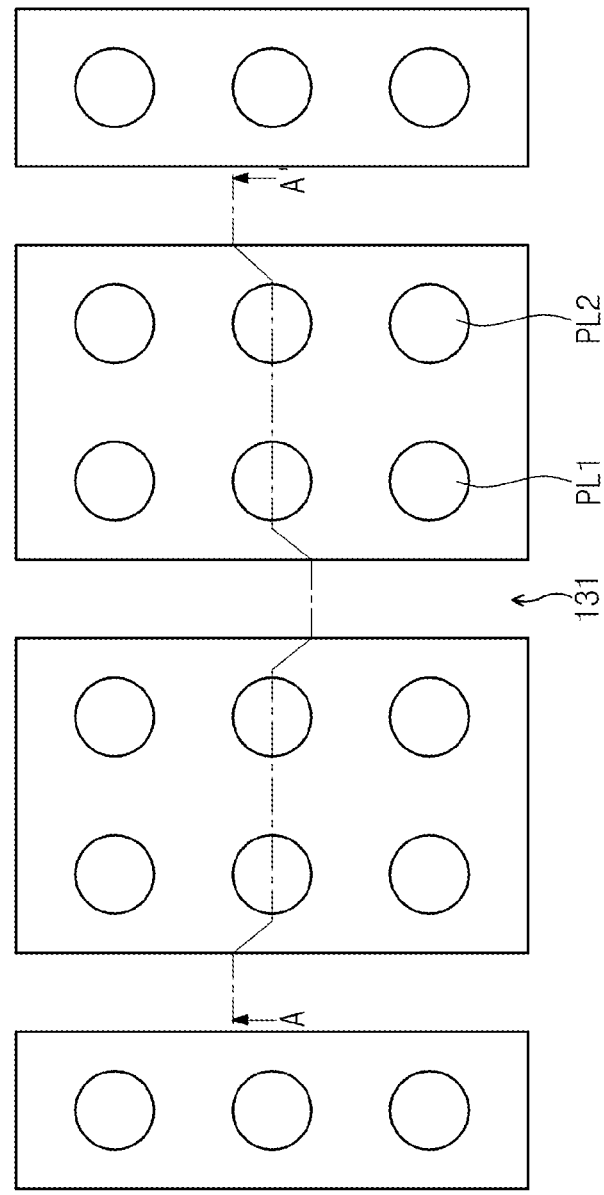
Figure 10B:
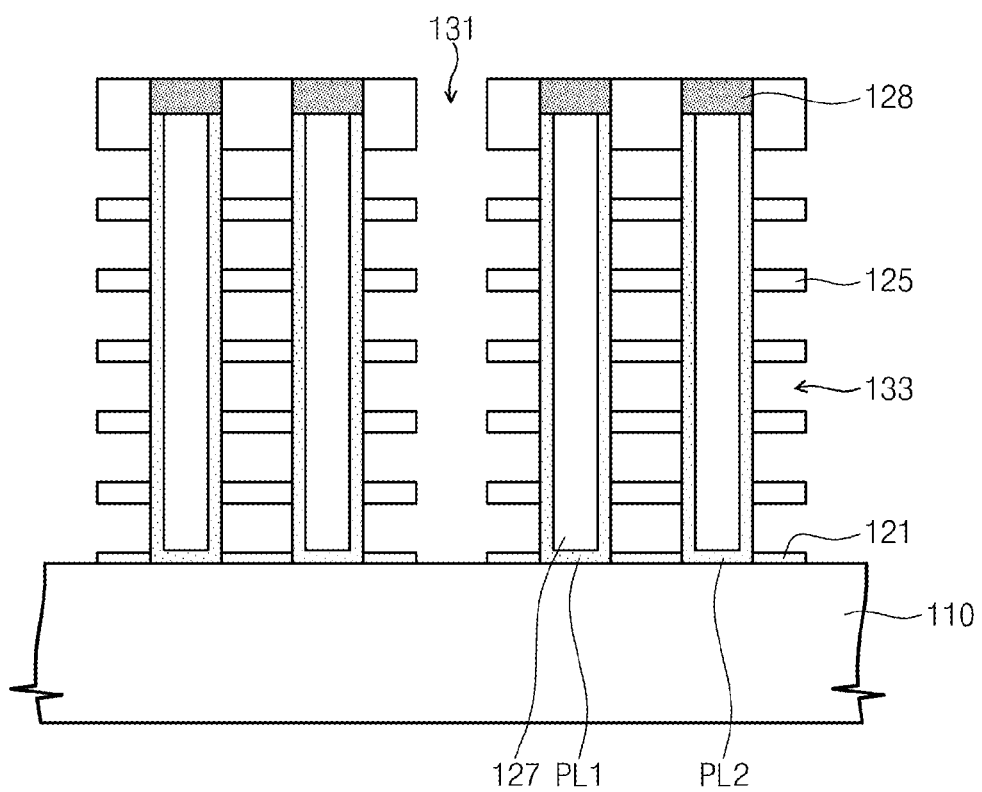

Referring to FIGS. 10A and 10B, the patterned sacrificial layers 123 exposed to the separation regions 131 are selectively removed to form recessed regions 133. The recessed regions 133 correspond to regions in which the sacrificial layers 123 are removed and are defined by the vertical pillars PL1 and PL2 and the insulating patterns 125. If the sacrificial layers 123 include silicon nitride or silicon oxynitride, a process of removing the sacrificial layers 123 may be performed using an etchant containing phosphoric acid. Portions of sidewalls of the vertical pillars PL1 and PL2 are exposed to the recessed region 133.

Figure 11B:
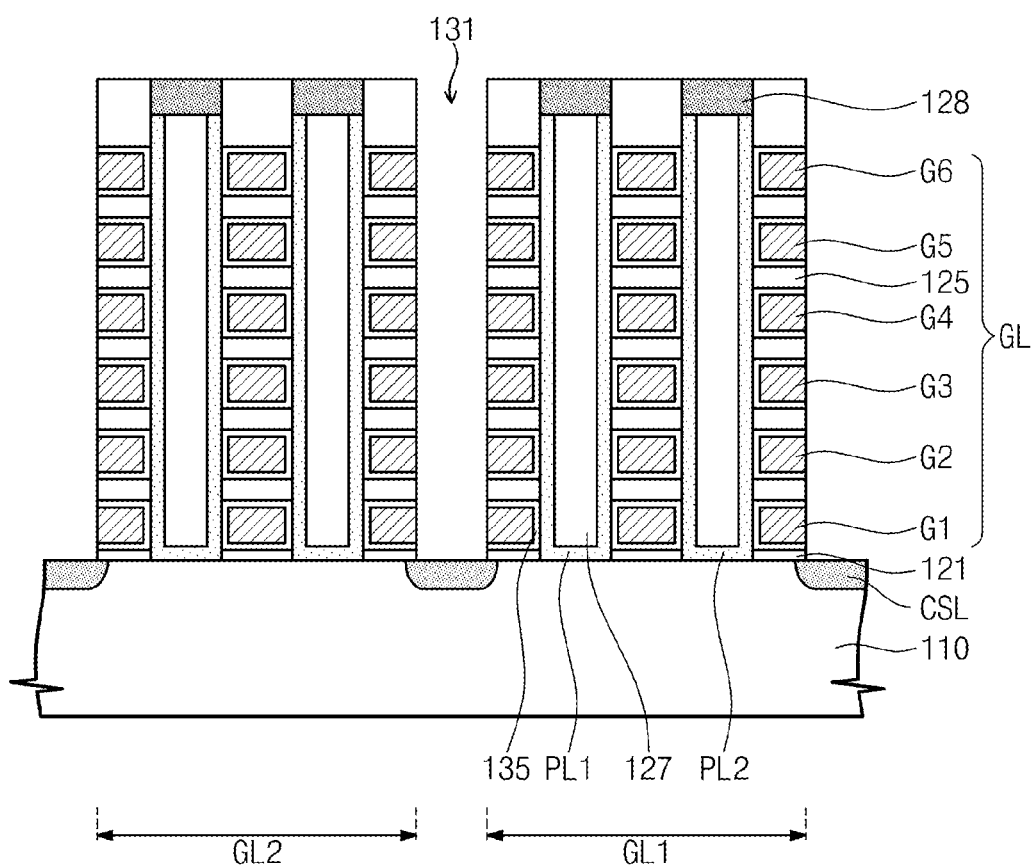

Referring to FIGS. 11A and 11B, an information storage element 135 is formed in the recessed region 133. In one embodiment, the information storage element 135 may include a tunnel insulating layer contacting the vertical pillars PL1 and PL2, a charge storage layer on the tunnel insulating layer, and a blocking insulating layer on the charge storage layer (see, for example, FIG. 4A). In this case, the vertical pillars PL1 and PL2 may be semiconductor pillars. The tunnel insulating layer may include silicon oxide. The tunnel insulating layer may formed by thermally oxidizing the vertical pillars PL1 and PL2 exposed to the recessed region 133. Alternatively, the tunnel insulating layer may be formed by an atomic layer deposition (ALD) process. The charge storage layer may be a charge trapping layer or an insulating layer including conductive nanoparticles. The charge trapping layer may include, for example, silicon nitride. The blocking insulating layer may include high-k dielectric (e.g., aluminum oxide or hafnium oxide). The blocking insulating layer may be a multi-layered film comprising a plurality of thin films. For example, the blocking insulating layer may include aluminum oxide and silicon oxide, and there may be various stacked orders of aluminum oxide and silicon oxide. The charge storage layer and the blocking insulating layer may be formed by the ALD process with superior step coverage and/or a chemical vapor deposition (CVD) process. Alternatively, when the information storage element 135 has a structure shown in FIGS. 4B to 4E, at least one of the tunnel insulating layer, the charge storage layer and/or the blocking insulating layer constituting the information storage element 135 may be formed in the vertical holes 126 before formation of the vertical pillars PL1 and PL2.

In some other embodiments, the information storage element 135 may be a variable resistance pattern (see FIGS. 4F to 4H). The variable resistance pattern may include at least one of materials having variable resistance characteristics, i.e., its resistance being variable depending on current passing therethrough. In this case, the vertical pillars PL1 and P12 may be conductive pillars including conductive materials (e.g., a doped semiconductor, a metal, conductive metal nitride, silicide or nanostructures (such as carbon nanotube or grapheme)). When the information storage element 135 has the structure shown in FIG. 40, the information storage element 135 may be formed in the vertical holes 126 before formation of the vertical pillars PL1 and PL2.

A conductive layer is formed on the information storage element 135 in the recessed region 133. The conductive layer may be formed of at least one of doped silicon, a metal (e.g., tungsten), metal nitride, and metal silicide. The metal conductive layer may be formed by the ALD process. When the conductive layer is a metal silicide layer, the conductive layer may be formed by forming a polysilicon layer, removing a portion of the polysilicon layer adjacent to a first separation region 131 to recess the polysilicon layer, forming a metal layer on the recessed polysilicon layer, thermally treating the metal layer, and removing a non-reacting metal layer. The metal layer for the metal silicide layer may include tungsten, titanium, cobalt or nickel.

The conductive layer formed outside of the recessed region 133 (i.e., in the first separation region 131) is removed. Thus, gate electrode G1~G6 are formed in the recessed region 133. The gate electrodes G1~G6 extend in a first direction. Gate structures GL may include the gate electrodes G1~G6. The gate structures GL may include first and second gate structures GL1 and GL2 that are alternately arranged in a second direction. The first and second vertical pillars PL1 and PL2 arranged in a matrix of the first and second directions may be coupled with one gate structure.

The conductive layer formed in the separation regions 131 may be removed to expose the substrate 110. Impurities of second conductivity type may be heavily introduced into the exposed substrate 110 to form common source lines CSL.

Figure 12B:
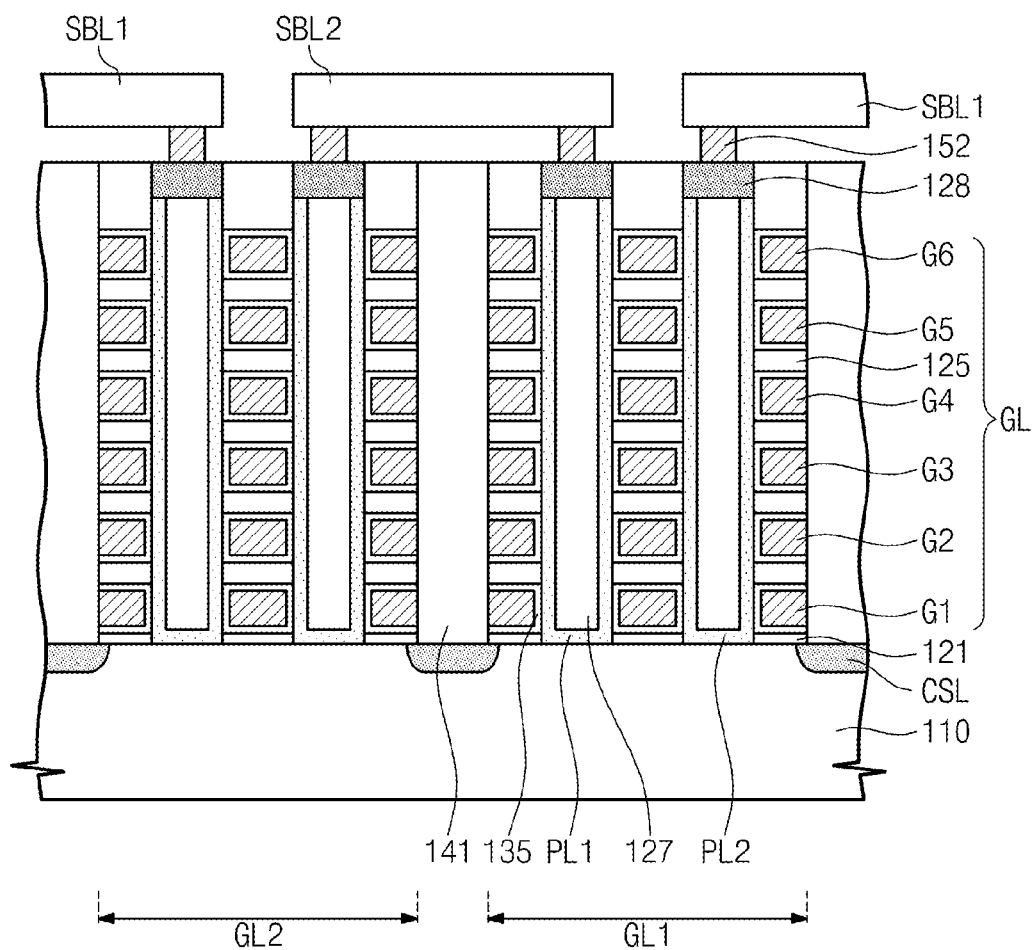

Referring to FIGS. 12A and 12B, a first separation insulating layer 141 is formed to fill the separation regions 131. First contacts 152 may be formed on the vertical pillars PL1 and PL2. Sub-interconnections SBL1 and SBL2 may be formed on the first contacts 152. The sub-interconnections SBL1 and SBL2 may connect the vertical pillars PL1 and PL2 coupled to adjacent string selection lines SSL1 and SSL2, respectively, through the first contacts 152. That is, the sub-interconnections SBL1 and SBL2 may span the first separation insulating layers 141.

The first sub-interconnections SBL1 and the second sub-interconnections SBL2 may extend in the second direction. The first sub-interconnection SBL1 may include first protrusions P1 protruding in the first direction, and the second sub-interconnections may include second protrusions P2 protruding in a direction opposite to the first direction. The protrusions P1 and P2 may extend over the first separation insulating layers 143 between the gate structures GL1 and GL2.

Figure 13A:
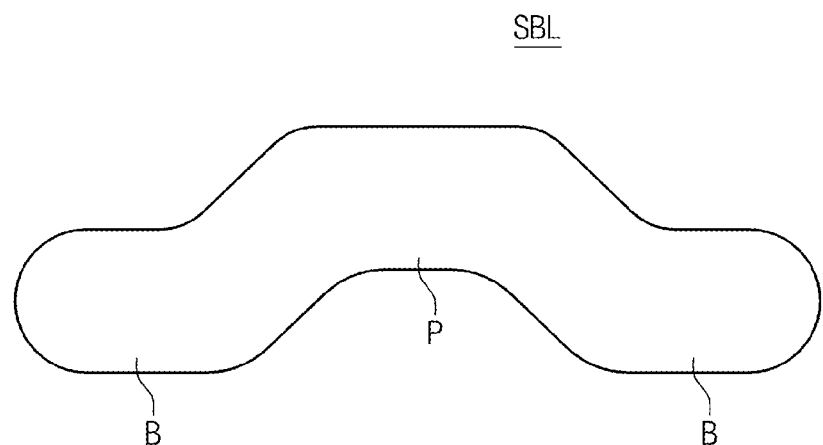
FIG. 13A is an enlarged view of the sub-interconnections in FIG. 12A.
Figure 13B:
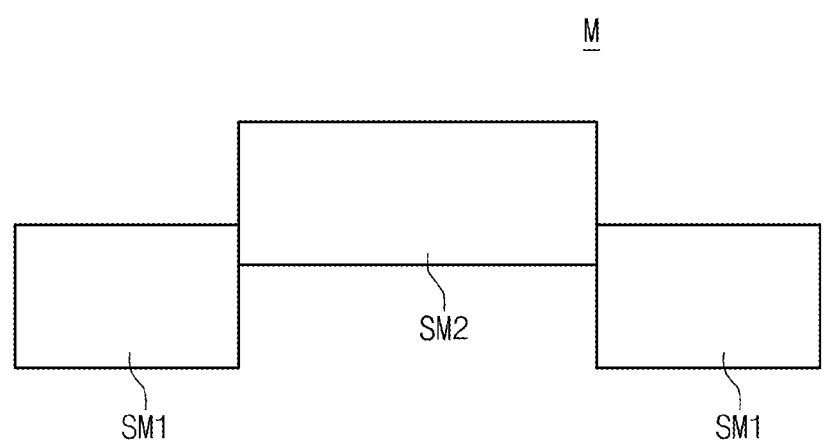
FIG. 13B to 13D illustrate examples of mask patterns for the sub-interconnections.
Figure 13C:
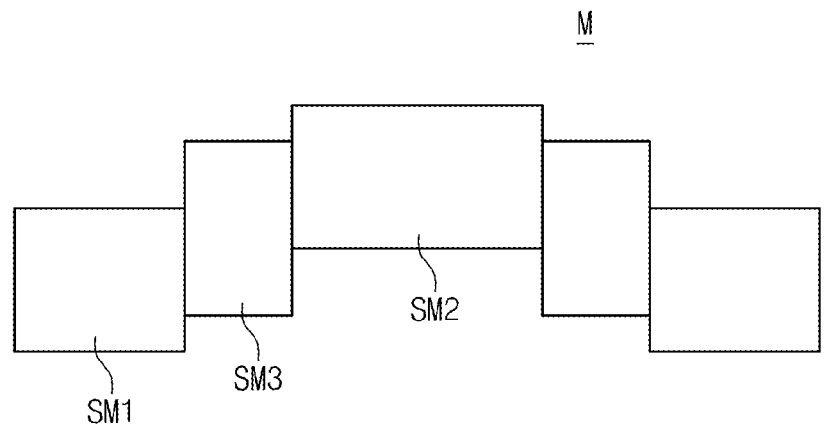
Figure 13D:
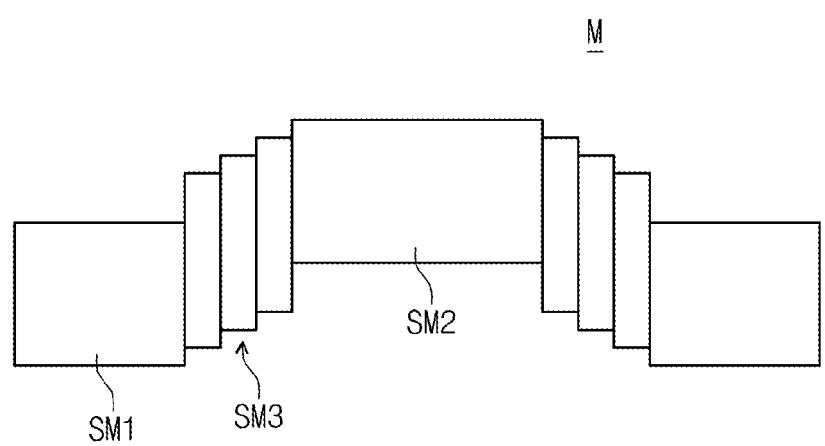

FIG. 13A is an enlarged view of the sub-interconnections in FIG. 12A. FIG. 13B to 13D illustrate examples of mask patterns for the sub-interconnections. The mask patterns may be formed from photoresist patterns.

Referring to FIG. 13A, the sub-interconnections SBL (SBL1, SBL2) may include a body B extending along a first direction and a protrusion P protruding from the body along a second direction. The sub-interconnections SBL may have a shape with rounded edges. The shape with rounded edges may result from the photolithography process and the etching process.

Referring to FIG. 13B, a mask pattern M may include a pair of first sub masks SM1 corresponding to the body B and a second sub mask SM2 corresponding the protrusion P. The first sub-mask patterns SM1 may be spaced apart from each other along the second direction. Each of the first sub-mask patterns SM1 may extend along the second direction. The second sub-mask pattern SM2 may be disposed between the first sub-mask patterns SM1 and shifted from the first sub-mask patterns SM1 along the first direction (or a direction opposite to the first direction) by a first distance. The sub-mask patterns may have a rectangular shape.

Referring to FIGS. 13C and 13D, the mask pattern M may include a pair of third sub-mask patterns SM3 between the first sub-mask patterns SM1 and the second sub-mask pattern SM2. The third sub-mask patterns SM3 may be shifted from the first sub-mask patterns SM2 along the first direction (or a direction opposite to the first direction) by about half of the first distance. The mask pattern may have a staircase shape. The third sub-mask patterns SM3 may be in a plural.

Referring to FIGS. 12A, 12B, and FIGS. 13B to 13D, the second sub-mask pattern is provided vertically over the first separation insulating layer 141. Each of the first sub-mask patterns SM1 are provided vertically over each of the vertical pillars PL1 and PL2.

Returning to FIGS. 5A and 5B, the first sub-interconnections SBL1 and the second sub-interconnections SBL2 are connected to other adjacent bitlines through the second contacts 154. The first sub-interconnections SBL1 may be connected to the first bitline BL1, and the second sub-interconnections SBL2 may be connected to the second bitline BL2.

Figure 14:
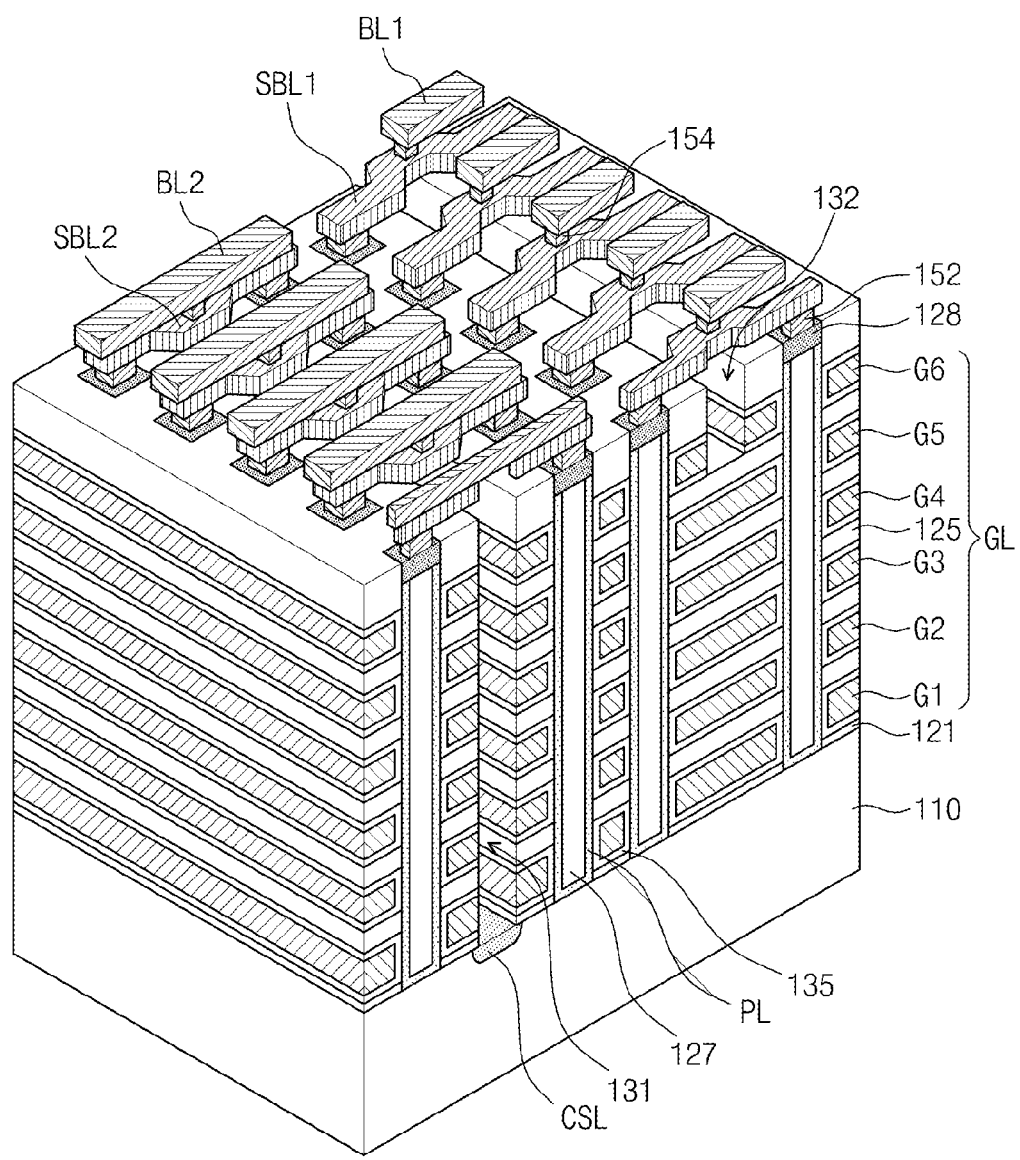
FIG. 14 is a perspective view of a memory block of a vertical type memory device according to second embodiments of the inventive concept.
Figure 15A:
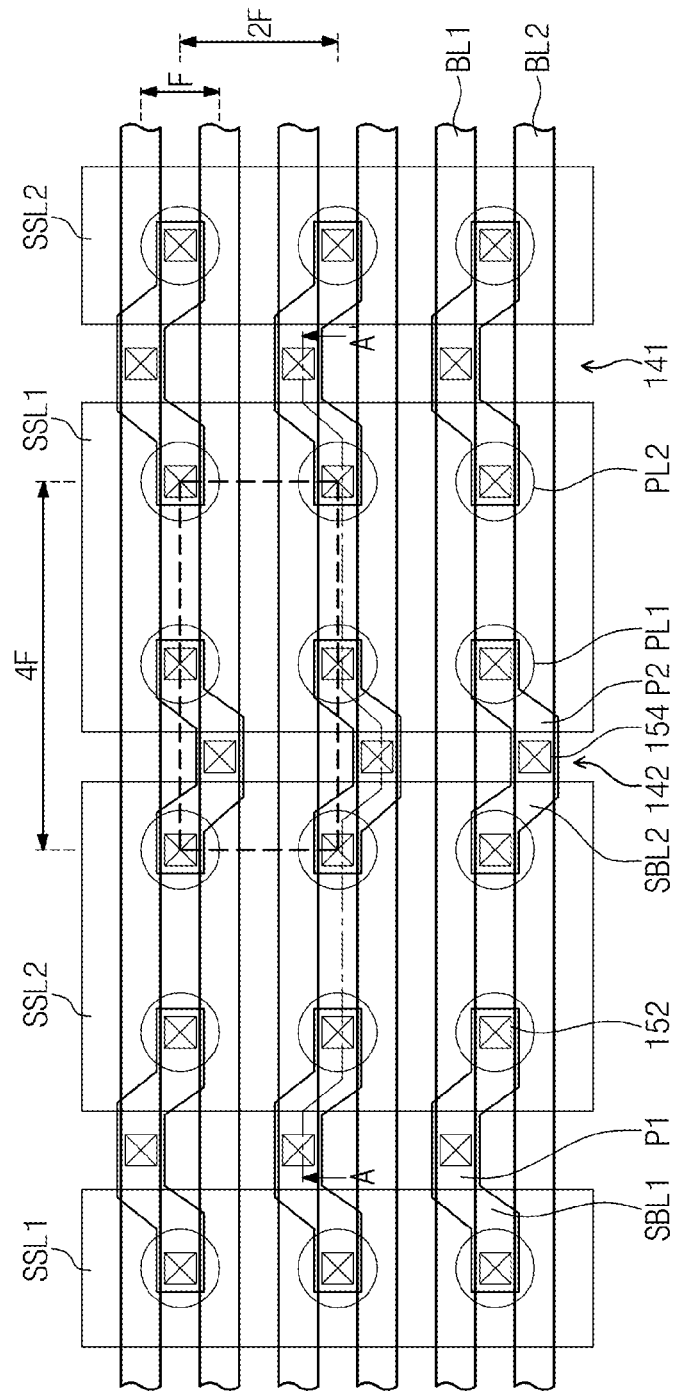
FIG. 15A is a top plan view of the vertical type memory device in FIG. 14.
Figure 15B:
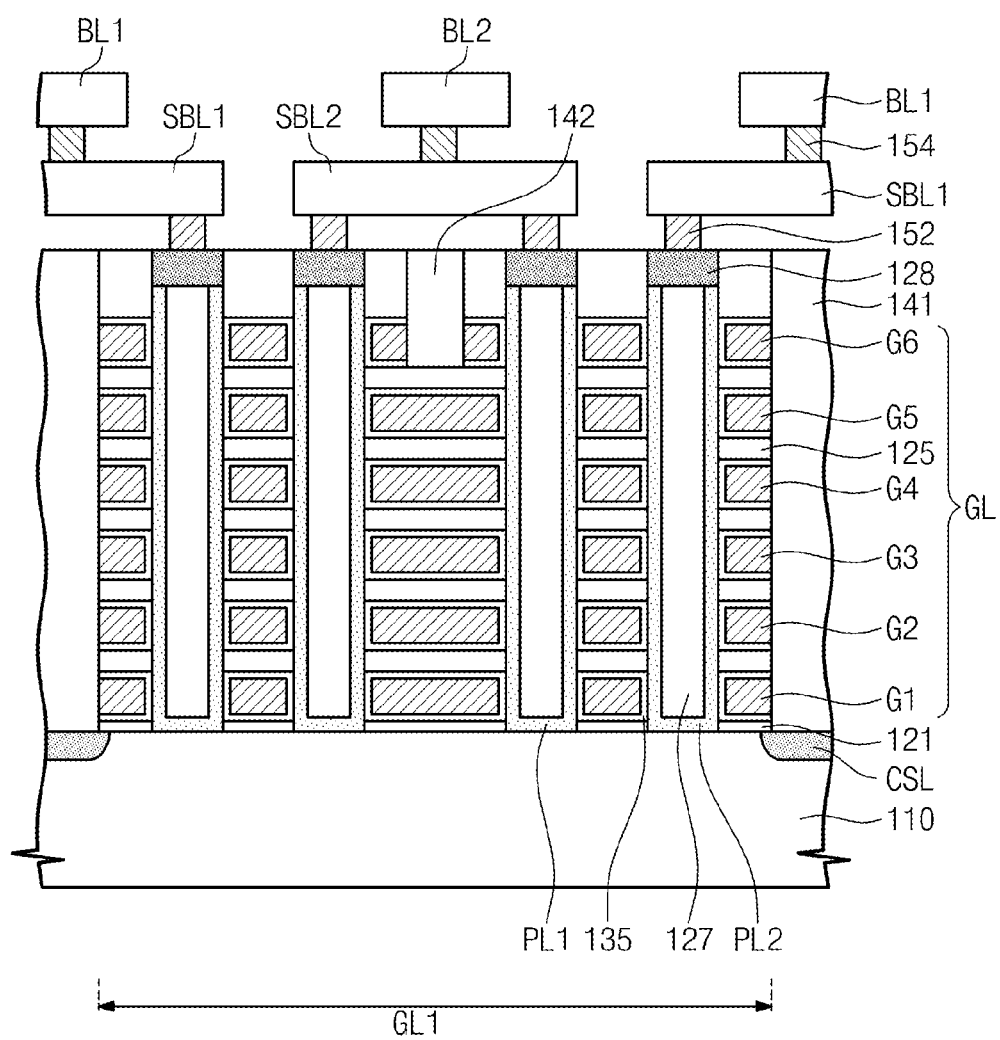

FIG. 14 is a perspective view of a memory block of a vertical type memory device according to some embodiments of the inventive concept. FIG. 15A is a top plan view of the vertical type memory device in FIG. 14, and FIG. 15B is a cross-sectional view taken along line A-A' in FIG. 15A. Technical features similar to those of the embodiment described with reference to FIG. 3 will not be explained, but differences therebetween will be explained in detail.

Referring to FIGS. 14, 15A, and 15B, four vertical pillars PL1, PL2, PL1, and PL2 are sequentially arranged in a single gate structure GL in a second direction. The four vertical pillars PL1, PL2, PL1, and PL2 are arranged in a matrix and also extend in the first direction in the gate structure GL.

A sixth gate electrode G6 of one gate structure GL may include first and second string selection lines SSL1 and SSL2. The first string selection line SSL1 and the second string selection line SSL2 may be adjacent to each other and alternately arranged in the second direction. A second separation insulating layer 142 is formed between the first string selection line SSL1 and the second string selection line SSL2. The second separation insulating layer 142 may have smaller width than the first separation insulating layer 141.

The first protrusions P1 may extend over the first separation insulating layer 141, and the second protrusions P2 may extend over the second separation insulating layer 142. The second contact 154 on the first sub-interconnection 141 SBL1 may be disposed on the first separation insulating layer 141, and the second contact 154 on the second sub-interconnection SBL2 may be disposed on the second separation insulating layer 142.

As shown in FIGS. 5C and 5D, the sub-interconnections SBL1 and SBL2 may be modified into various shapes.

Referring to FIG. 15A, an effective area with respect to a single channel is reduced to $4F^2$ ($2F \times 4F/2$ channel) in this embodiment of the inventive concept. Likewise, a unit cell area can be reduced to increase integration density. Furthermore, the number of bitlines selected by one string selection gate, i.e., a page size may be doubled, as compared to the conventional VNAND. Thus, program and read speeds can be improved.

A method of fabricating the vertical type memory device in FIG. 14 will now be described. FIGS. 15A to 17A are top plan views corresponding to FIG. 15A, and FIGS. 16B to 18B are cross-sectional views corresponding to FIG. 15B. Technical features similar to the embodiment described with reference to FIGS. 6A to 12B will not be explained, but differences therebetween will be explained in detail.

Figure 16A:
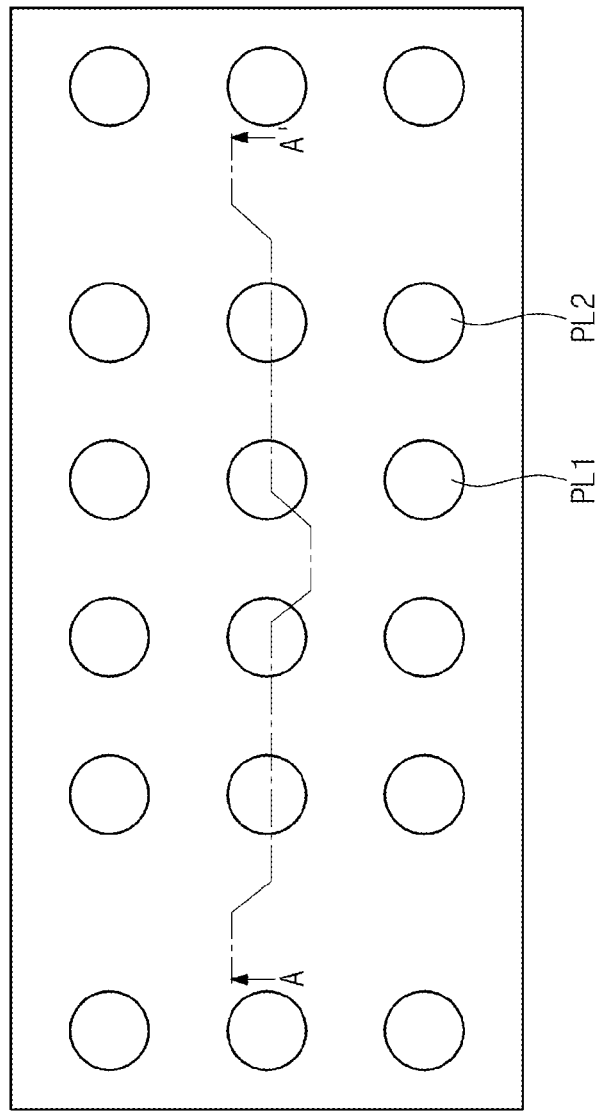
FIGS. 16A to 19A are top plan views corresponding to FIG. 15A, and FIGS. 15B to 18B are cross-sectional views corresponding to FIG. 15B.
Figure 16B:
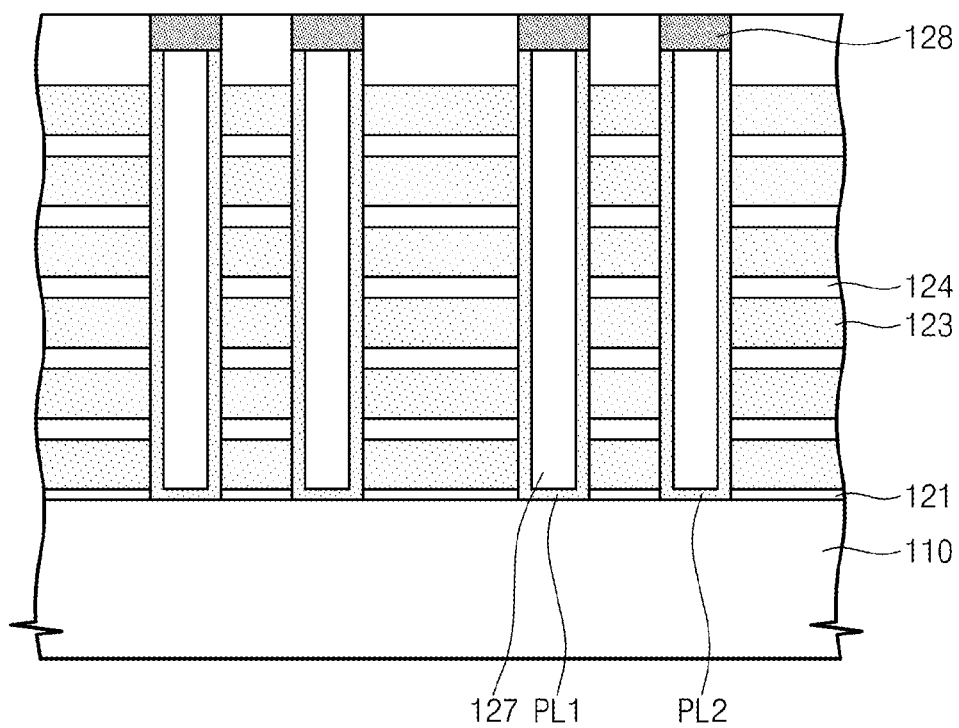

Referring to FIGS. 16A and 16B, similar to the embodiments explained with reference to FIGS. 6A to 8B, vertical pillars PL1 and PL2 are formed in vertical holes penetrating through a buffer dielectric layer 121, sacrificial layers 123, and insulating layers 124 to expose a substrate 110. The vertical pillars PL1 and PL2 may be recessed, and conductive patterns 128 may be formed in recessed vertical holes.

Figure 17B:
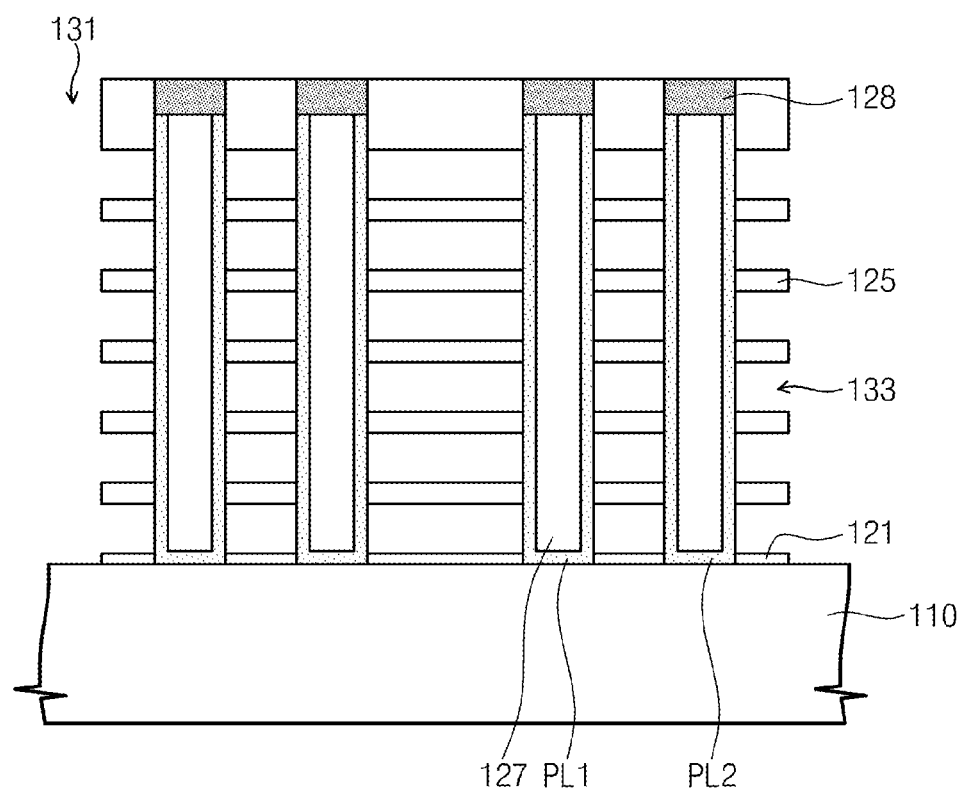

Referring to FIGS. 17A and 17B, the buffer dielectric layer 121, the sacrificial layers 123, and the insulating layers 124 may be patterned to form separation regions 131 that are spaced apart from each other. The separation regions 131 extend in the first direction, and expose a portion of the substrate 110. The patterned insulating layers 124 become insulating patterns 125. The sacrificial layers 123 exposed to the separation regions 131 are selectively removed to form a recessed region 133.

Figure 18A:
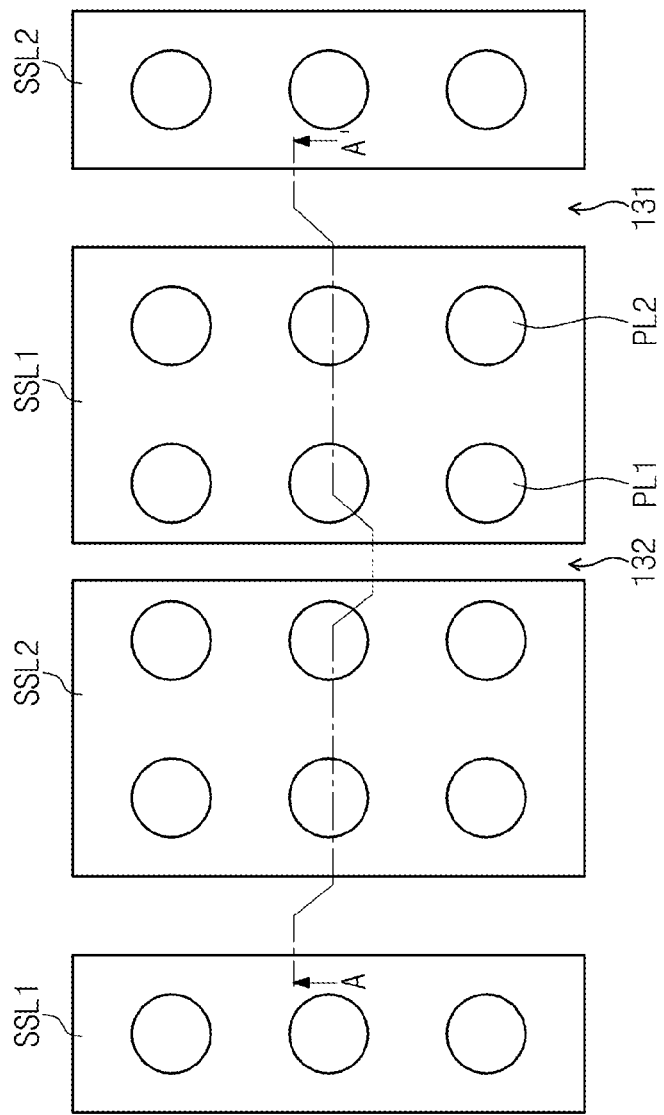
Figure 18B:
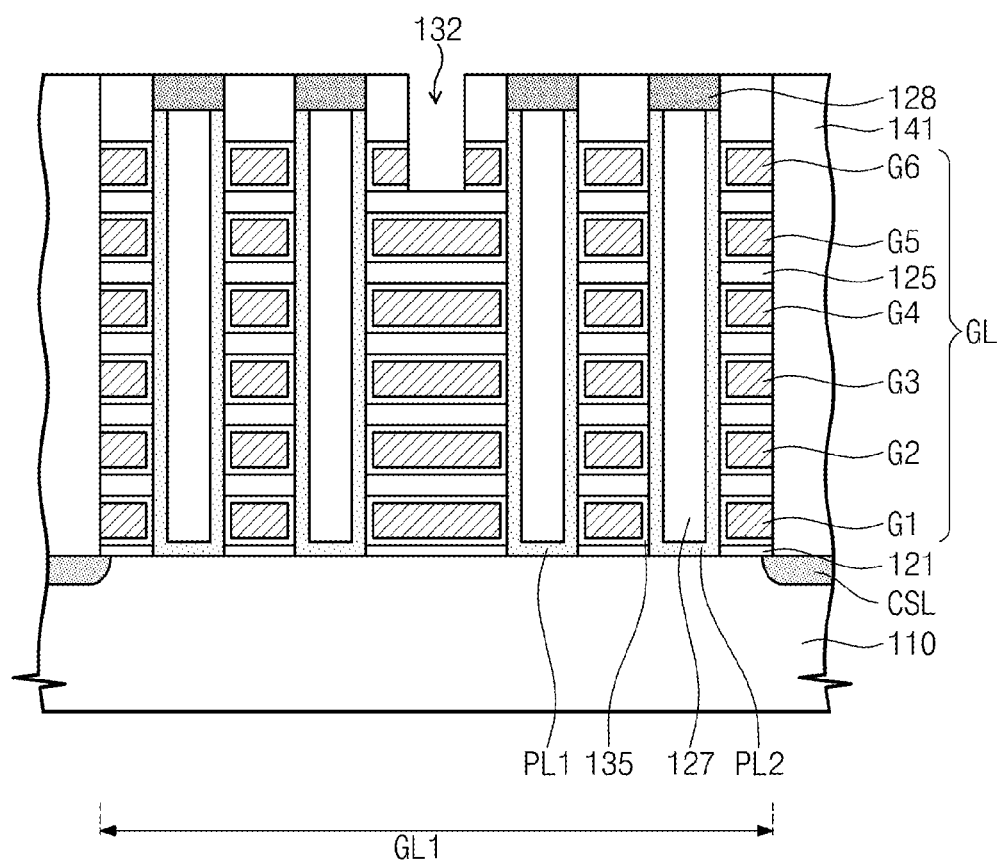

Referring to FIGS. 18A and 18B, an information storage element 135 and a conductive layer are formed in the recessed region 133. The conductive layer formed outside of the recessed region 133 (i.e., in the separation region 131) is removed. Thus, gate electrodes G1~G6 are formed in the recessed regions 133 described above. The gate electrodes G1~G6 extend in the first direction.

The conductive layer formed in the separation regions 131 may be removed to expose a portion of the substrate 110. Impurities of second conductivity type may be heavily introduced into the exposed substrate 110 to form common source lines CSL.

A first separation insulating layer 141 is formed to fill the separation regions 131. A sixth gate electrode G6 is patterned to form first and second string selection lines SSL1 and SSL2 in the single gate structure GL. A second separation region 132 is formed between the first and second string selection lines SSL1 and SSL2. The first and second string selection lines SSL1 and SSL2 are adjacent to each other and alternately arranged in the second direction. The first and second vertical pillars PL1 and PL2 arranged in a matrix may be coupled with one string selection line. For example, in this embodiment, within the single gate structure GL, first and second vertical pillars PL1 and PL2 can be coupled to either the first and second string selection lines SSL1 and SSL2.

Figure 19A:
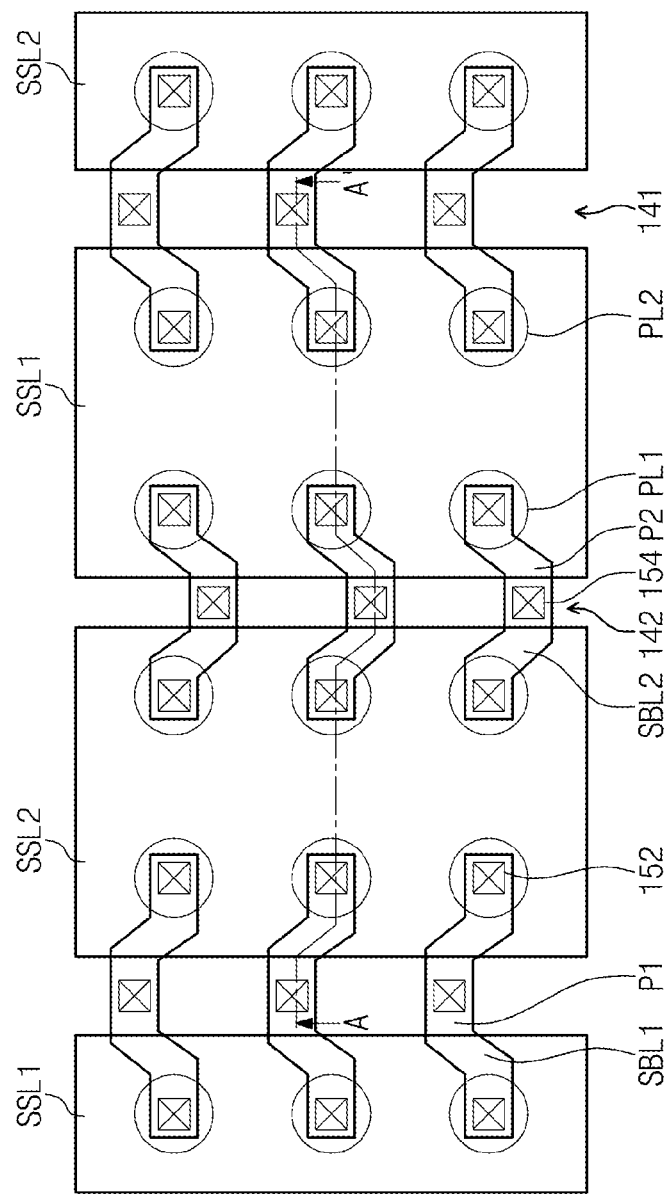
Figure 19B:
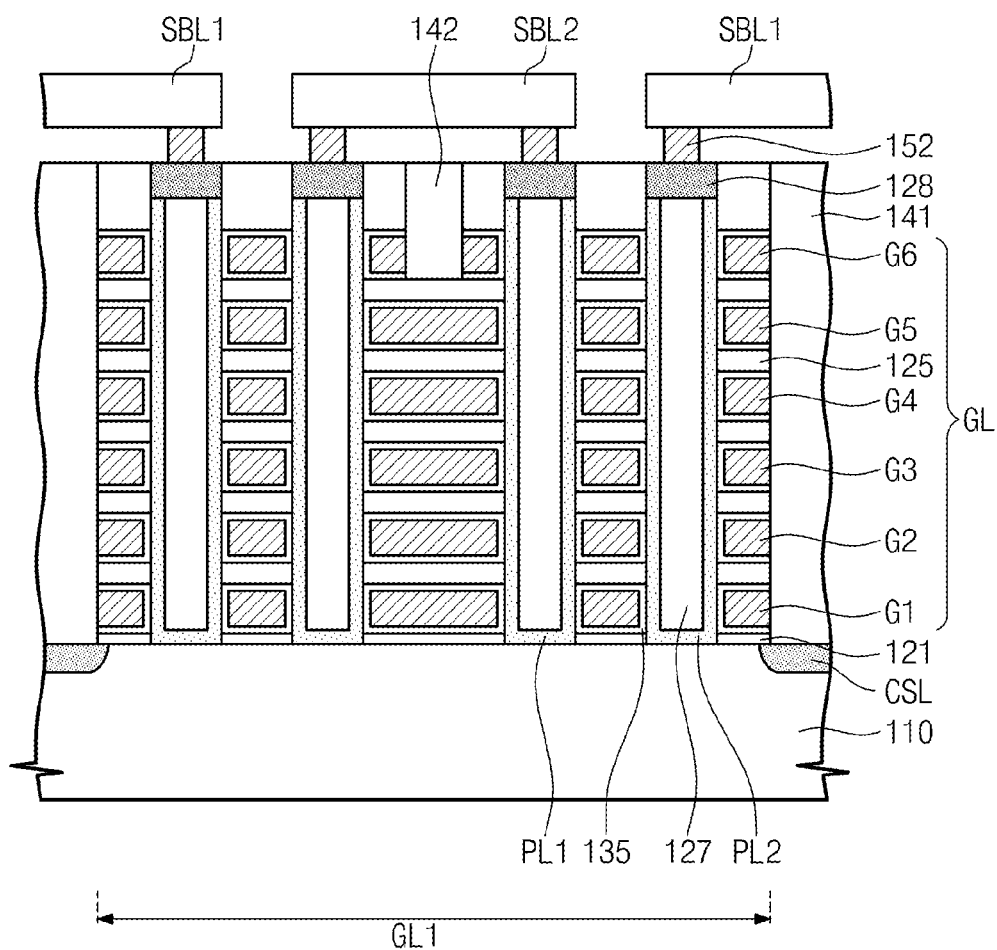

Referring to FIGS. 19A and 19B, a second separation insulating layer 142 is formed to fill the second separation region 132. First contacts 152 may be formed on the vertical pillars PL1 and PL2. Sub-interconnections SBL1 and SBL2 may be formed on the first contacts 152. The first sub-interconnections SBL1 and the second sub-interconnections SBL2 may extend in the second direction. The sub-interconnections SBL1 and SBL2 may connect the vertical pillars PL1 and PL2 respectively coupled with immediately adjacent string selection lines SSL1 and SSL2 through the first contacts 152, in a one-to-one correspondence.

Returning to FIGS. 15A and 15B, the first sub-interconnections SBL1 and the second sub-interconnections SBL2 are connected to adjacent other bitlines through the second contacts 154. The first sub-interconnections SBL1 may be connected to the first bitline BL1, and the second sub-interconnections SBL2 may be connected to the second bitline BL2.

Figure 20:
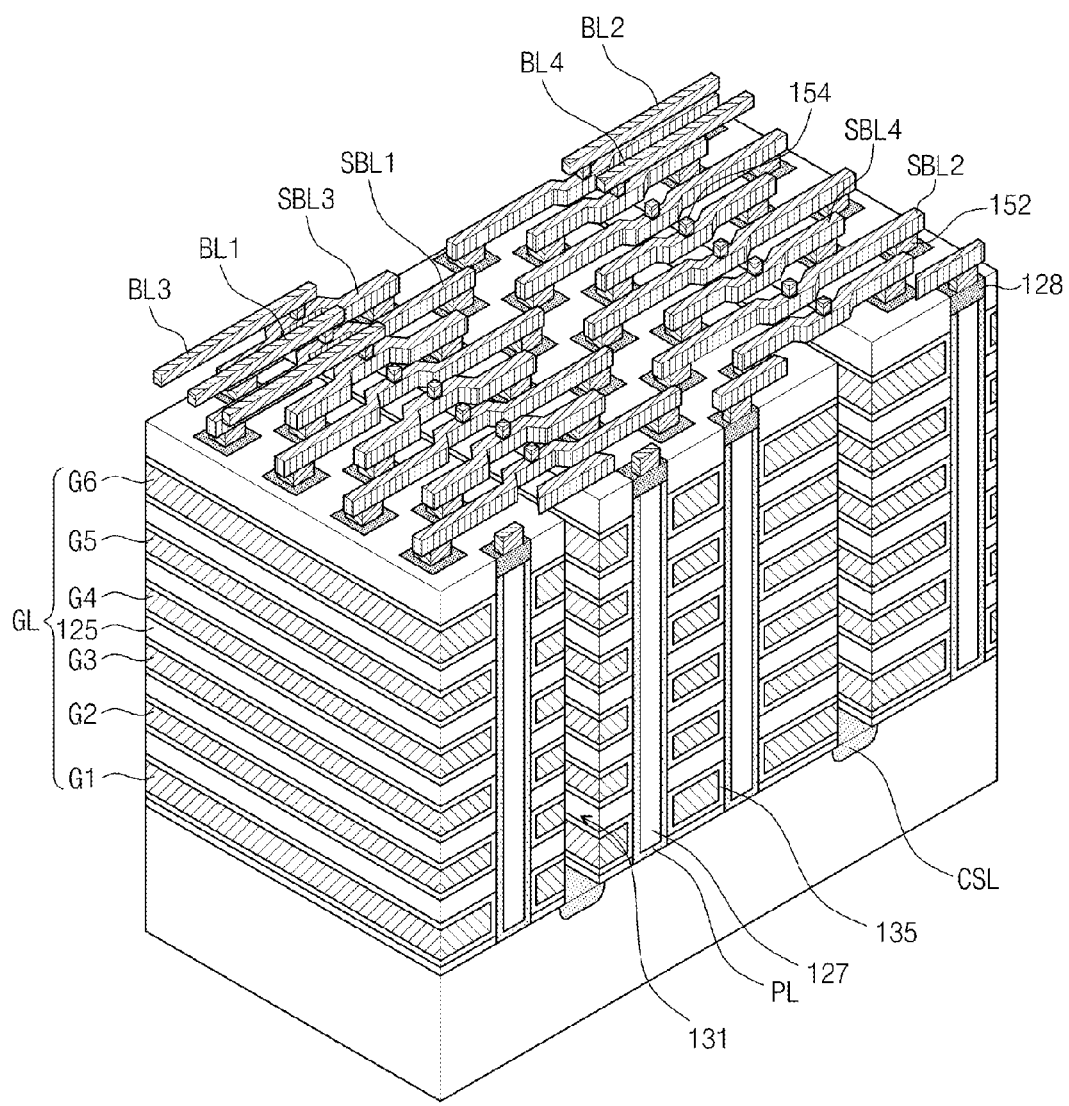
FIG. 20 is a perspective view of a memory block of a vertical type memory device according to third embodiments of the inventive concept.
Figure 21A:
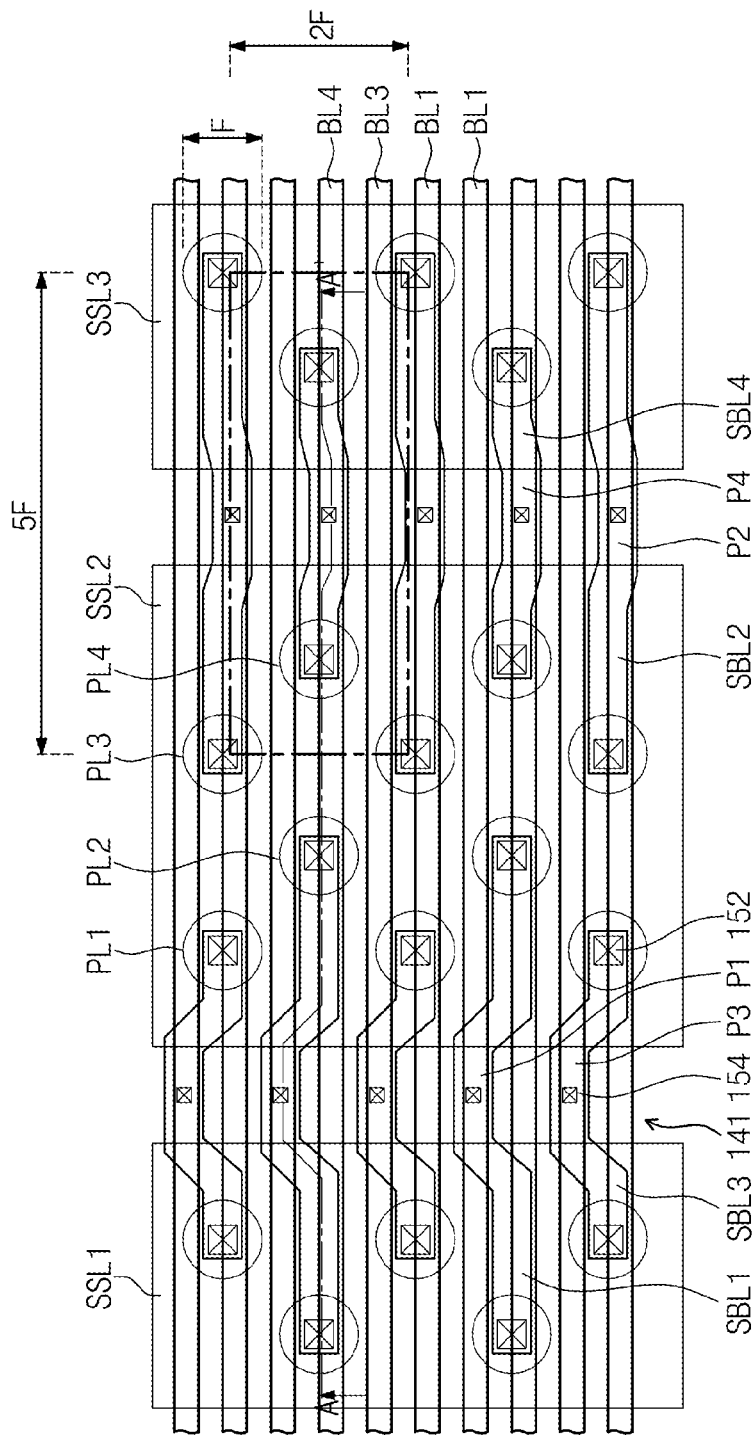
FIGS. 21A and 21C are top plan views of the vertical type memory device in FIG. 20.
Figure 21B:
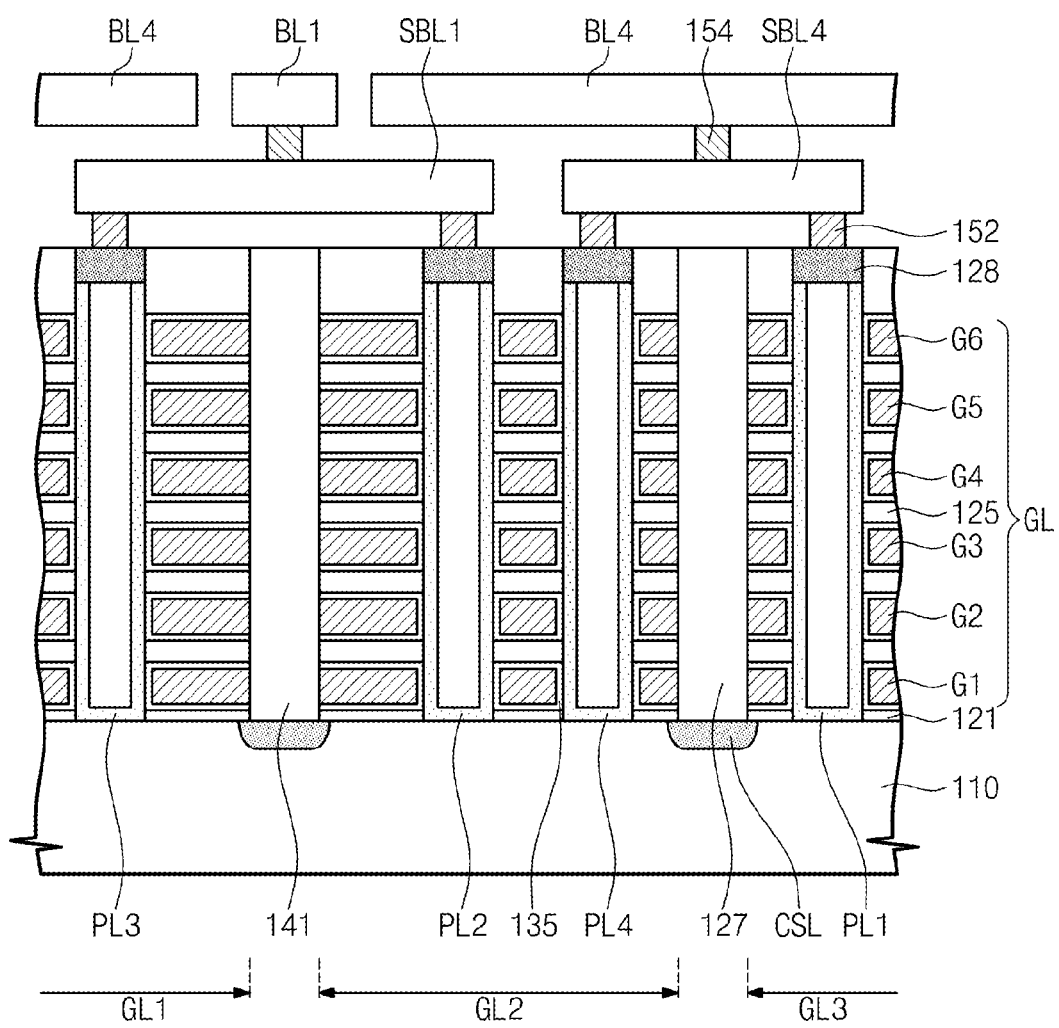
FIG. 21B is a cross-sectional view taken along the line A-A' in FIG. 21A.

FIG. 20 is a perspective view of a memory block of a vertical type memory device according to some embodiments of the inventive concept. FIG. 21A is a top plan view of the vertical type memory device in FIG. 20, and FIG. 21B is a cross-sectional view taken along the line A-A' in FIG. 21A. Technical features similar to the embodiment described with reference to FIG. 3 will not be explained, but differences therebetween will be explained in detail.

Referring to FIGS. 20, 21A, and 21B, gate structures GL may include adjacent first to third gate structures. A sixth gate electrode G6 of the first gate structure may be named a first string selection line SSL1, a sixth gate electrode G6 of the second gate structure may be named a second string selection line SSL2, and a sixth gate electrode G6 of the third gate structure may be named a third string selection line SSL3. The first to third string selection lines SSL1~SSL3 may be alternately arranged in a second direction.

Vertical pillars PL may include vertical pillars PL1~PL4 arranged in a zigzag manner. That is, the vertical pillars PL1~PL4 may be arranged offset from each other in both the first direction and the second direction. The first and fourth vertical pillars PL1 and PL4 may be disposed at either side of the string selection lines SSL1~SSL3, and the second and third vertical pillars PL2 and PL3 may be disposed between the first vertical pillars PL1 and the fourth vertical pillars PL4. The second vertical pillars PL2 may be shifted from the first vertical pillars PL1 in the first direction. The fourth vertical pillars PL4 may be shifted from the third vertical pillars PL3 in the first direction. Immediately adjacent vertical pillars may be spaced apart from each other in the first direction by two pitches of bitlines BL1~BL4.

Sub-interconnections may include first to fourth sub-interconnections SBL1~SBL4. The first sub-interconnections SBL1 may connect the third vertical pillars PL3 coupled to the first string selection line SSL1 to the second vertical pillars PL2 coupled to the second string selection line SSL2. The second sub-interconnections SBL2 may connect the third vertical pillars PL3 coupled to the second string selection line SSL2 to the second vertical pillars PL2 coupled to the third string selection line SSL3. The third sub-interconnections SBL3 may connect the fourth vertical pillars PL4 coupled to the first string selection line SSL1 to the first vertical pillars PL1 coupled to the second string selection line SSL2. The fourth sub-interconnections SBL4 may connect the fourth vertical pillars PL4 coupled to the second string selection line SSL2 to the first vertical pillars PL1 coupled to the third string selection line SSL3.

The first sub-interconnections SBL1 and the third sub-interconnections SBL3 may be alternately arranged in the first direction, and the second sub-interconnections SBL2 and the fourth sub-interconnections SBL4 may be alternately arranged in the first direction. The first sub-interconnections SBL1 and the fourth sub-interconnections SBL4 may be alternately arranged in the second direction, and the second sub-interconnections SBL2 and the third sub-interconnections SBL3 may be alternately arranged in the second direction.

The first to fourth sub-interconnections SBL1~SBL4 may be connected to corresponding bitlines. For example, the first sub-interconnections SBL1 may be connected to the first bitline BL1, the second sub-interconnections SBL2 may be connected to the second bitline BL2, the third sub-interconnections SBL3 may be connected to the third bitline BL3, and the fourth sub-interconnections SBL4 may be connected to the fourth bitline BL4.

First contacts 152 may be provided for connecting the vertical pillars PL1~PL4 to the sub-interconnections SBL1~SBL4. Second contacts 154 may be provided for connecting the sub-interconnections SBL1~SBL4 to the bitlines BL1~BL4. The first contacts 152 may be disposed on the vertical pillars PL1~PL4, and the second contacts 154 may be disposed on the first separation insulating layers 141. For example, the second contacts 154 on the first and third sub-interconnections SBL1 and SBL3 may be shifted from the first contacts 152 in the first direction by half the pitch of bitlines, and the second contacts 154 on the second and fourth sub-interconnections SBL2 and SBL4 may be shifted from the first contacts in a direction opposite to the first direction by a quarter pitch of bitlines. The first to fourth sub-interconnections SBL1~SBL4 may extend in the second direction. The first and third sub-interconnections SBL1 and SBL3 may include first to third protrusions P1 and P3 protruding in the first direction, respectively. The second and fourth sub-interconnections SBL2 and SBL4 may include second and fourth protrusions P2 and P4 protruding in a direction opposite to the first direction, respectively. A protrusion distance between the first and third protrusions P1 and P3 may be two times longer than that between the second and fourth protrusions P2 and P4. The second contacts 154 may be disposed on the protrusions P1~P4. The protrusions P1~P4 may extend onto first separation insulating layers 141 between gate structures.

Figure 21C:
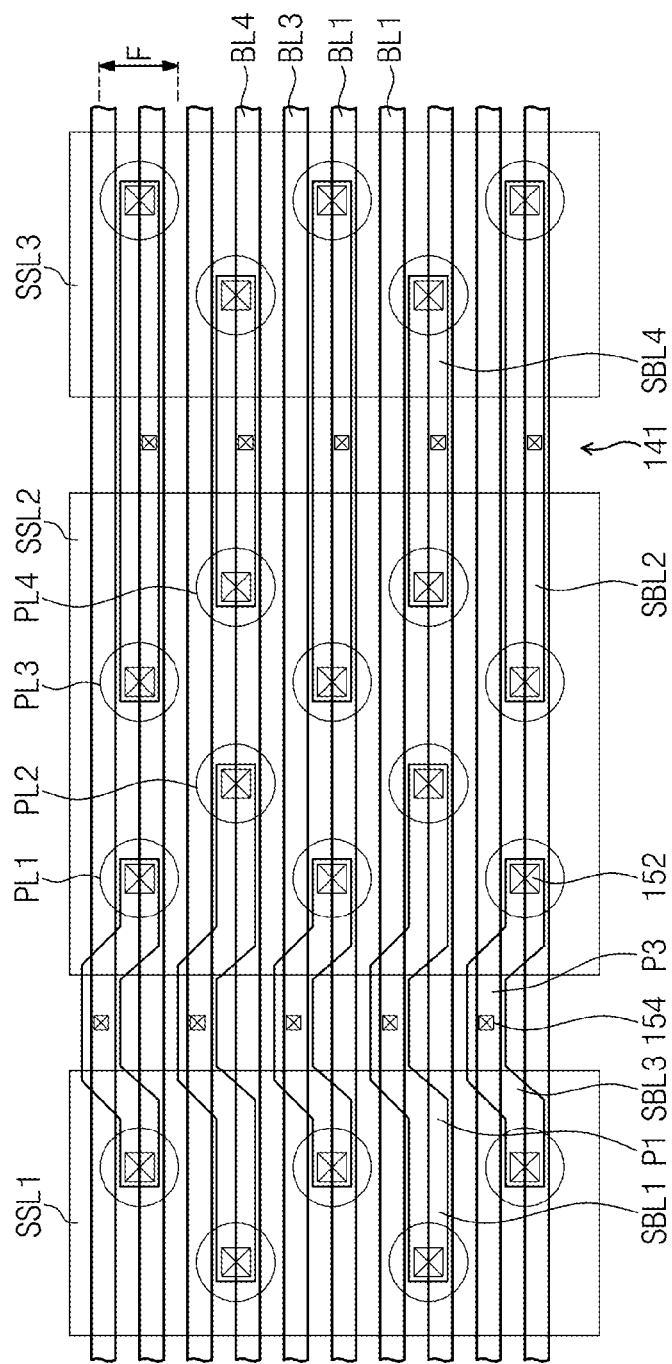

FIG. 21C illustrates a modified example of FIG. 21A. With reference to FIG. 21C, a modified example of a vertical type memory device according to some other embodiments of the inventive concept will now be described more fully. Technical features similar to those explained in FIGS. 21A and 21B will not be explained, but differences therebetween will be explained in detail.

First and third sub-interconnections SBL1 and SBL3 may extend in a second direction and may include protrusions P1 and P3 protruding in a first direction. Second and fourth sub-interconnections SBL2 and SBL4 may have substantially rectangular shapes that extend in the second direction. Second contacts 154 on the first and third sub-interconnections SBL1 and SBL3 may be shifted from first contacts 152 in the first direction, and second contacts 154 on the second and fourth sub-interconnections SBL2 and SBL4 may not be shifted from the first contacts 152. For example, the second contacts on the first and third sub-interconnections SBL1 and SBL3 may be shifted from the first contacts 152 in the first direction by one pitch of the bitlines BL1~BL4. As shown in FIG. 21C, the sub-interconnections SBL1~SBL4 may be transformed into various shapes.

Referring back to FIG. 21A, an effective area with respect to a single channel is reduced to $3.3F^2$ ($2F \times 5F/3$ channel) according to some embodiments of the inventive concept. Likewise, a unit cell area can be reduced to increase integration density. Furthermore, the number of bitlines selected by one string selection gate, i.e., a page size may increase four times, as compared to the conventional VNAND. Thus, program and read speeds can be improved.

The vertical type memory device according to some embodiments of the inventive concept shown in FIG. 20 may be formed by the method described with reference to FIGS. 6A to 12B. Moreover, the vertical type memory device according to some embodiments of the inventive concept shown in FIG. 20 may be modified using the inventive concepts described with reference to FIGS. 14, 15A, and 15B, such that a sixth gate electrode G6 of one gate structure GL includes first and second string channel lines SSL1 and SSL2. An effective area with respect to a single channel may be reduced less than $3.3F^2$ ($2F \times 5F/3$ channel).

Figure 22:
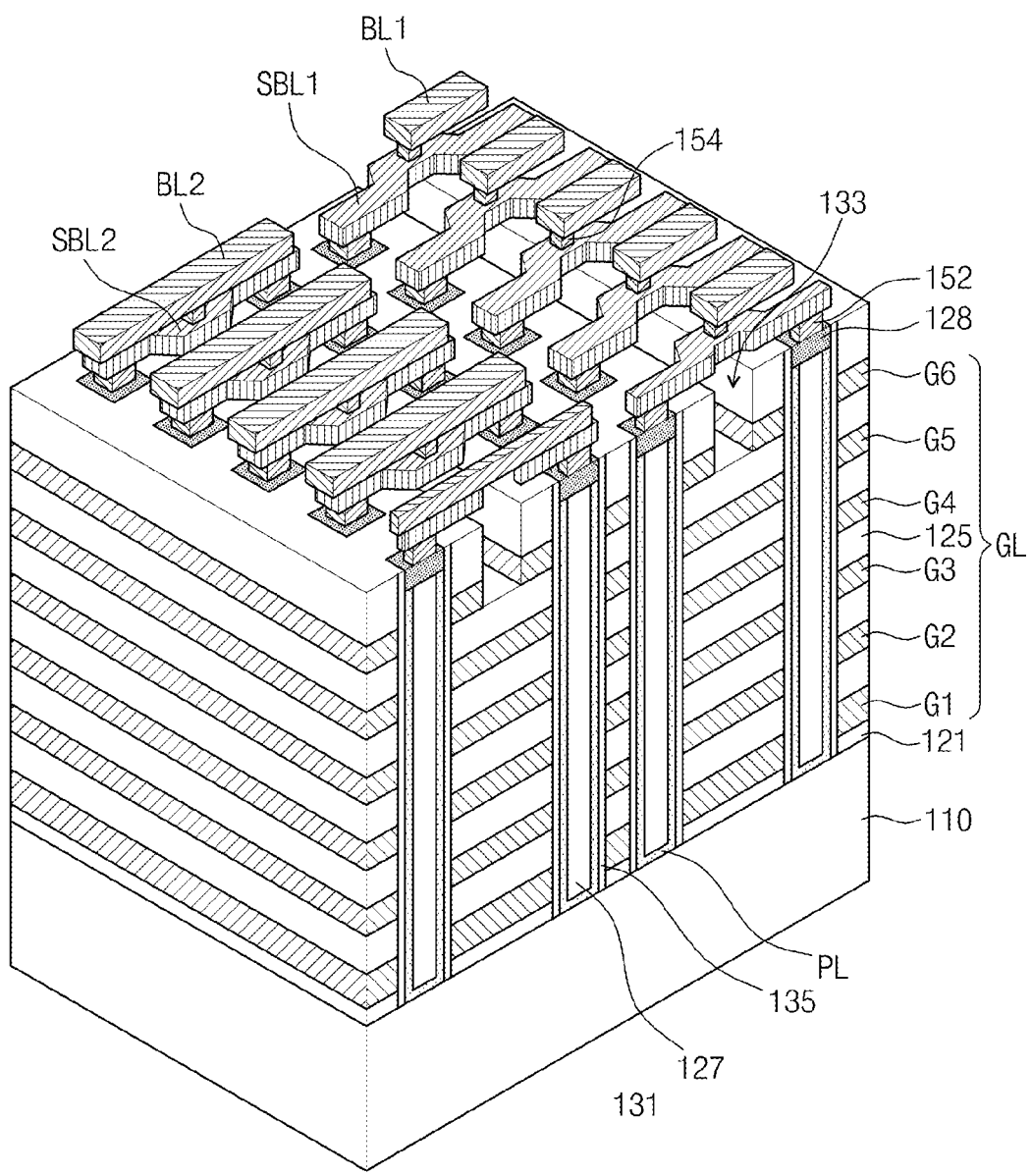
FIG. 22 is a perspective view of a memory block of a vertical type memory device according to fourth embodiments of the inventive concept.
Figure 23A:
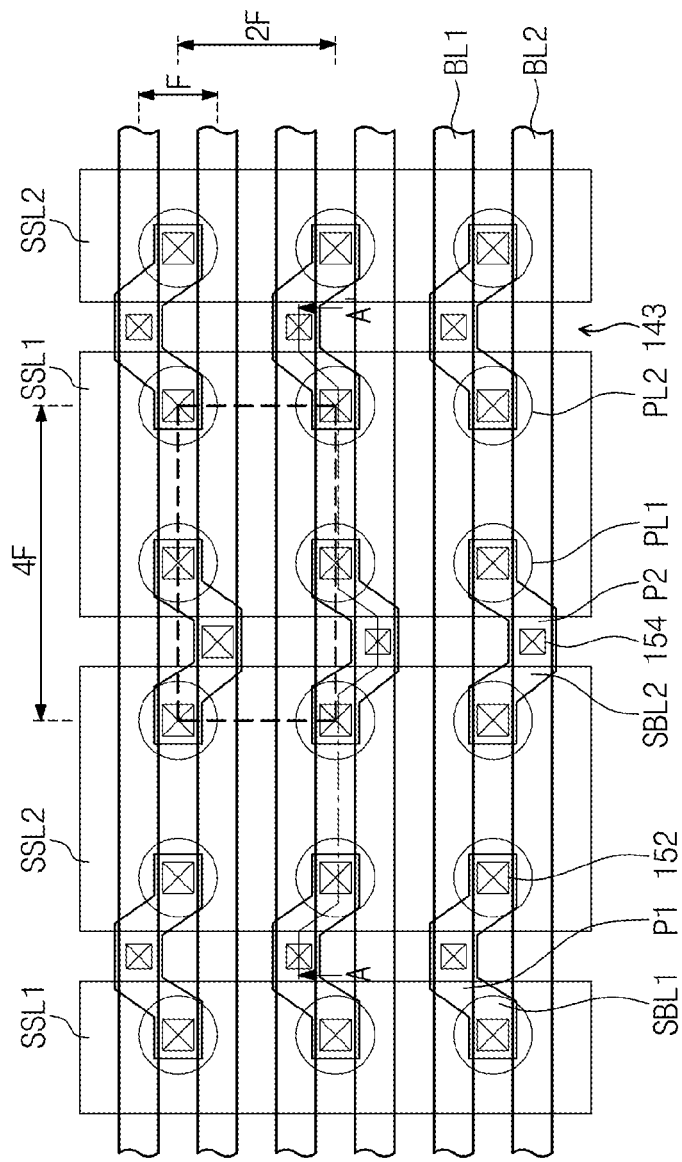
FIG. 23A is a top plan view of the vertical type memory device in FIG. 22.
Figure 23B:
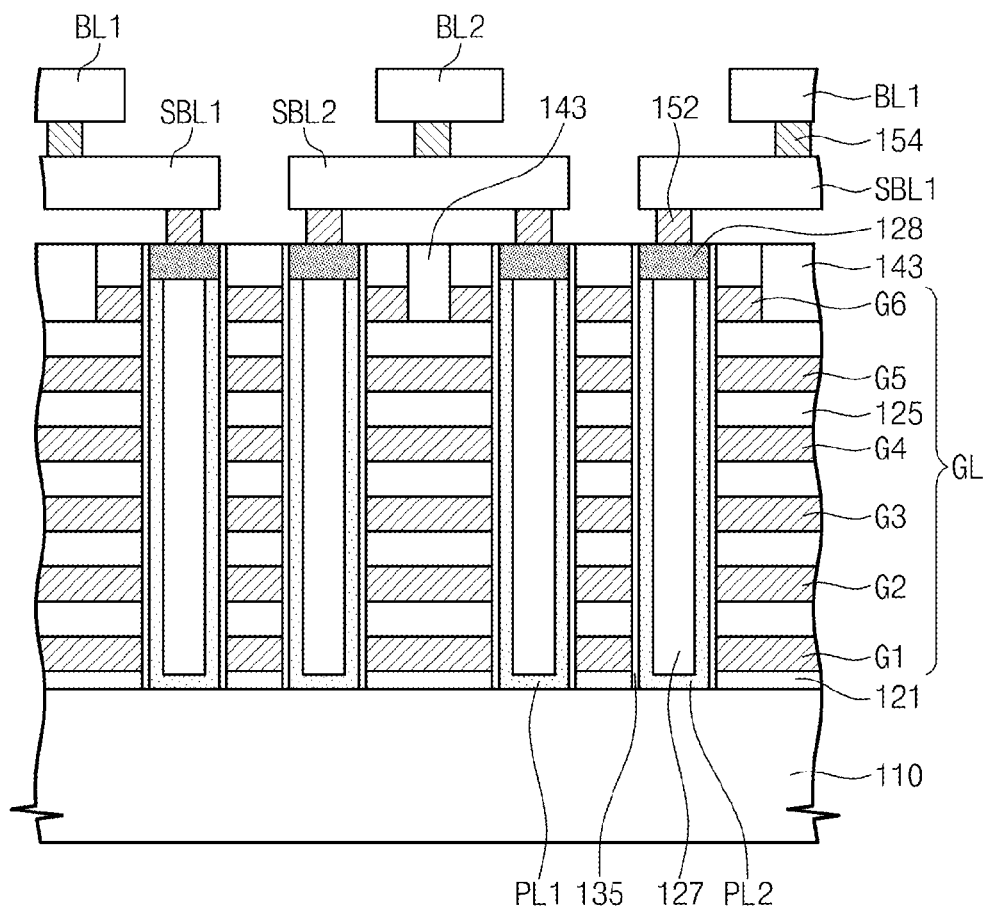
FIG. 23B is a cross-sectional view taken along the line A-A' in FIG. 23A.

FIG. 22 is a perspective view of a memory block of a vertical type memory device according to some embodiments of the inventive concept. FIG. 23A is a top plan view of a portion of the vertical type memory device in FIG. 22, and FIG. 23B is a cross-sectional view taken along line A-A' in FIG. 23A. Technical features similar to the embodiment described with reference to FIG. 3 will not be explained, but differences therebetween will be explained in detail.

Referring to FIGS. 22, 23A, and 23B, a substrate 110 is provided. The substrate 110 may have a first conductivity type, e.g., P-type. A gate structure GL is provided on the substrate 110. The gate structure GL may include insulating patterns 125 and gate electrodes spaced apart from each other with the insulating patterns 125 interposed therebetween. Gate electrodes may include first to sixth gate electrodes G1~G6 that are sequentially stacked on the substrate 110. The insulating patterns 125 may include silicon oxide. The gate electrodes G1~G6 may include doped silicon, a metal (e.g., tungsten), metal nitride, metal silicide or combinations thereof. Although sixth gate electrodes shown in the figures, the number of the gate electrodes is not limited to six and may be greater or fewer than six.

Vertical pillars PL are arranged in first and second directions, forming a matrix of vertical pillars PL. The vertical pillars PL are connected to the substrate 110, passing through the gate electrodes G1~G6. The vertical pillars PL may have major axes extending upwardly (i.e., a third direction) from the substrate 110. Some ends of the vertical pillars PL may be connected to the substrate 110, and the other ends thereof may be connected to bitlines BL1 and BL2, which extend in the second direction.

Sub-interconnections SBL1 and SBL2 are located between the vertical pillars PL and the bitlines BL1 and BL2. The vertical pillars PL and the sub-interconnections SBL1 and SBL2 may be connected through first contacts 152. The bitlines BL1 and BL2 and the sub-interconnections SBL1 and SBL2 may be connected through second contacts 154. The sub-interconnections SBL1 and SBL2 may connect the vertical pillars PL coupled with immediately adjacent gate structures GL, through the first contacts 152.

A plurality of cell strings of a flash memory device are provided between the bitlines BL1 and BL2 and the substrate 110. A single cell string may include a string selection transistor connected to the bitlines BL1 and BL2, a ground selection transistor connected to the substrate 110, and a plurality of memory cells provided between the string selection transistor and the ground selection transistor. The selection transistors and the plurality of memory cells may be provided at a single semiconductor pillar PL. A first gate electrode G1 may be a ground selection gate line GSL of the ground selection transistor. Second to fifth gate electrodes G2~G5 may be cell gates WL of the plurality of memory cells. A sixth gate electrode G6 may be separated into plurality by a third separation region 133 (FIG. 21) to function as sting selection lines of the string selection transistor. The string selection lines may include first and second string selection lines SSL1 and SSL2. The first and second string selection lines SSL1 and SSL2 may extend in the first direction and may be alternately arranged in the second direction. Third separation insulating layers 143 are provided in the third separation region 133 between the first and second string selection lines SSL1 and SSL2 as shown in FIG. 23B, for example.

An information storage element 135 may be provided between the first to sixth gate electrodes G1~G6 and the vertical pillars PL. The information storage element 135 may extend between the gate electrodes G1~G6 and the insulating patterns 125. The information storage element 135 may include a blocking insulating layer, a charge storage layer, and a tunnel insulating layer.

The substrate 110 may be provided with a source region (not shown) forming a path of current flowing from the bitlines BL1 and BL2 or a path of current flowing to the bitlines BL1 and BL2.

Since the vertical pillars PL1 and PL2 and the sub-interconnections SBL1 and SBL2 are similar to those explained with reference to FIG. 3, similar technical features will not be explained in further detail. Protrusions P1 and P2 of the sub-interconnections SBL1 and SBL2 may extend over the third separation insulating layer 143. The second contacts 154 may be disposed on the sub-interconnections SBL1 and SBL2 over the third separation insulating layer 143.

As shown in FIGS. 5C and 5D, the sub-interconnections SBL1 and SBL2 may have various shapes.

Referring to FIG. 23A, an effective area of a single channel is reduced to $4F^2$ ($2F \times 4F/2$ channel) according to some embodiments of the inventive concept. Likewise, a unit cell area can be reduced to increase integration density. Furthermore, the number of bitlines selected by one string selection gate, i.e., a page size may be doubled, as compared to the conventional VNAND. Thus, program and read speeds can be improved.

A method of fabricating the vertical type memory device in FIG. 22 will now be described in detail. FIGS. 24A to 26A are top plan views corresponding to FIGS. 23A, and FIGS. 24B to 26B are cross-sectional views corresponding to FIG. 23B.

Figure 24A:
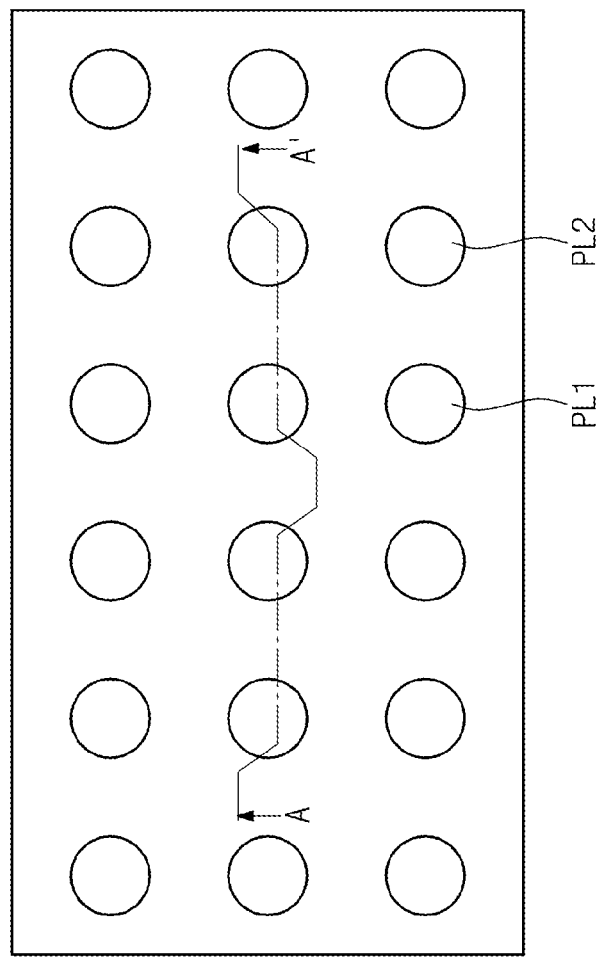
FIGS. 24A to 26A are top plan views corresponding to FIG. 23A, and FIGS. 24B to 26B are cross-sectional views corresponding to FIG. 23B.
Figure 24B:
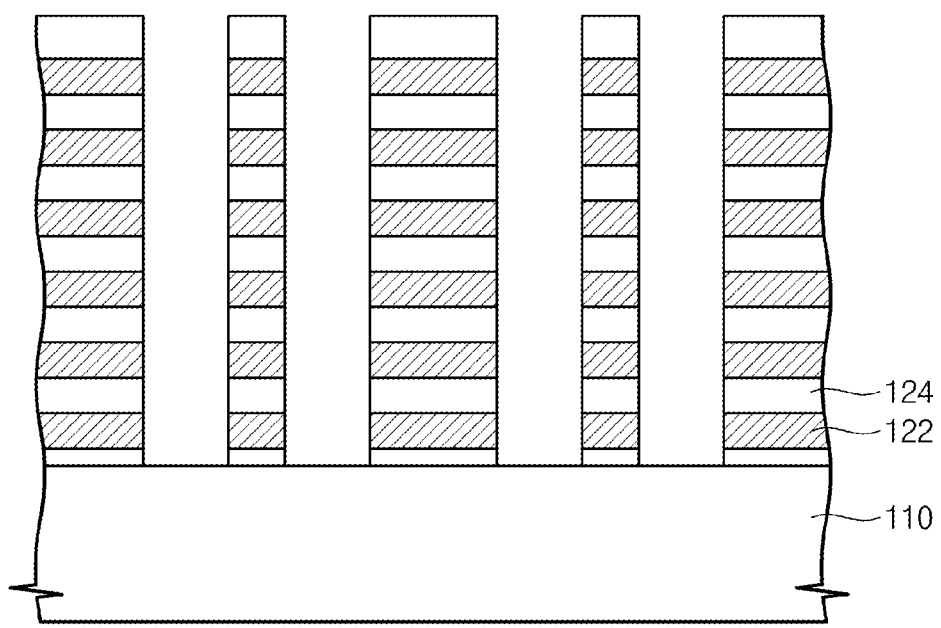

Referring to FIGS. 24A and 24B, a substrate 110 is provided. The substrate 110 may have a first conductivity type, e.g., P-type. Insulating layers 124 and conductive layers 122 are alternately formed on the substrate 110. The insulating layers 124 may include, for example, silicon oxide. The conductive layers 122 may include, for example, doped silicon, a metal (e.g., tungsten), metal nitride, metal silicide or combinations thereof.

Vertical holes 126 are formed to penetrate the conductive layers 122 and the insulating layers 124 to expose the substrate 110. The vertical holes 126 may be disposed in the same manner as the vertical pillars PL1 and PL2 explained with reference to FIG. 23A.

Figure 25A:
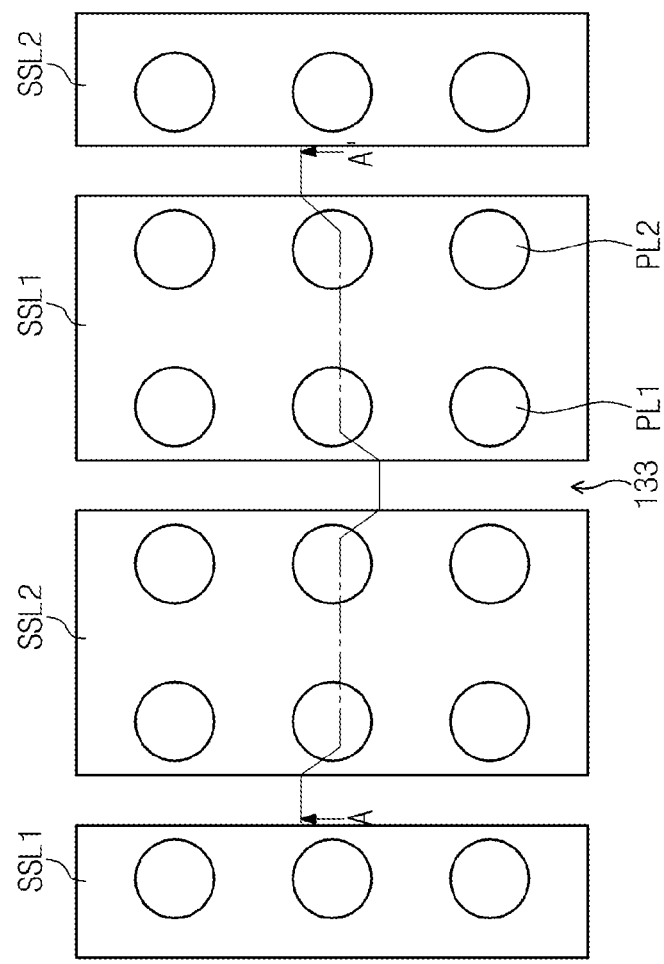
Figure 25B:
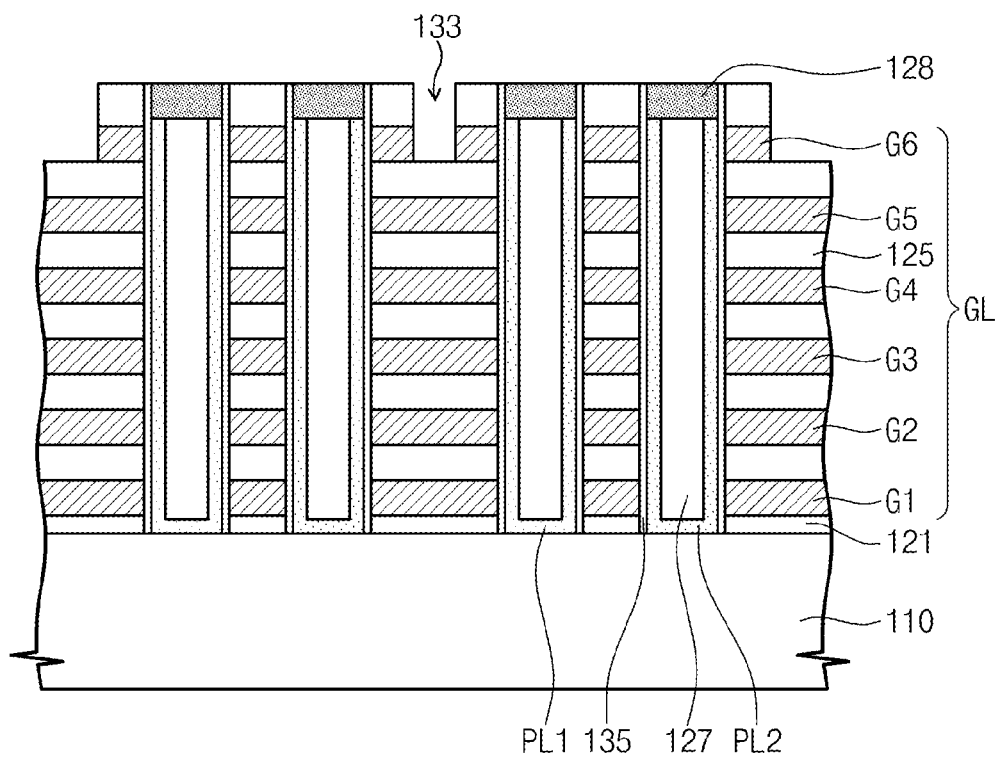

Referring to FIGS. 25A and 25B, an information storage element 135 is formed on sidewalls of the vertical holes 126. The information storage element 135 may include a blocking insulating layer, a charge storage layer, and a tunnel insulating layer. The information storage element 135 is anisotropically etched to expose the substrate 110.

Vertical pillars PL1 and PL2 are formed adjacent to the information storage element 135 in the vertical holes 126. The vertical pillars PL1 and PL2 are connected to the substrate 110.

In one aspect, the vertical pillars PL1 and PL2 may be semiconductor layers of a first conductivity type. The semiconductor layer may be formed not to fill up the vertical holes 126, and an insulating material may be formed on the semiconductor layer to fill up the vertical holes 126. The semiconductor layer and the insulating material may be planarized to expose an uppermost insulating layer 124'. Thus, cylindrical vertical pillars PL1 and PL2 filled with a filling-insulating layer 127 may be formed. The semiconductor layer may be formed to fill the vertical holes 126. In this case, the filling insulating layer may not be required. Upper portions of the vertical pillars PL1 and PL2 may be recessed to be lower than a top surface of the uppermost insulating layer 124'. Conductive patterns 128 may be formed in portions of the vertical holes 126 where the vertical pillars PL1 and PL2 are recessed. The conductive patterns 128 may be doped polysilicon or a metal. Drain regions may be formed by introducing impurities of second conductivity type into the conductive patterns 128 and upper portions of the vertical pillars PL1 and PL2. The second conductivity type may be N-type.

In another aspect, the vertical pillars PL1 and PL2 may include at least one of conductive materials, e.g., a doped semiconductor, a metal, conductive metal nitride, silicide or nanostructures (such as carbon nanotube or grapheme). In this case, the information storage element may be a variable resistance pattern.

The insulating layers 124 and the conductive layers 122 may be patterned to form insulating patterns 125 and gate electrodes G1~G6. A sixth gate electrode G6 may be additionally patterned to be separated into multiple gate electrodes. Thus, the sixth gate G6 may include first and second string selection lines SSL1 and SSL2.

Figure 26A:
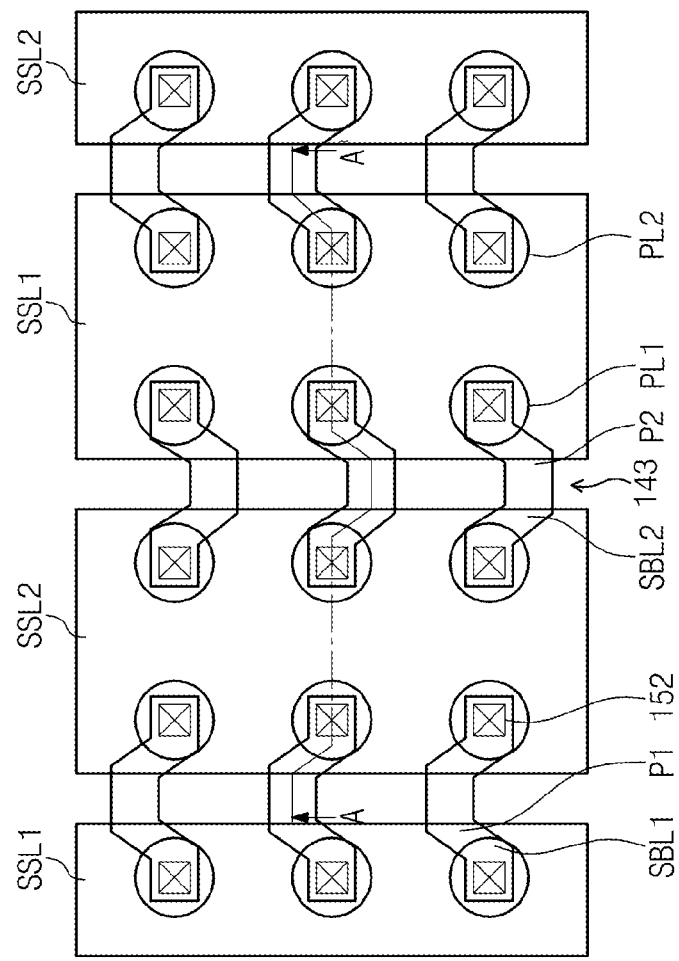
Figure 26B:
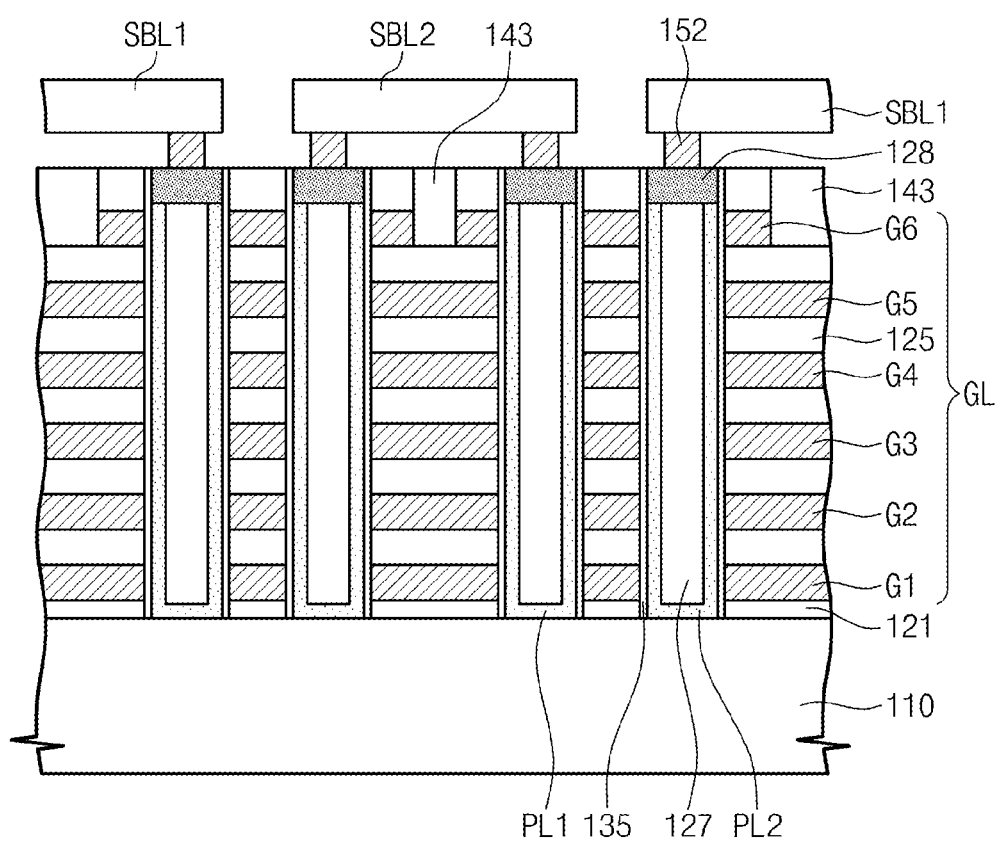

Referring to FIGS. 26A and 26B, third separation insulating layers 143 are provided in the third separation region 133 between the first and second string selection lines SSL1 and SSL2. The first contacts 152 may be formed on the vertical pillars PL1 and PL2. Sub-interconnections SBL1 and SBL2 may be formed on the first contacts 152. The sub-interconnections SBL1 and SBL2 may interconnect the vertical pillars PL1 with immediately adjacent vertical pillars PL2 associated with different string selection lines SSL1 and SSL2 through the first contacts 152.

First sub-interconnections SBL1 and second sub-interconnections SBL2 may extend in a second direction. The first sub-interconnections SBL1 may include first protrusions P1 protruding in a first direction, and the second sub-interconnections SBL2 may include second protrusions P2 protruding in a direction opposite to the first direction. The protrusions P1 and P2 may extend onto the third separation insulating layers 143.

Referring back to FIGS. 23A and 23B, the first sub-interconnections SBL1 and the second sub-interconnections SBL2 are connected to different adjacent bitlines through the second contacts 154. That is, the first sub-interconnections SBL1 may be connected to the first bitline BL1, and the second sub-interconnections SBL2 may be connected to the second bitline BL2.

Figure 27:
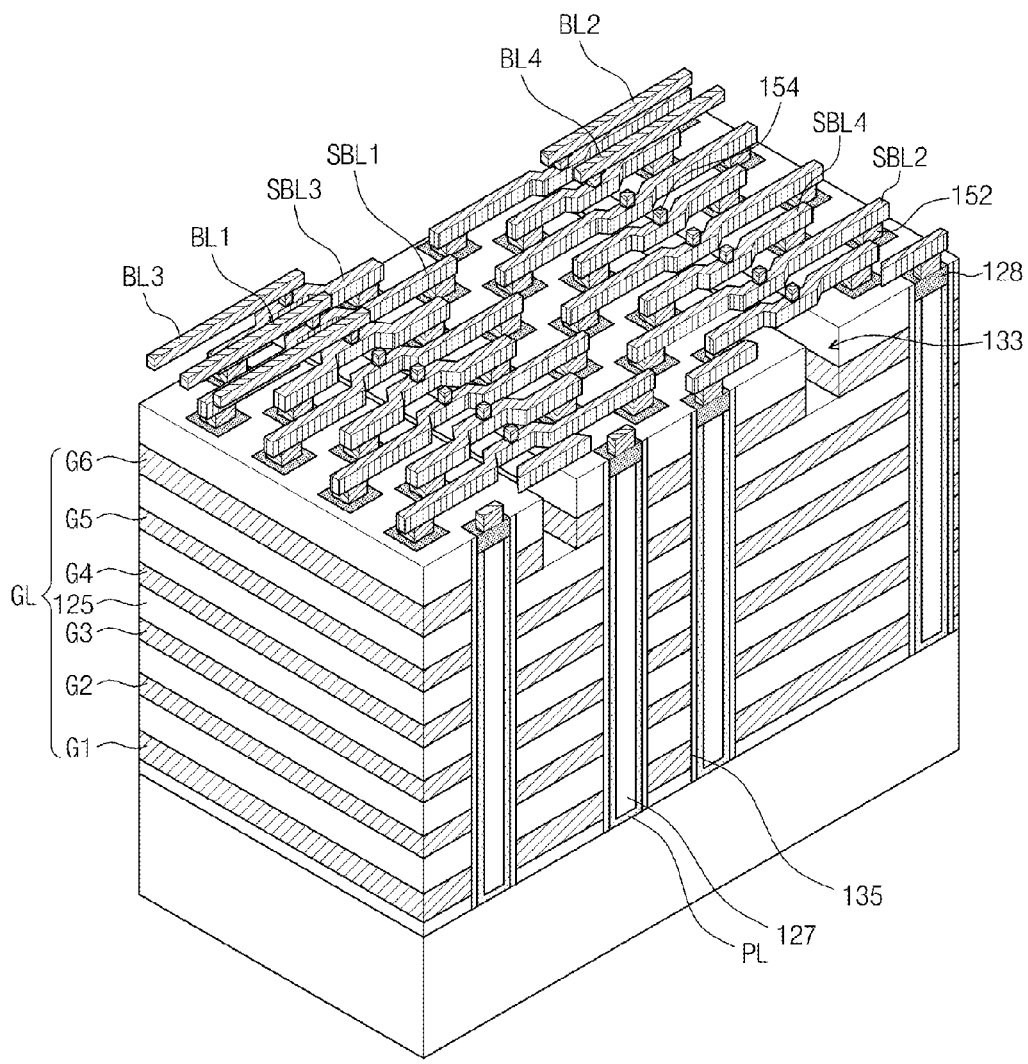
FIG. 27 is a perspective view of a memory block of a vertical type memory device according to fifth embodiments of the inventive concept.
Figure 28A:
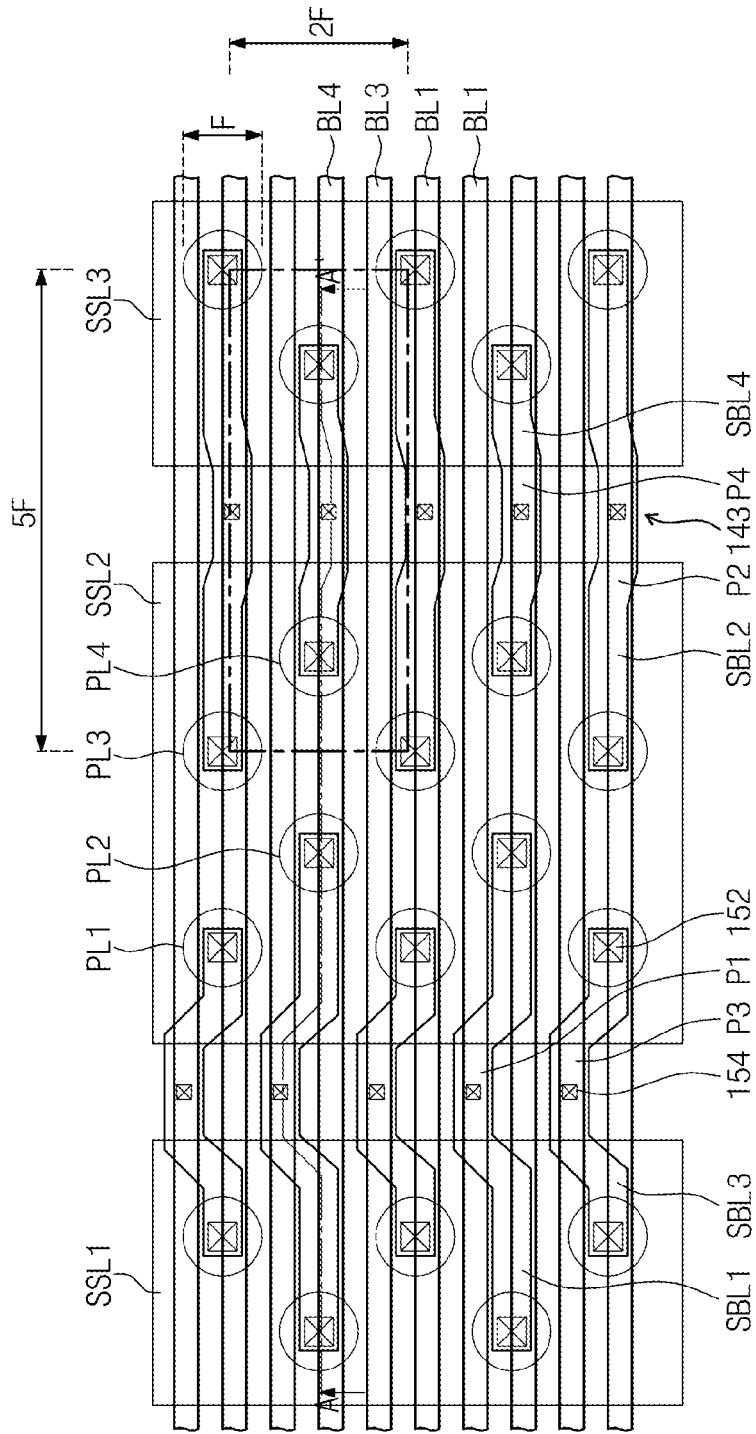
FIG. 28A is a top plan view of the vertical type memory device in FIG. 27.
Figure 28B:
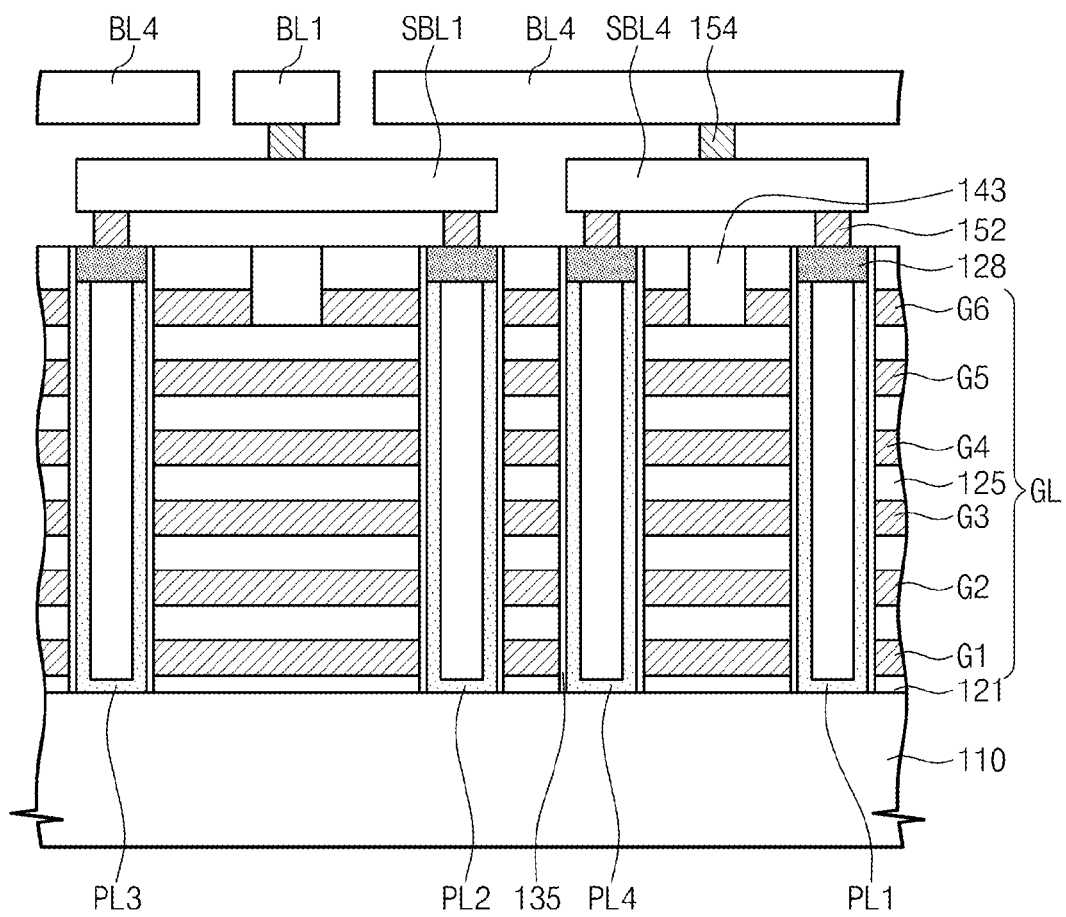
FIG. 28B is a cross-sectional view taken along the line A-A' in FIG. 28A.

FIG. 27 is a perspective view of a vertical type memory device according to some embodiments of the inventive concept. FIG. 28A is a top plan view of the vertical type memory device in FIG. 27, and FIG. 28B is a cross-sectional view taken along line A-A' in FIG. 28A. Technical features similar to those of one embodiment explained with reference to FIG. 22 will not be explained, but differences therebetween will be explained in detail.

Referring to FIGS. 27, 28A, and 28B, vertical pillars PL may include first to fourth vertical pillars PL1~PL4 that are sequentially arranged in a zigzag manner. The first and second vertical pillars PL1 and PL2 may be coupled with each other at one side of string selection lines SSL1~SSL3, and the third and fourth vertical pillars PL3 and PL4 may be coupled with each other at the other side thereof. The first and fourth vertical pillars PL1 and PL4 may be disposed at the edge of the string selection lines SSL1~SSL3, and the second and third vertical pillars PL2 and PL3 may be disposed between the first vertical pillars PL1 and the fourth vertical pillars PL4. The second vertical pillars PL2 may be shifted from the first vertical pillars PL1 in a first direction. The fourth vertical pillars PL4 may be shifted from the third vertical pillars PL3 in the first direction. Immediately adjacent vertical pillars may be spaced apart from each other in the first direction by, for example, two pitches of bitlines BL1~BL4.

Sub-interconnections may include first to fourth sub-interconnections SBL1~SBL4. The first sub-interconnections SBL1 may connect the third vertical pillars PL3 of the first string selection lines SSL1 to the second vertical pillars PL2 of the second string selection line SSL2. The second sub-interconnections SBL2 may connect the third vertical pillars PL3 of the second string selection lines SSL2 to the second vertical pillars PL2 of the third string selection line SSL3. The third sub-interconnections SBL3 may connect the fourth vertical pillars PL4 of the first string selection lines SSL1 to the first vertical pillars PL1 of the second string selection line SSL2. The fourth sub-interconnections SBL4 may connect the fourth vertical pillars PL4 of the second string selection lines SSL2 to the first vertical pillars PL1 of the third string selection line SSL3. The first sub-interconnections SBL1 and the third sub-interconnections SBL3 may be alternately arranged in the first direction, and the second sub-interconnections SBL2, and the second sub-interconnections SBL2 and the fourth sub-interconnections SBL4 may be alternately arranged in the first direction. The first and fourth sub-interconnections SBL1 and SBL4 may be alternately arranged in the second direction, and the second and third sub-interconnections SBL2 and SBL3 may be alternately arranged in the second direction. The first to fourth sub-interconnections SBL1~SBL4 may be connected to adjacent other bitlines. For example, the first sub-interconnections SBL1 may be connected to the first bitline BL1, the second sub-interconnections SBL2 may be connected to the second bitline BL2, the third sub-interconnections SBL3 may be connected to the third bitline BL3, and the fourth sub-interconnections SBL4 may be connected to the fourth bitline BL4.

First contacts 152 connect the vertical pillars PL1~PL4 to the sub-interconnections SBL1~SBL4. Second contacts 154 connect the sub-interconnections SBL1~SBL4 to the bitlines BL1~BL4. The first contacts 152 may be disposed on the vertical pillars PL1~PL4, and the second contacts 154 may be disposed on or vertically aligned with the third separation insulating layers 143. For example, the second contacts 154 on the first and third sub-interconnections SBL1 and SBL3 may be shifted from the first contacts 152 in the first direction by half the pitch of bitlines, and the second contacts 154 on the second and fourth sub-interconnections SBL2 and SBL4 may be shifted from the first contacts in a direction opposite to the first direction by a quarter pitch of bitlines. The first to fourth sub-interconnections SBL1~SBL4 may extend in the second direction. The first and third sub-interconnections SBL1 and SBL3 may include first to third protrusions P1 and P3 protruding in the first direction, respectively. The second and fourth sub-interconnections SBL2 and SBL4 may include second and fourth protrusions P2 and P4 protruding in a direction opposite to the first direction, respectively. For example, a protrusion distance of the first and third protrusions P1 and P3 may be two times longer than that of the second and fourth protrusions P2 and P4. That is, the protrusion distance of the first and third protrusions P1 and P3 may be larger to reach a corresponding bitline. The second contacts 154 may be disposed on the protrusions P1~P4. The protrusions P1~P4 may extend over first separation insulating layers 141 between gate structures.

Referring to FIG. 28, an effective area to a single channel is reduced less than $3.3F^2$ ($2F \times 5F/3$ channel) in the fifth embodiments of the inventive concept. Likewise, a unit cell area can be reduced to increase integration density. Furthermore, the number of bitlines selected by one string selection gate, i.e., a page size may increase four times, due to the arrangement of the vertical pillars PL. Thus, program and read speeds can be improved.

Figure 29:
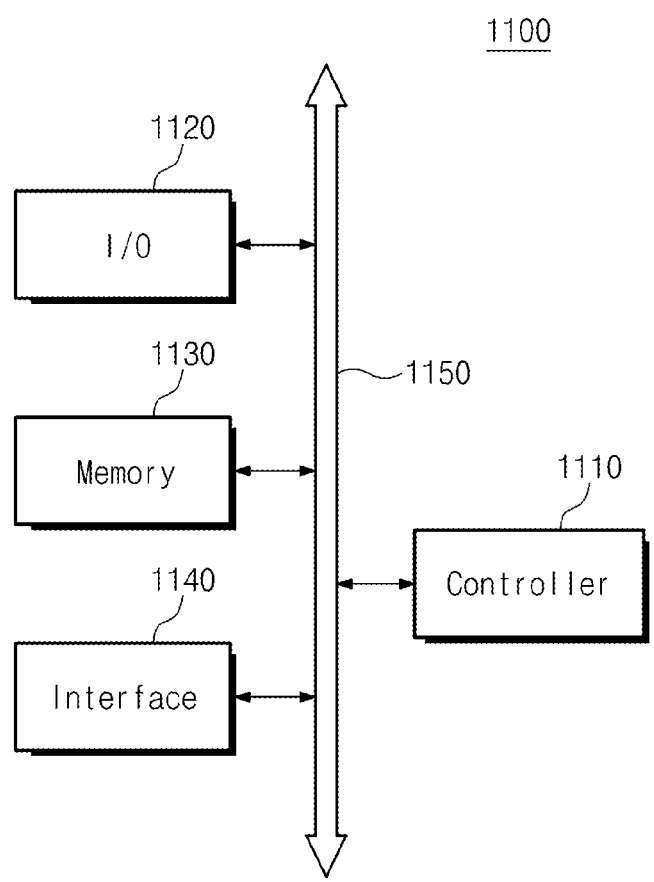
FIG. 29 is a schematic block diagram illustrating an example of a memory system including a semiconductor device fabricated according to embodiments of the inventive concept.

FIG. 29 is a schematic block diagram illustrating an example of a memory system including a semiconductor device formed according to embodiments of the inventive concept.

Referring to FIG. 29, an electronic system 1100 may include a controller 1110, an input/output device (I/O) 1120, a memory device 1130, an interface 1140, and a bus 1150. The controller 1110, the input/output device 1120, the memory device 1130, and/or the interface 1140 may be connected to each other through the bus 1150. The bus 1150 corresponds to a path along which data are transferred. The memory device 1130 may include a semiconductor device according to embodiments of the inventive concept.

The controller 1110 may include at least one of a microprocessor, a digital signal processor, a microcontroller, and logic devices which are capable of performing similar functions thereto. The input/output device 1120 may include a keypad, a keyboard, a display device or the like. The memory device 1130 may store data and/or commands. The interface 1140 may function to transfer data to a communication network or receive data from the communication network. The interface 1140 may be a wired interface or a wireless interface. For example, the interface 1140 may include an antenna or a wired/wireless transceiver. Although not shown, the electronic system 1100 may further include a high-speed DRAM device and/or an SRAM device as an operation memory device for improving the operation of the controller 1110.

The electronic system 1110 may be applied to personal digital assistants (PDAs), portable computers, web tablets, wireless phones, mobile phones, digital music players, memory cards or all electronic devices capable of transmitting and/or receiving data in wireless environments.

Figure 30:
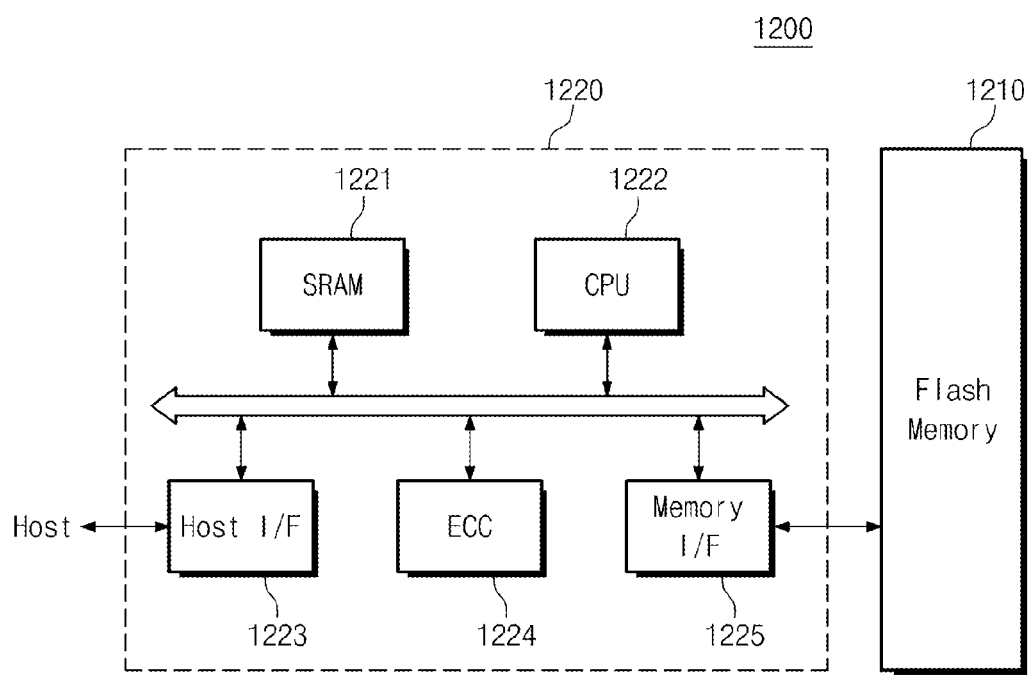
FIG. 30 is a schematic block diagram illustrating an example of a memory card including a semiconductor device fabricated according to embodiments of the inventive concept.

FIG. 30 is a schematic block diagram illustrating an example of a memory card including a semiconductor device formed according to embodiments of the inventive concept.

Referring to FIG. 30, a memory card 1200 includes a memory device 1210. The memory device 1210 may include at least of the semiconductor devices disclosed in the foregoing embodiments. In addition, the memory device 1210 may further include another type of semiconductor memory device (e.g., DRAM device and/or SRAM device, etc.). The memory card 1200 may include a memory controller 1220 controlling data exchange between a host and the memory device 1210. The memory device 1210 and/or the controller 1220 may include a semiconductor device according to embodiments of the inventive concept.

The memory controller 1220 may include a processing unit 1222 controlling the overall operation of a memory card. The memory controller 1220 may include an SRAM 1221 used as a working memory of the processing unit 1222. In addition, the memory controller 1220 may further include a host interface 1223 and a memory interface 1225. The host interface 1223 may include a data exchange protocol between the memory card 1200 and the host. The memory interface 1225 may connect the memory controller 1220 to the memory device 1210. Moreover, the memory controller 1220 may further include an error code correction (ECC) block 1224. The ECC block 1224 may detect and correct errors of data read from the memory device 1210. Although not shown, the memory card 1200 may further include a ROM device storing code data for interfacing with the host. The memory card 1200 may be used as a portable data storage card. Alternatively, the memory card 1200 may be implemented with a solid-state disk (SSD) that may replace a hard disk of a computer system.

Figure 31:
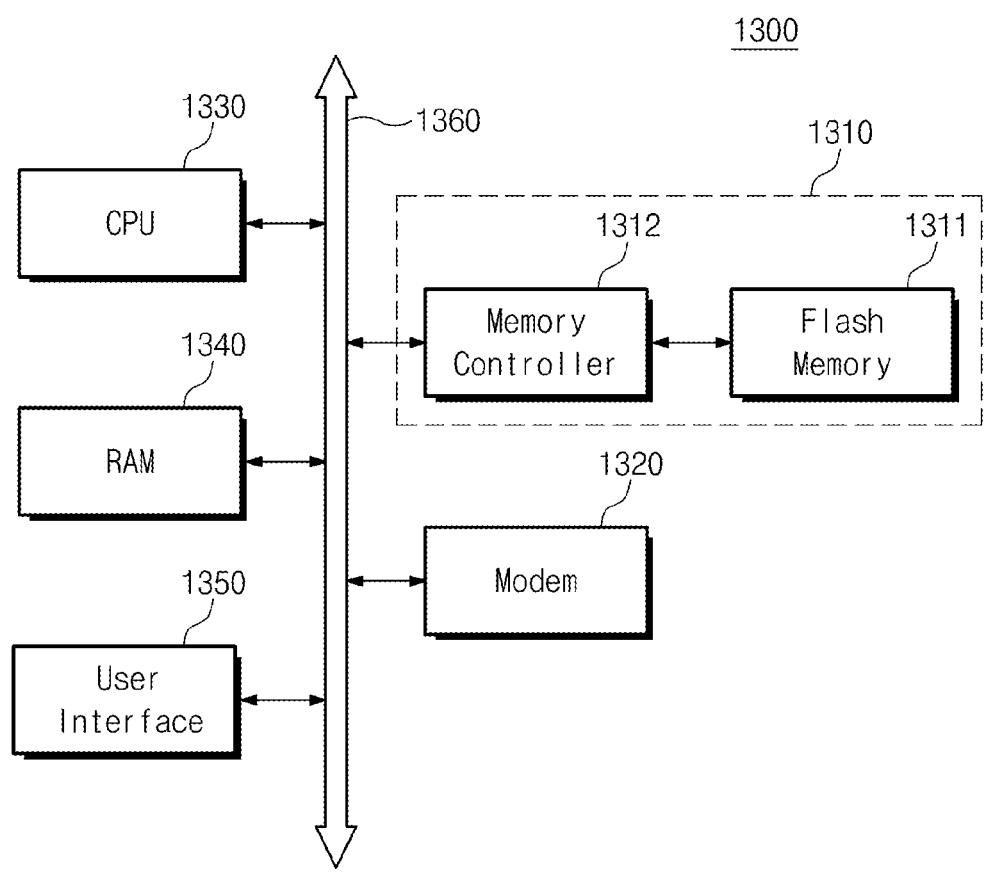
FIG. 31 is a schematic block diagram illustrating an example of an information processing system on which a semiconductor device according to embodiments of the inventive concept is mounted.

FIG. 31 is a schematic block diagram illustrating an example of an information processing system on which a semiconductor device formed according to embodiments of the inventive concept is mounted.

Referring to FIG. 31, a flash memory system 1310 according to embodiments of the inventive concept is mounted on an information processing system such as a mobile device or a desktop computer. An information processing system 1300 according to embodiments of the inventive concept includes a flash memory system 1310 and a modem 1320, a central processing unit (CPU) 1330, a RAM 1340, and a user interface 1350 that are electrically connected to a system bus 1360. The flash memory system 1310 may have the substantially same configuration as the above-mentioned memory system. Data processed by the CPU 1330 or externally input data is stored in the flash memory system 1310. With an increase in reliability, the flash memory system 1310 may reduce resources needed for error correction such that a high-speed data exchange function may be provided to the information processing system 1300. Although not shown in the drawing, it would be apparent to those skilled in the art that the information processing system 1300 may further include an application chipset, a camera image processor (CIS), an input/output device, and the like.

In addition, a memory device or a memory system according to embodiments of the inventive concept may be packaged as one of various types to be subsequently embedded. For example, a flash memory device or a memory system according to embodiments of the inventive concept may be packaged by one of PoP (Package on Package), Ball grid arrays (BGAs), Chip scale packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), and Wafer-Level Processed Stack Package (WSP).

As described so far, a unit cell area of a vertical memory device can be reduced to increase the density of the vertical memory device. Since the number of bitlines can increase as compared to conventional technologies, a page size can increase and operating speed can be improved.

Throughout the specification, features shown in one embodiment may be incorporated in other embodiments within the spirit and scope of the inventive concept.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

Various operations may be described as multiple discrete steps performed in a manner that is most helpful in understanding the invention. However, the order in which the steps are described does not imply that the operations are order-dependent or that the order that steps are performed must be the order in which the steps are presented.

While the inventive concept has been particularly shown and described with reference to exemplary embodiments thereof, it will be apparent to those of ordinary skill in the art that various changes in form and detail may be made therein without departing from the spirit and scope of the inventive concept as defined by the following claims.

The invention claimed is:

1. A method of fabricating a semiconductor device, comprising:
forming a plurality of memory cell strings on a substrate;
coupling a single-body interconnection to at least two of the memory cell strings; and
coupling a bitline to the single-body interconnection,
wherein coupling the single-body interconnection to the at least two of the memory cell strings comprises forming the single-body interconnection including a body extending along a first direction and a protrusion protruding from the body along a second direction,
wherein the first and second directions are substantially parallel to the substrate, and
wherein the single-body interconnection has one end part coupled to one memory cell string and another end part coupled to another memory cell string.

2. The method of claim 1, wherein forming the single-body interconnection comprises forming a mask pattern including a pair of first sub-mask patterns corresponding to the body and a second sub-mask pattern corresponding the protrusion.

3. The method of claim 2, wherein the first sub-mask patterns are spaced apart from each other along the first direction and the second sub-mask pattern is disposed between the first sub masks.

4. The method of claim 3, wherein the second sub-mask pattern is shifted from the first sub-mask patterns along the second direction by a first distance.

5. The method of claim 4, wherein the mask further includes a pair of third sub-mask patterns between the first sub-mask patterns and the second sub-mask pattern.

6. The method of claim 5, wherein the third sub-mask patterns are shifted from the first sub-mask patterns along the second direction by about half of the first distance.

7. The method of claim 5, wherein the third sub-mask patterns are in a plural.

8. The method of claim 3, wherein the mask pattern has a staircase shape.

9. The method of claim 2, wherein coupling the bitline to the single-body interconnection comprises forming the bitline extending along the first direction and shifted from the single-body interconnection along the second direction.

10. The method of claim 1, forming the plurality of memory cell strings comprising:
forming gate structures on a semiconductor substrate, each of the gate structures including insulating patterns and gate electrodes spaced apart from each other with the insulating patterns interposed therebetween;
forming vertical pillars extending through each of the gate structures to be connected to the semiconductor substrate; and
forming a separation insulating layer in separation regions between the gate structures.

11. The method of claim 10, wherein the second sub-mask pattern is provided vertically over the separation insulating layer.

12. The method of claim 11, wherein each of the first sub-mask patterns is provided vertically over each of the vertical pillars.

13. The method of claim 10, forming the gate structures comprising:
forming a buffer dielectric layer over the semiconductor substrate;
repeatedly forming a stack of a sacrificial layer and an insulating layer over the buffer dielectric layer;
forming the vertical pillars extending through the stack of sacrificial layer and the insulating layer to be connected to the semiconductor substrate;
forming the separation regions by patterning the buffer dielectric layer, the sacrificial layer, and the insulating layers to expose a portion of the semiconductor substrate;
removing the patterned sacrificial layers to form recessed regions that expose portions of sidewalls of the vertical pillars;
forming information storage elements in the recessed regions; and
forming a conductive layer on the information storage elements in the recessed regions.

14. A method of fabricating a semiconductor device, comprising:
forming a plurality of vertically stacked memory cell strings;
forming a single-body interconnection to couple at least two of the plurality of vertically stacked memory cell strings; and
coupling a bitline to the interconnection,
wherein coupling the single-body interconnection to the at least two of the memory cell strings comprises forming the single-body interconnection including a body extending along a first direction and a protrusion protruding from the body along a second direction,
wherein the first and second directions are substantially perpendicular to a direction in which the memory cell strings are stacked, and
wherein the single-body interconnection has one end part coupled to one memory cell string and another end part coupled to another memory cell string.

15. The method of claim 14, wherein the coupling of the bit line to the single-body interconnection is performed after forming the single-body interconnection.

16. The method of claim 14, wherein the single-body interconnection has a longitudinal axis and a short axis, wherein a central part of the single-body interconnection protrudes in a first direction along the short axis and wherein the bit line extends in a second direction along the longitudinal axis.

17. The method of claim 14, wherein the single-body interconnection has a first portion having a first longitudinal center axis and a second portion, arranged at a central portion of the single-body interconnection, said second portion having a second longitudinal center axis, said second longitudinal center axis being parallel to and offset from the first axis.

18. The method of claim 14, wherein the coupling of the bitline to the single-body interconnection comprises directly coupling the bitline with the single-body interconnection.

19. The method of claim 14, wherein the first direction is substantially perpendicular to the second direction.

20. The method of claim 1, wherein the single-body interconnection is coupled to the bit line through the protrusion.